US011950496B2

United States Patent
Senkovskyy

(10) Patent No.: US 11,950,496 B2
(45) Date of Patent: Apr. 2, 2024

(54) ORGANIC SEMICONDUCTIVE LAYER COMPRISING PHOSPHINE OXIDE COMPOUNDS

(71) Applicant: Novaled GmbH, Dresden (DE)

(72) Inventor: Volodymyr Senkovskyy, Dresden (DE)

(73) Assignee: Novaled GmbH, Dresden (DE)

( * ) Notice: Subject to any disclaimer, the term of this patent is extended or adjusted under 35 U.S.C. 154(b) by 108 days.

(21) Appl. No.: 15/777,274

(22) PCT Filed: Nov. 23, 2016

(86) PCT No.: PCT/EP2016/078555
§ 371 (c)(1),
(2) Date: May 18, 2018

(87) PCT Pub. No.: WO2017/089399
PCT Pub. Date: Jun. 1, 2017

(65) Prior Publication Data
US 2018/0337339 A1    Nov. 22, 2018

(30) Foreign Application Priority Data
Nov. 23, 2015    (EP) ..................................... 15195877

(51) Int. Cl.
*H10K 85/60*    (2023.01)
*C07F 9/53*    (2006.01)
(Continued)

(52) U.S. Cl.
CPC ......... *H10K 85/615* (2023.02); *C07F 9/5325* (2013.01); *C07F 9/5765* (2013.01);
(Continued)

(58) Field of Classification Search
CPC ...... H01L 51/5072–508; H10K 85/615; H10K 50/16; H10K 50/165; H10K 85/624;
(Continued)

(56) References Cited

U.S. PATENT DOCUMENTS

2008/0241518 A1* 10/2008 Satou ................... H10K 85/615
    428/690
2012/0146014 A1* 6/2012 Kato ...................... C09K 11/06
    548/440
(Continued)

FOREIGN PATENT DOCUMENTS

JP    2006073581 A    3/2006
JP    2009203203 A    9/2009
(Continued)

OTHER PUBLICATIONS

Machine Translation of KR-20130129543-A.*
(Continued)

*Primary Examiner* — Dawn L Garrett
(74) *Attorney, Agent, or Firm* — Eversheds Sutherland (US) LLP

(57) ABSTRACT

The present invention relates to an. organic semiconductive layer which is an electron transport layer and/or an electron injection layer and/or an n-type charge generation layer, the organic semiconductive layer comprising at least one compound of formula (1) wherein $R^1$ and $R^2$ are each independently selected from $C_1$ to $C_{16}$ alkyl; $Ar^1$ is selected from $C_6$ to $C_{14}$ arylene or $C_3$ to $C_{12}$ heteroarylene; $Ar^2$ is independently selected from $C_{14}$ to $C_{40}$ arylene or $C_8$ to $C_{40}$ heteroarylene; $R^3$ is independently selected from H, $C_1$ to $C_{12}$ alkyl or $C_{10}$ to $C_{20}$ aryl; wherein each of $Ar^1$, $Ar^2$ and $R^3$ may each independently be unsubstituted or substituted with at least one $C_1$ to $C_{12}$ alky group; n is 0 or 1; and m is 1 in case of n=0; and m is 1 or 2 in case of n=1, phosphine oxide compounds comprised therein and to organic electroluminescent devices comprising such layers and compounds.

(Continued)

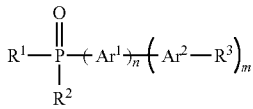

(1)

11 Claims, 2 Drawing Sheets

(51) Int. Cl.

| | | |
|---|---|---|
| C07F 9/576 | (2006.01) | |
| C07F 9/6506 | (2006.01) | |
| C07F 9/6521 | (2006.01) | |
| C07F 9/655 | (2006.01) | |
| C07F 9/6558 | (2006.01) | |
| C07F 9/6561 | (2006.01) | |
| H10K 50/16 | (2023.01) | |
| H10K 50/165 | (2023.01) | |
| H10K 50/17 | (2023.01) | |
| H10K 50/19 | (2023.01) | |

(52) U.S. Cl.
CPC ........ *C07F 9/65068* (2013.01); *C07F 9/6521* (2013.01); *C07F 9/65517* (2013.01); *C07F 9/65522* (2013.01); *C07F 9/65586* (2013.01); *C07F 9/6561* (2013.01); *H10K 50/16* (2023.02); *H10K 50/165* (2023.02); *H10K 85/624* (2023.02); *H10K 85/626* (2023.02); *H10K 85/654* (2023.02); *H10K 85/6572* (2023.02); *H10K 85/6574* (2023.02); *H10K 50/171* (2023.02); *H10K 50/19* (2023.02)

(58) Field of Classification Search
CPC ............... H10K 85/626; H10K 85/654; H10K 85/6572; H10K 85/6574; H10K 50/171; H10K 50/19; C07F 9/5325; C07F 9/5765; C07F 9/65068; C07F 9/6521; C07F 9/65517; C07F 9/65522; C07F 9/65586; C07F 9/6561
See application file for complete search history.

(56) References Cited

U.S. PATENT DOCUMENTS

| | | | |
|---|---|---|---|
| 2014/0048792 A1* | 2/2014 | Chun | ................. H01L 51/0072 257/40 |
| 2014/0103325 A1* | 4/2014 | Shin | ..................... C07D 487/04 257/40 |
| 2014/0332790 A1* | 11/2014 | Fadhel | ................ H01L 51/5076 257/40 |
| 2016/0322568 A1 | 11/2016 | Fadhel et al. | |
| 2018/0337339 A1 | 11/2018 | Senkovskyy et al. | |

FOREIGN PATENT DOCUMENTS

| | | |
|---|---|---|
| KR | 10-2013-0129543 | 11/2013 |
| KR | 20130129543 A * | 11/2013 |
| WO | 03/000251 A1 | 1/2003 |
| WO | 2013/079217 A1 | 6/2013 |
| WO | 2015/052284 A1 | 4/2015 |

OTHER PUBLICATIONS

Chien, et al. "Multifunctional Deep-Blue Emitter Comprising an Anthracene Core and Terminal Triphenylphosphine Oxide Groups." Advanced Functional Materials 19.4 (2009): 560-566.*
Tsvetkov, et al., Electron effect of phosphorus-containing substituents. Ionization constants of aliphatic phosphinylcarboxylic acids. Zhurnal Obshchei Khimii, 45.4 (1981): 716-24.*
Machine Translation of JP2006073581A.*
Yadav, et al. "Role of molecular orbital energy levels in OLED performance." Scientific Reports 10.1 (2020): 1-15.*
Mallesham, Godumala, et al. "Phosphine oxide functionalized pyrenes as efficient blue light emitting multifunctional materials for organic light emitting diodes." Journal of Materials Chemistry C 3.6 (2015): 1208-1224. (Year: 2015).*
PCT International Search Report and Written Opinion for PCT Application No. PCT/EP2016/078555 dated Feb. 3, 2017 (12 pages).
European Search Report for EP Application No. 15195877.4 dated May 24, 2016 (9 pages).
Osawa et al., "Intra Complex Energy Transfer of Europium(III) Complexes Containing Anthracene and Phenanthrene Moieties," J. Phys. Chem. A, 2009, 113:10895-10902.
Yoon et al., "Synthesis and Electroluminescent Properties of Anthracene Derivatives Containing Electron-Withdrawing Oxide Moieties," Materials Research Bulletin, 2014, 58:149-152.
Korean Office Action for KR Application No. 10-2018-7017861 dated Sep. 5, 2020 (5 pages).
Korean Office Action for KR Application No. 10-2018-7017861 dated Mar. 24, 2021 (5 pages).
Office Action, Japanese Patent Application No. 2021-117449, dated Jul. 5, 2022.

* cited by examiner

ORGANIC SEMICONDUCTIVE LAYER COMPRISING PHOSPHINE OXIDE COMPOUNDS

CROSS REFERENCE TO RELATED APPLICATIONS

This application is a U.S. national stage application of PCT/EP2016/078555, filed Nov. 23, 2016, which claims priority to European Application No. 15195877.4, filed Nov. 23, 2015. The contents of these applications are incorporated herein by reference.

The present invention relates to an organic semiconductive layer, a phosphine oxide compound comprised therein, and to an organic electroluminescent device.

DESCRIPTION OF THE RELATED ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic and/or organometallic compounds.

When a voltage is applied to the anode and the cathode, holes injected from the anode electrode move to the EML, via the HTL, and electrons injected from the cathode electrode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency.

JP 2009 203203 discloses an anthracene derivative which is useful as a material for an organic EL element, can be formed into a film by vapor deposition and by coating, and exhibits a high glass transition temperature. Provided is 9,10-bisphenylanthracene derivative having at least one aromatic heterocyclic group represented by general formula [3],

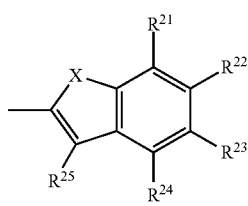

as a substituent of a phenyl group and an anthracenylene group. (In the formula, $R^{21}$ to $R^{24}$ are each a hydrogen atom or a substituent; $R^{25}$ is a hydrogen atom; X is O, S or an N—$R^{26}$; and $R^{26}$ is a hydrogen atom or a substituent).

However, there is a continuous need to improve the performance of OLEDs, in particular matrix compounds in the electron transport layer, electron injection layer and n-type charge injection layer which enable high efficiency, low operating voltage and excellent stability.

SUMMARY

Therefore, it is the object of the present invention to provide organic electroluminescent devices and novel compounds for use therein overcoming drawbacks of the prior art, in particular featuring reduced operating voltage and/or improved external quantum efficiency (EQE) and/or improved lifetime in OLEDs, in particular in fluorescent blue devices.

This object is achieved by an organic semiconductive layer which is an electron transport layer and/or an electron injection layer and/or an n-type charge generation layer, the organic semiconductive layer comprising at least one compound of formula (1)

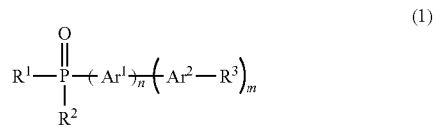

wherein $R^1$ and $R^2$ are each independently selected from $C_1$ to $C_{16}$ alkyl;
$Ar^1$ is selected from $C_6$ to $C_{14}$ arylene or $C_3$ to $C_{12}$ heteroarylene;
$Ar^2$ is independently selected from $C_{14}$ to $C_{40}$ arylene or $C_8$ to $C_{40}$ heteroarylene;
$R^3$ is independently selected from H, $C_1$ to $C_{12}$ alkyl or $C_{10}$ to $C_{20}$ aryl;
wherein each of $Ar^1$, $Ar^2$ and $R^3$ may each independently be unsubstituted or substituted with at least one $C_1$ to $C_{12}$ alky group;
n is 0 or 1; and
m is 1 in case of n=0; and m is 1 or 2 in case of n=1.

It may be further preferred that the $C_{14}$ to $C_{40}$ arylene or $C_8$ to $C_{40}$ heteroarylene, which is a possible selection for $Ar^2$, comprises a conjugated system of at least 10 delocalized electrons.

In this regard, the term "conjugated system" shall be understood as a system of different aromatic moieties (such as phenyl rings) connected with each other either to form condensed aromatic systems (such as napthyl groups) or being connected with each other only by single bonds (such as biphenyl groups). Exemplary embodiments of respective conjugated systems of at least 10 delocalized electrons, which are a preferred selection for $Ar^2$, are represented by the following formulas

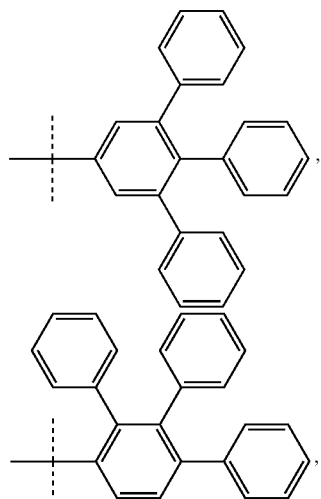

-continued

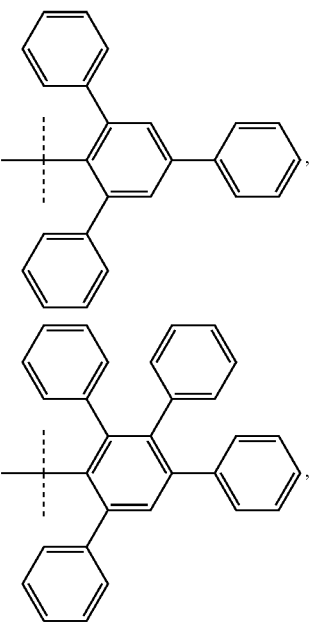

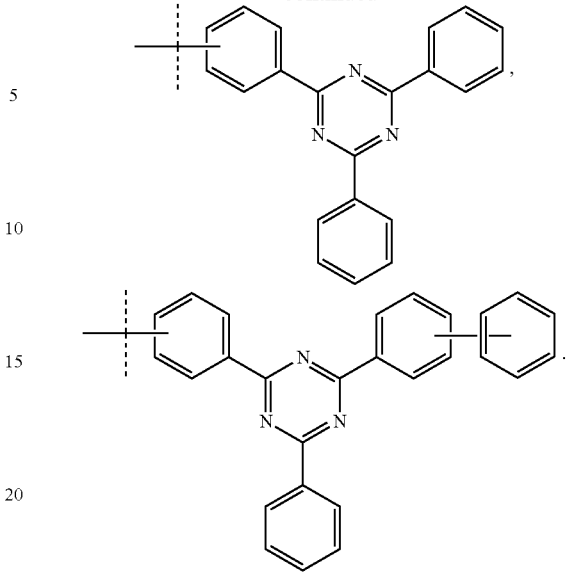

These systems shall be considered as conjugated systems of at least 10 delocalized electrons notwithstanding the fact that it cannot be excluded that the phenyl moieties may be twisted against each other resulting in lowered conjugation of the system. That is, the "conjugated system" in the $Ar^2$ moiety (formed by condensed aromatics or aromatics conducted with each other only by single bonds) is free from $sp^3$-hybridised carbon atoms. $sp^3$-hybridised carbon atoms may, however, be present in the substituents on $Ar^2$, for example in form of alkyl substituents.

The term "alkyl" as used herein shall encompass linear as well as branched and cyclic alkyl. For example, $C_3$-alkyl may be selected from n-propyl and iso-propyl. Likewise, $C_4$-alkyl encompasses n-butyl, sec-butyl and t-butyl. Likewise, $C_6$-alkyl encompasses n-hexyl and cyclo-hexyl.

The subscripted number n in $C_n$ relates to the total number of carbon atoms in the respective alkyl, arylene, heteroarylene or aryl group.

The term "aryl" as used herein shall encompass phenyl ($C_6$-aryl), fused aromatics, such as naphthalene, anthracene, phenanthracene, tetracene etc. Further encompassed are biphenyl and oligo- or polyphenyls, such as terphenyl etc. Further encompassed shall be any further aromatic hydrocarbon substituents, such as fluorenyl etc. Arylene, respectively heteroarylene refers to groups to which two further moieties are attached.

The term "heteroaryl" as used herein refers to aryl groups in which at least one carbon atom is substituted by a heteroatom, preferably selected from N, O, S, B or Si.

The subscripted number n in $C_n$-heteroaryl merely refers to the number of carbon atoms excluding the number of heteroatoms. In this context, it is clear that a $C_3$ heteroarylene group is an aromatic compound comprising three carbon atoms, such as pyrazol, imidazole, oxazole, thiazole and the like.

In a preferred embodiment, $Ar^2$ is selected from $C_8$ to $C_{40}$ heteroarylene groups which comprise at least one oxygen or at least one nitrogen atom or at least one sulfur atom. Preferably, the $C_8$ to $C_{40}$ heteroarylene group comprises one nitrogen or one oxygen atom.

In case of $Ar^1$, $Ar^2$ and $Ar^3$ being substituted, the groups may comprise one or more substituents.

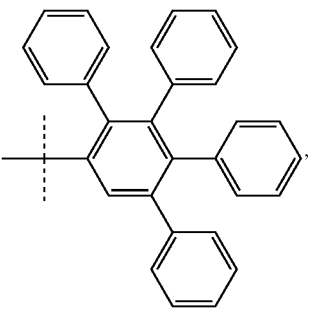

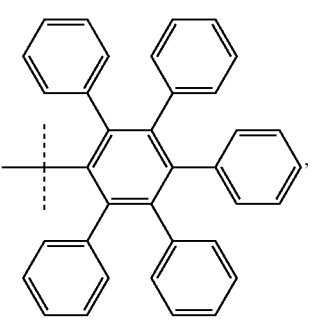

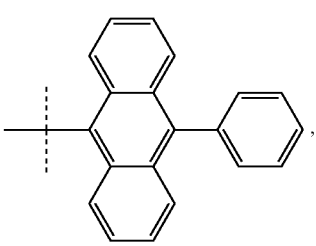

It may be further preferred that R¹ and R² are selected the same. That is, it may be preferred that R¹ and R² are the same $C_1$ to $C_{16}$ alkyl group. In case that R1 and R2 are selected the same, synthesis of the inventive compounds is simplified.

In a further preferred embodiment, R¹ and R² are each independently selected from $C_1$ to $C_{10}$ alkyl, preferably $C_1$ to $C_8$ alkyl, more preferably $C_1$ to $C_6$ alkyl, further preferred $C_1$ to $C_4$ alkyl. The selection of a shorter alkyl chain (i.e. a chain having less carbon atoms) is advantageous to adjust the physical and chemical properties, such as evaporation temperature and solubility, of the inventive compounds. $C_1$ to $C_4$ alkyl chains are preferred for thermal vacuum deposition processes while $C_4$ to $C_{12}$ alkyl chains are preferred for processing from solution.

It may further be preferred that Ar¹ is selected from a group consisting of phenylene, biphenylene, naphthylene, fluorenylene, pyridylene, quinolinylene and pyrimidinylene.

In this regard, it is further preferred that Ar¹ is selected from $C_6$ to $C_{14}$ arylene.

Better performance with respect to the electronic properties of the inventive layer was achieved when using the preferred Ar¹ groups discussed above.

In this regard, it is further preferred that n is 1. Compounds comprising an Ar¹ group (n=1) are found to be superior over compounds not comprising an Ar¹ group (i.e. compounds with n being 0) with respect to the relevant electronic properties.

Likewise, several specific A² groups were found for achieving extraordinary good electronic performance.

In another embodiment, Ar² comprises a conjugated system of at least 10 delocalised electrons and Ar² is unsubstituted.

It may further be preferred that Ar² comprises a conjugated system of at least 10 delocalised electrons and Ar² is unsubstituted and R³ is hydrogen.

It may further be preferred that Ar² comprises a conjugated system of at least 10 delocalised electrons and Ar² is unsubstituted and R³ is hydrogen and n=1 and m=1.

In another preferred embodiment, Ar² consists of one unsubstituted condensed aromatic system or is represented by one of the following formulas

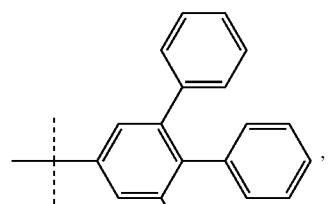

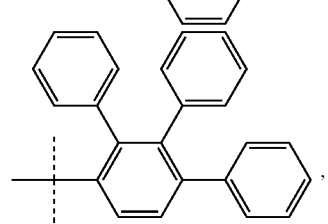

-continued

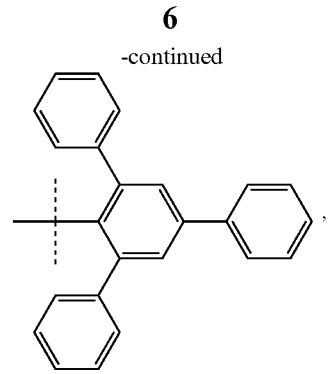

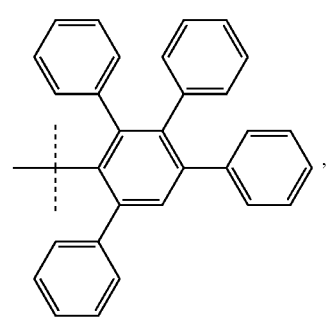

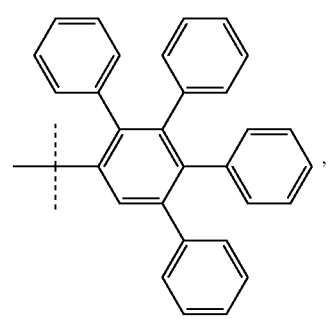

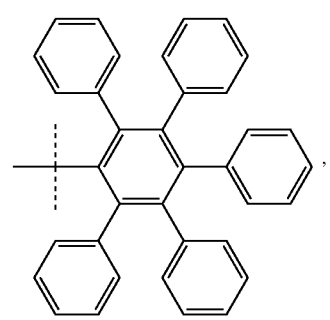

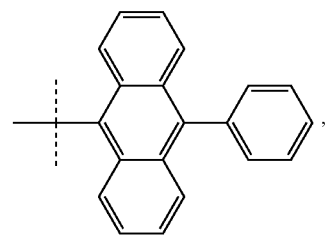

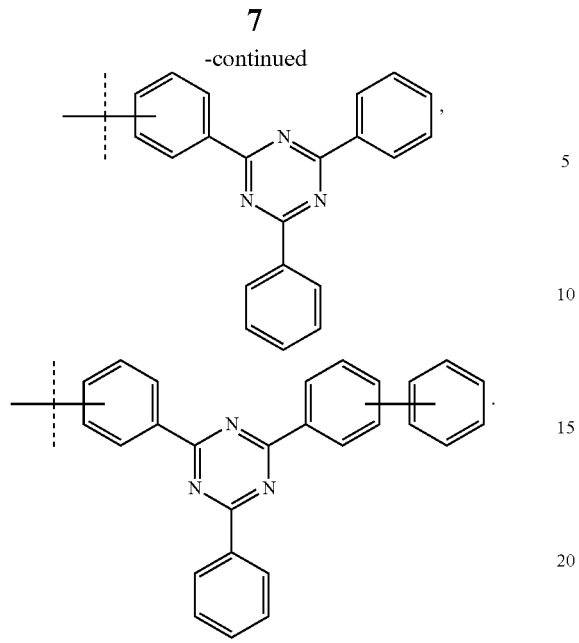

The condensed aromatic system in the sense of the present invention consists of an annelated ring system or a spiro ring system. According to the invention, a system of two rings is annelated if two ring members (usually carbon atoms) are part of two rings at the same time. In terms of the invention, a spiro compound contains at least two rings and only one ring member (usually a carbon atom) is part of both rings at the same time. In this regard, it is also possible that the group Ar$^2$ is formed by a combination of more than one annelated ring system and/or more than one spiro ring systems. An exemplary compound in this regard is compound (IVa) below comprising annelated parts and spiro parts. In this specific embodiment, it is provided that the condensed aromatic system does not include two different rings merely connected by one single bond.

The condensed aromatic system may be selected from the group consisting of naphthylene, fluorenylene, 9,9'-spirobi[fluorene]-2,7-ylene, 9,9'-spirobi[fluorene]-3,6-ylene, spiro[fluorene-9,9'-xanthene]-2,7-ylene, spiro[fluoren-9,9'-xanthene]-3,6-ylene, benzofluorenylen, dibenzofluorenylene, anthracenylene, chrysenylene, pyrenylene, phenanthrylene, carbazoylene, benzoacridinylene, dibenzoacridinylene, dibenzofuranylene, naphthobenzofuranylene, dinaphthobenzofuranylene, dibenzothiophenylene, naphthobenzothiophenylene, dinaphthothiophenylene.

In particular, it is preferred in this regard that Ar$^2$-R$^3$ may be selected from a group consisting of napthylene, fluorenylene, anthracenylene, pyrenylene, phenanthrylene, carbazoylene, benzo[c]acridinylene, dibenzo[c,h]acridinylene, dibenzo[a,j]acridinylene, triazenylene, benzofluorenylen or from a group of the following formulas (IVa) to (IVl),

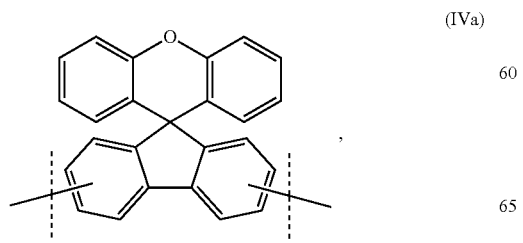

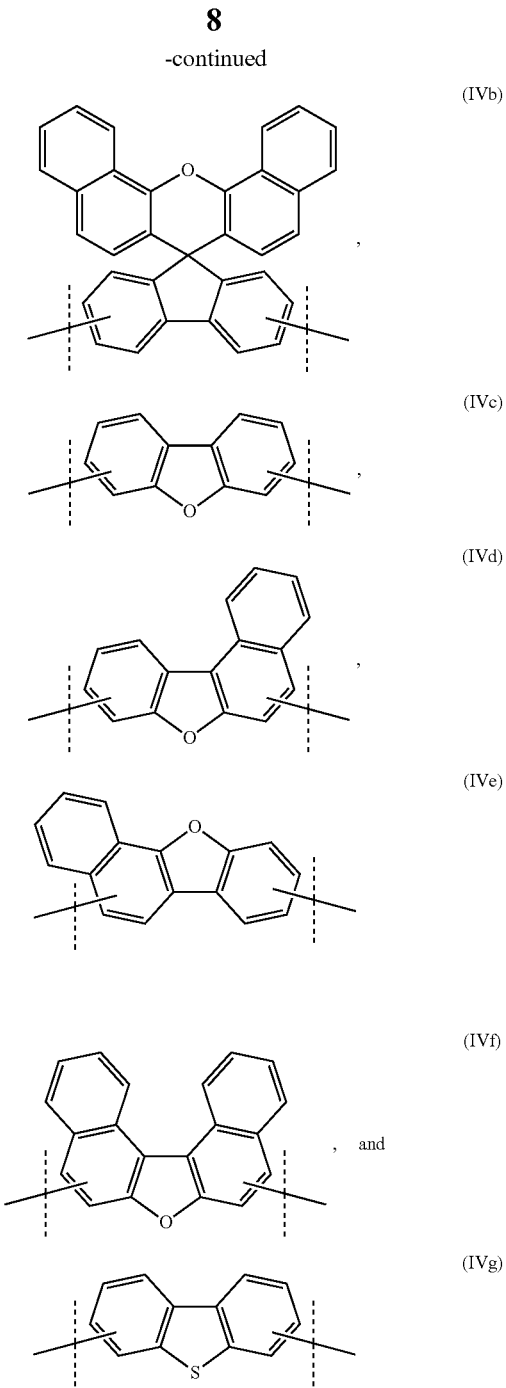

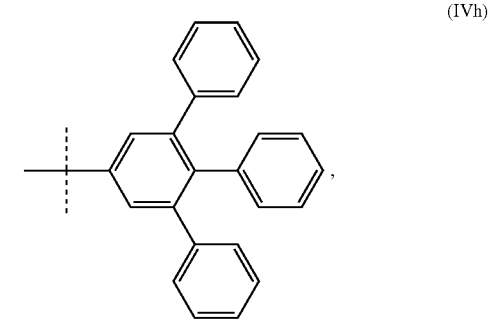

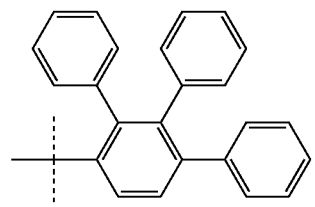 (IVi)

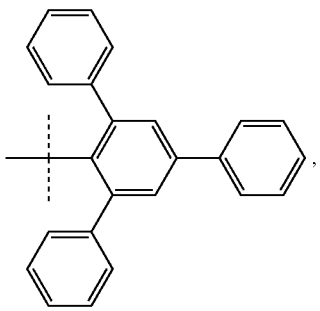 (IVj)

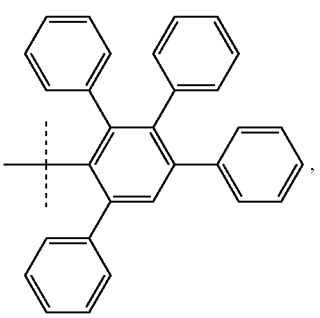 (IVk)

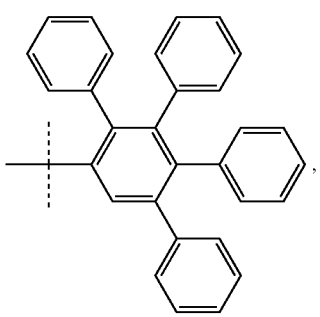 (IVl)

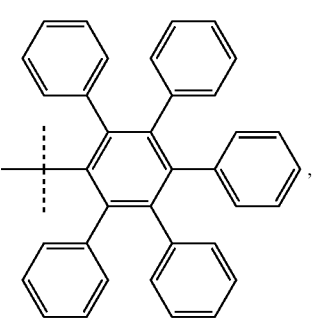 (IVm)

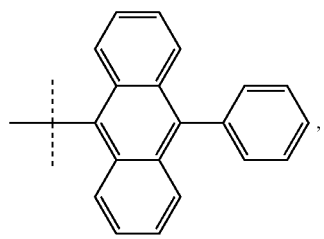 (IVn)

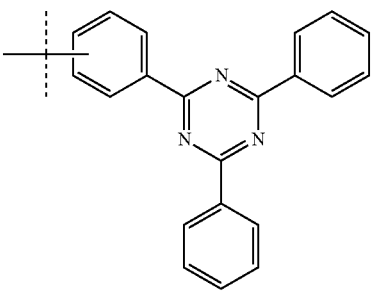 (IVo)

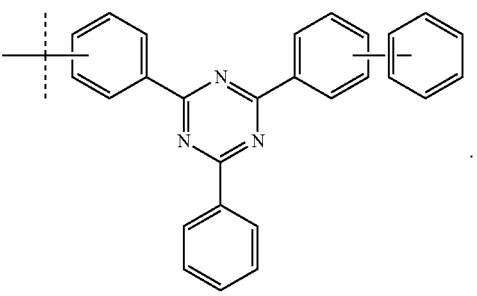 (IVp)

The positions by which the respective $A^2$ groups of formulas (IVa) to (IVp) are linked to the $R^3$ group, on the one hand, and the $Ar^1$ or the P atom, respectively, on the other hand, are marked in the above structure by the symbol of a chemical bond crossed by a dashed line

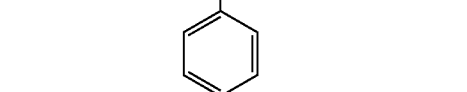

The connections can be made at any position of the respective aromatic ring marked this way.

In a preferred embodiment, $Ar^2$ is selected from a group consisting of anthracenylene, pyrenylene, phenanthrylene, benzo[c]acridinylene, dibenzo[c,h]acridinylene and dibenzo[a,j]acridinylene.

It is further particularly preferred that $Ar^2$ is selected from $C_{14}$ to $C_{40}$ arylene, preferably, $C_{14}$ to $C_{22}$ arylene.

Preferably, $Ar^2$ is free of indolyl.

Several groups from which $R^3$ may be selected are found to be particularly advantageous with respect to the electronic properties of the inventive compounds in the inventive layers. In this regard, it is preferred that $R^3$ is selected from H, biphenyl, terphenyl, fluorenyl, naphthyl, phenanthryl, pyrenyl, carbazoyl, dibenzofuranyl or dinapthofuranyl, preferably from H, phenyl, biphenyl or naphthyl.

Best performance is achieved by combining the above preferred $Ar^1$, $Ar^2$ and $R^3$ groups.

It may further be preferred that $Ar^1$, $Ar^2$ and $R^3$ are each independently unsubstituted or substituted with at least one $C_1$ to $C_6$ alkyl group, preferably $C_1$ to $C_4$ alkyl group.

It may likewise be preferred that $Ar^1$, $Ar^2$ and $R^3$ are unsubstituted.

By attaching substituents to the $Ar^1$, $Ar^2$ and $R^3$ groups, chemical and physical properties, such as solubility of the respective compounds, may be adjusted. $C_1$ to $C_4$ alkyl chains are preferred for thermal vacuum deposition processes while $C_4$ to $C_{12}$ alkyl chains are preferred for processing from solution.

For vacuum deposition, it may be preferred that $Ar^1$, $Ar^2$ and $R^3$ groups are unsubstituted.

In an embodiment, n is 0 and m is 1. Preferred compound of formula (1) in the organic semiconductive layer according to the invention is selected from one of the following compounds 1a to 1i.

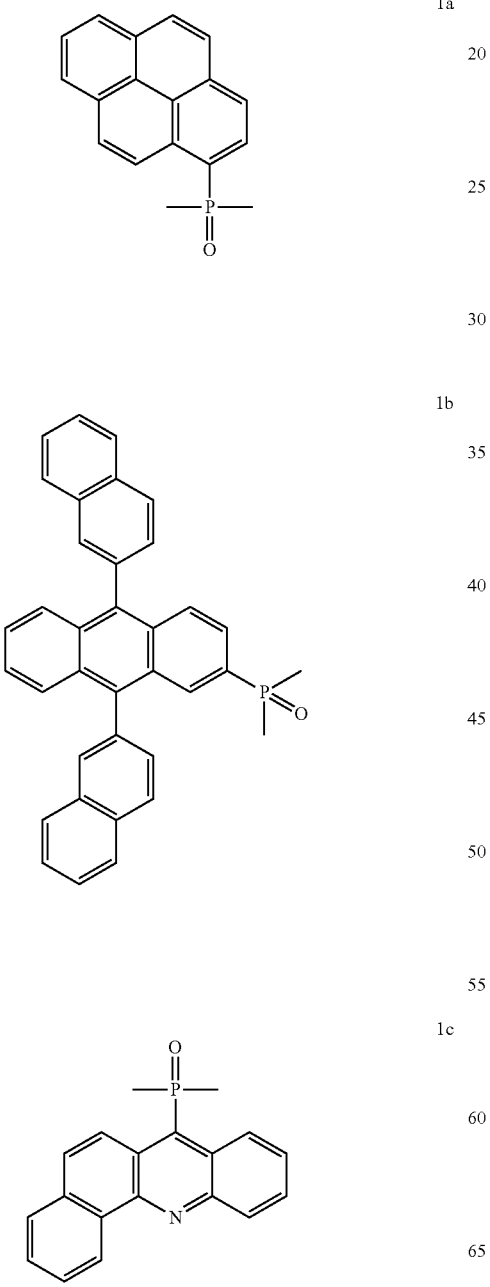

-continued

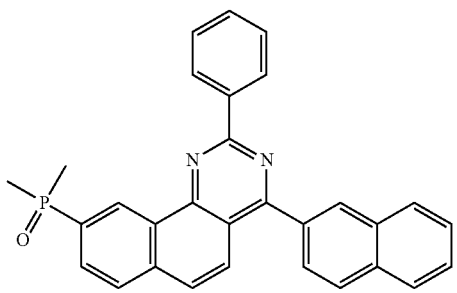

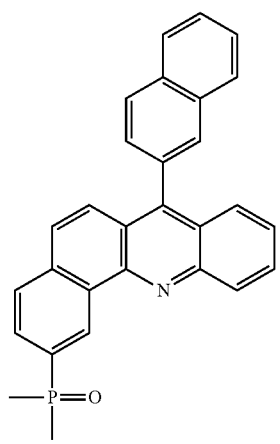

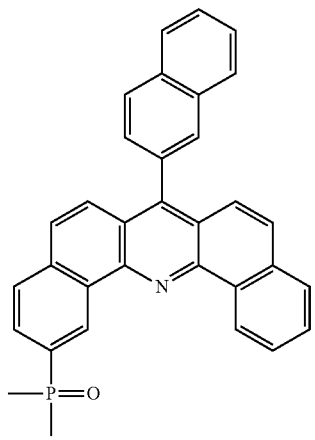

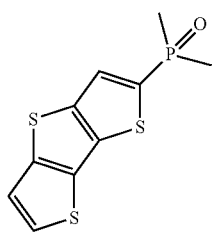

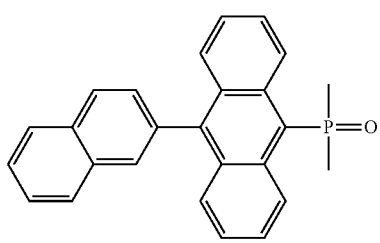

1i
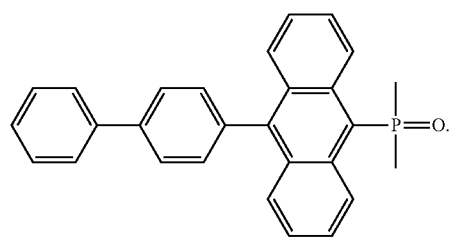
In a further embodiment, n is 1 and m is 1 and $R^3$ is H. Preferred compound of formula (1) in the organic semiconductive layer according to the invention is selected from one of the following compounds 2a to 2gg.
2a
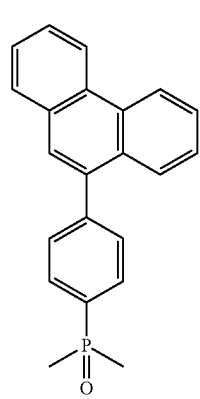
2b
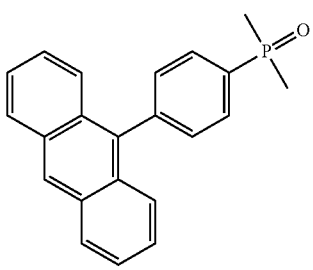
2c
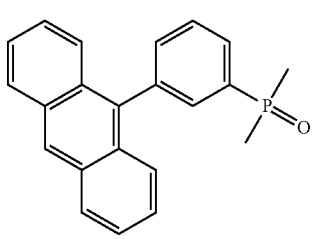
2d
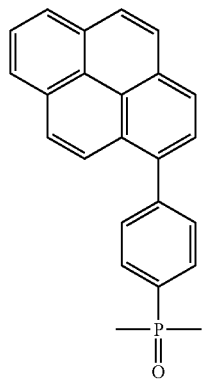
2e
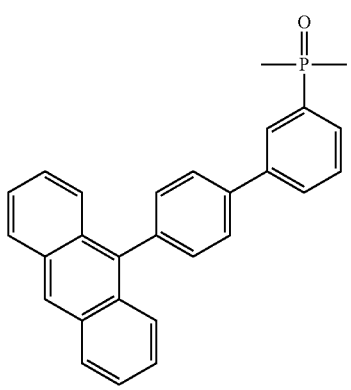
2f
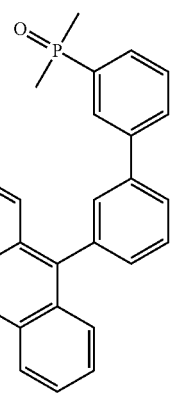
2g
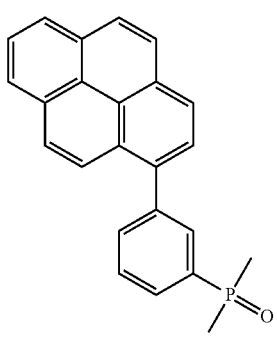

2h
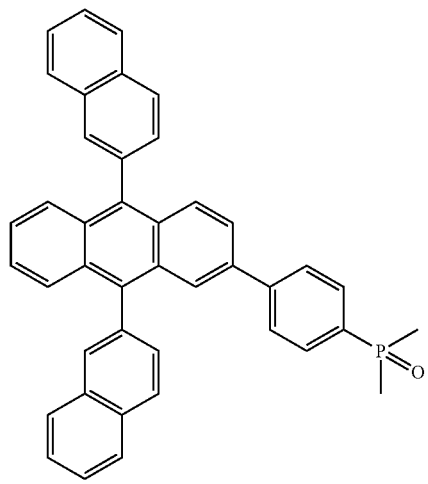
2i
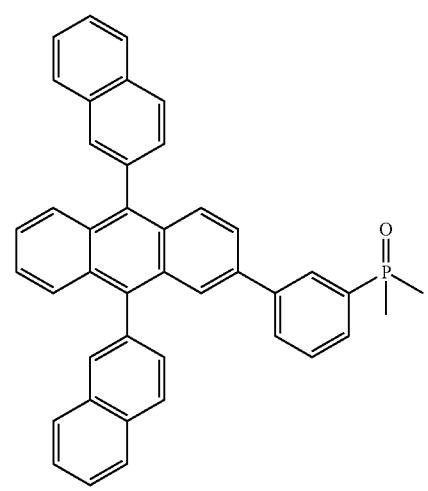
2j
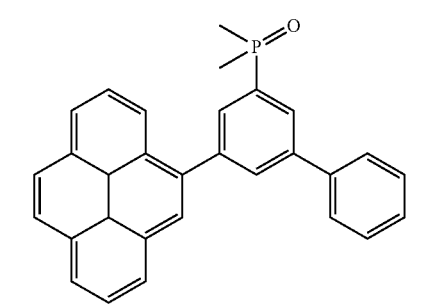
2k
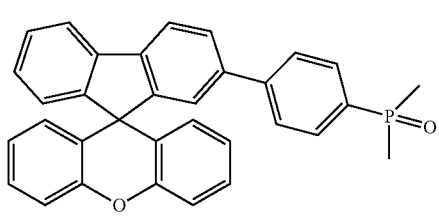
21
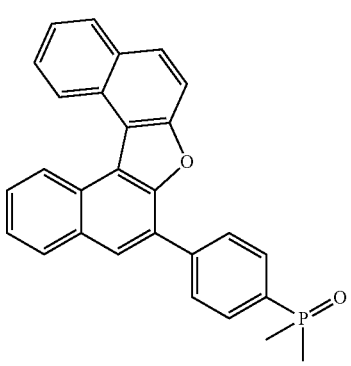
2m
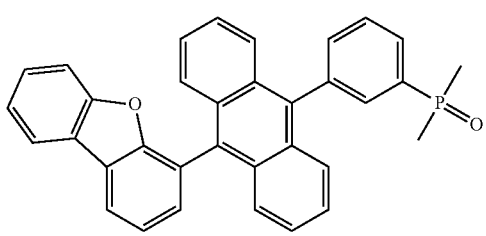
2n
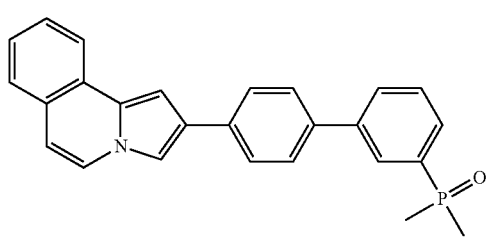
2o
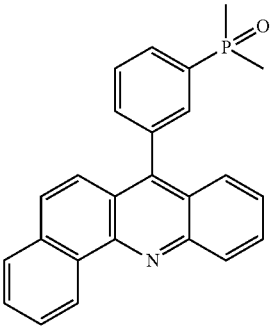
2p
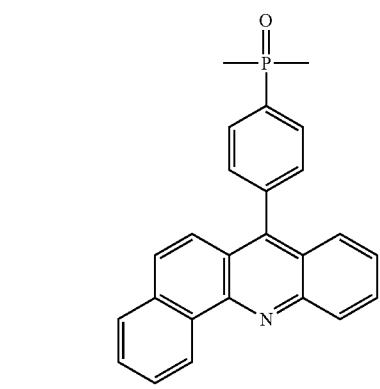

-continued
2q 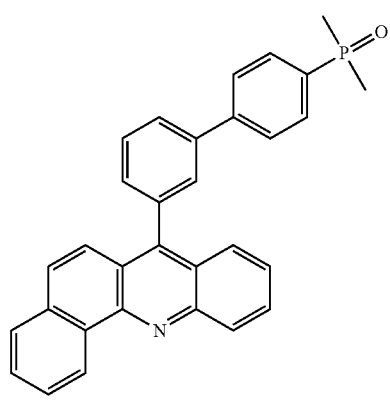
2r
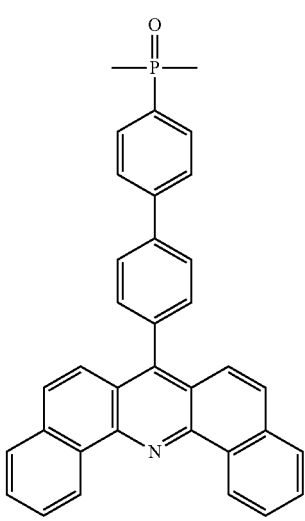
2s
2t
2u 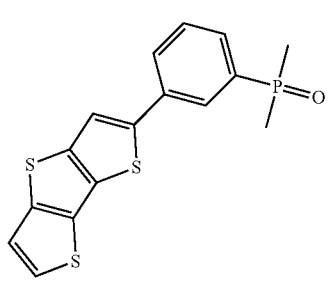
2v 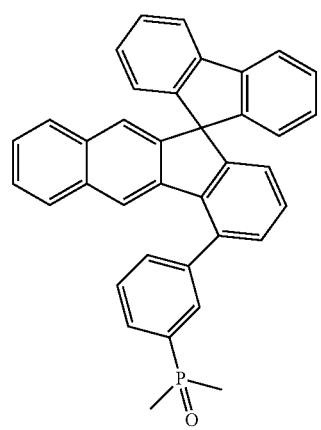
2w
2x 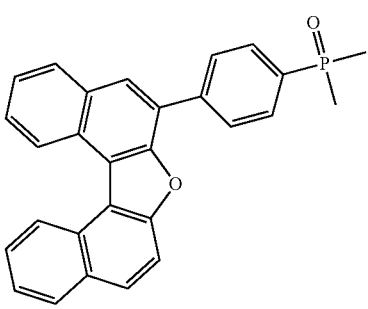

2y 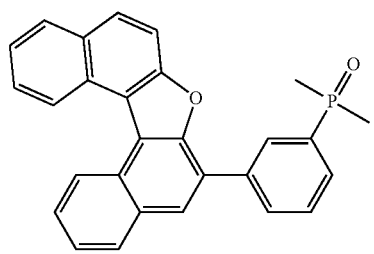
2z 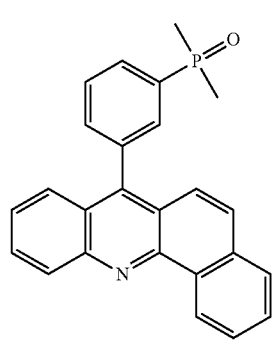
2aa 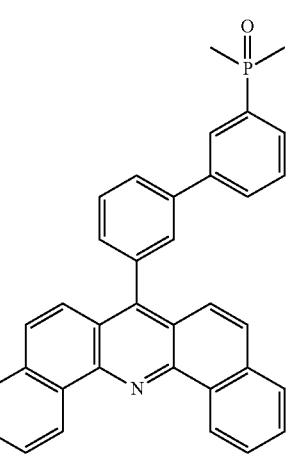
2bb
2cc 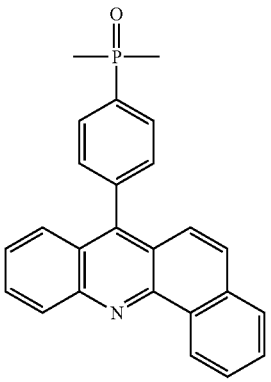
2dd 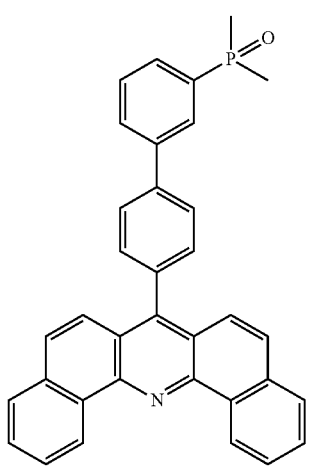
2ee 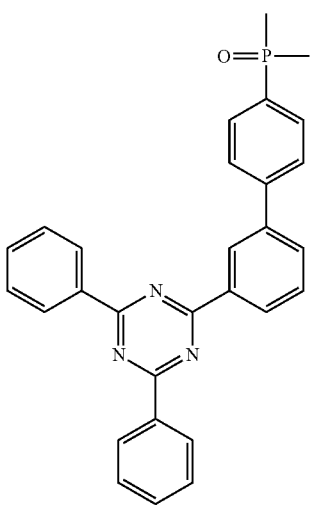

2ff
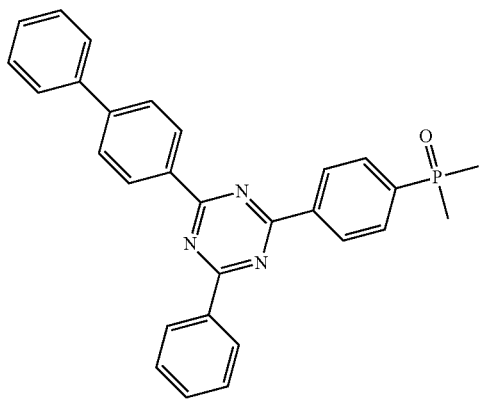
2gg
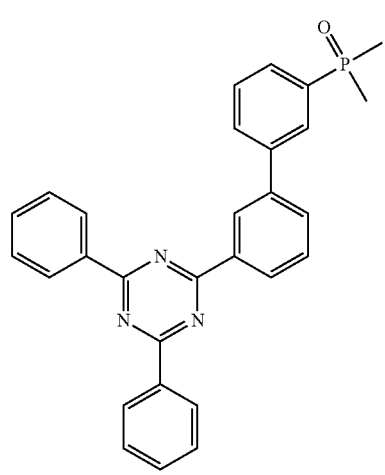
In a further embodiment, n is 1 and m is 1 and $R^3$ is $C_1$ to $C_{12}$ alkyl or $C_{10}$ to $C_{20}$ aryl. Preferred compound of formula (1) in the organic semiconductive layer according to the invention is selected from one of the following compounds 3a to 3pp.
3a
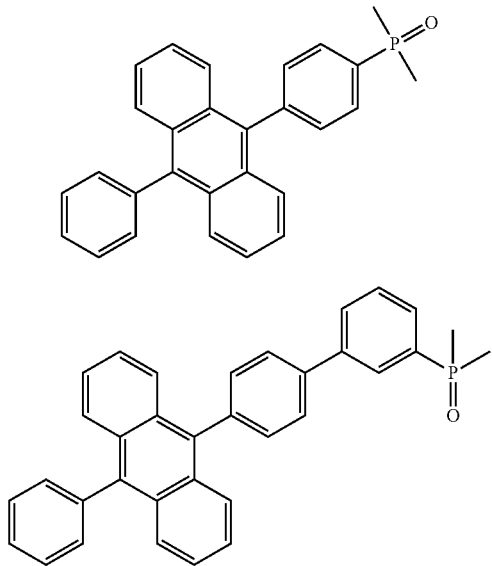
3c
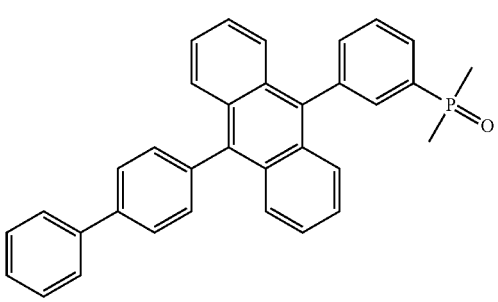
3d
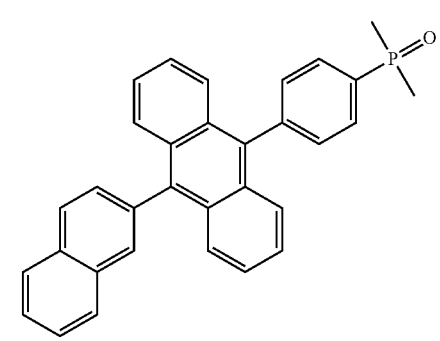
3e
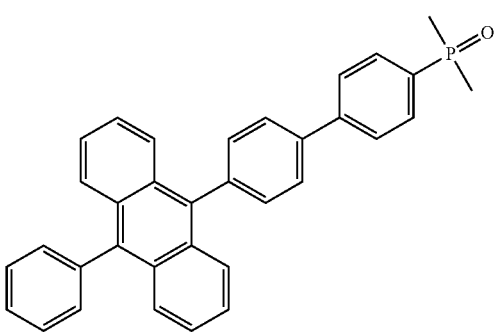
3f
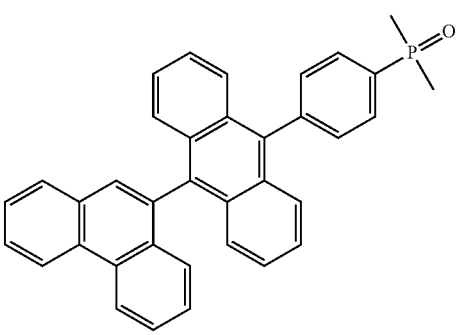
3g
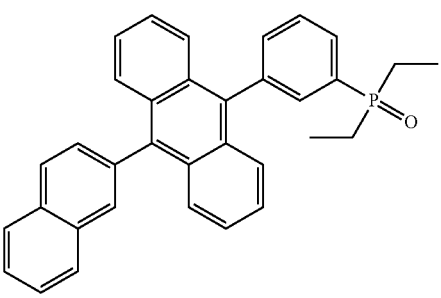

3h
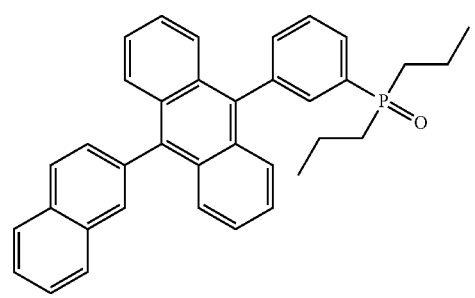
3i
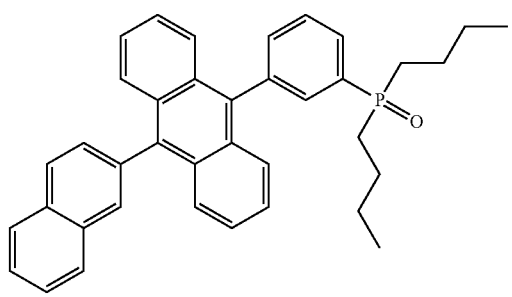
3j
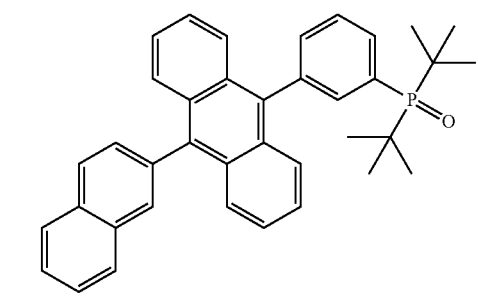
3k
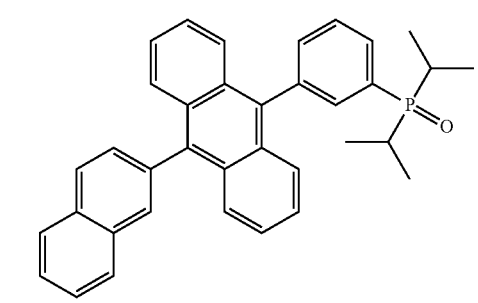
3l
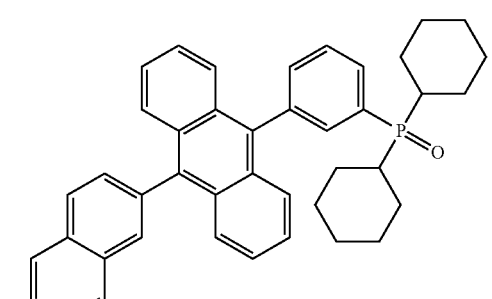
3m
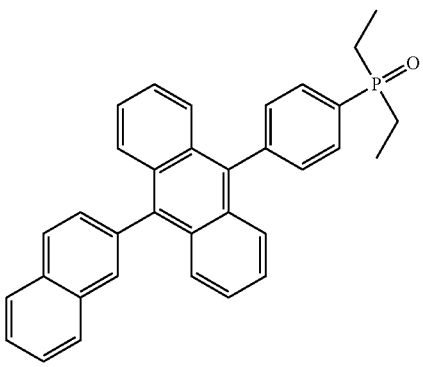
3n
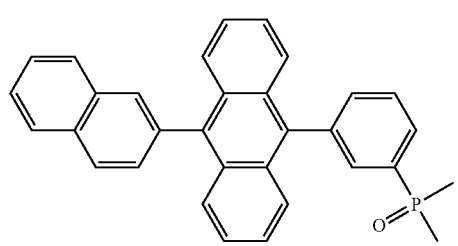
3o
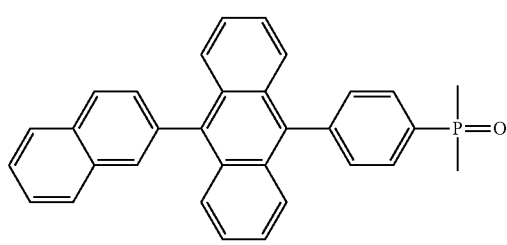
3p
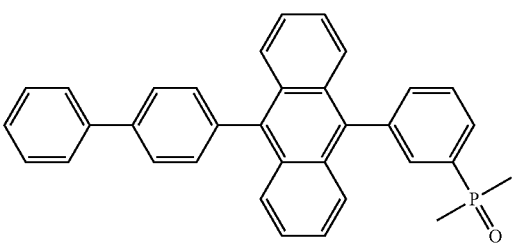
3q
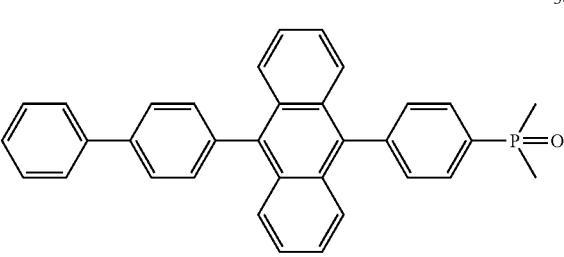

-continued
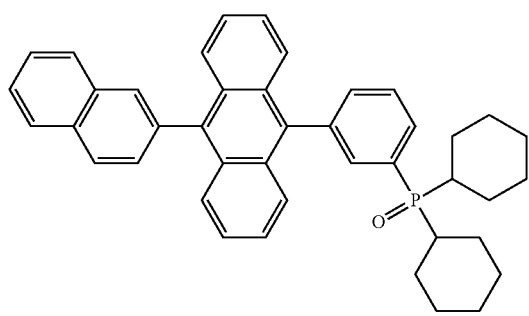
3r
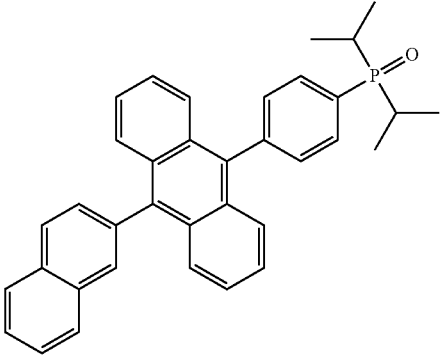
3v
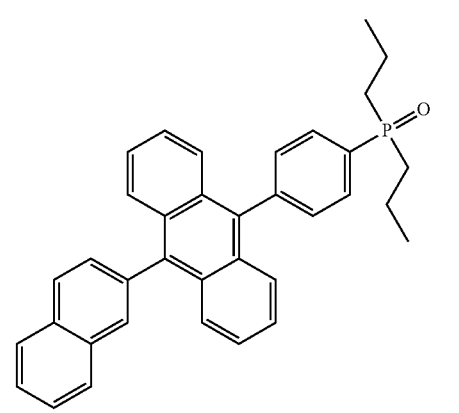
3s
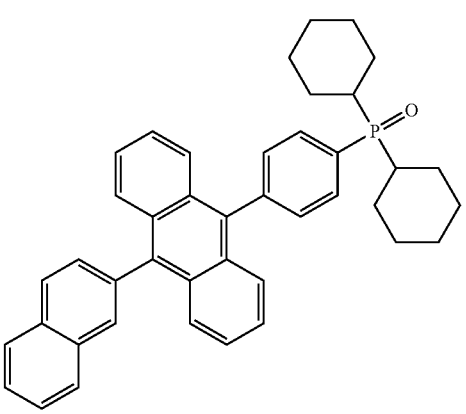
3w
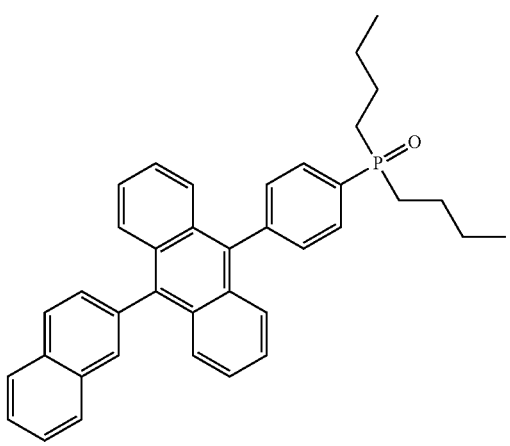
3t
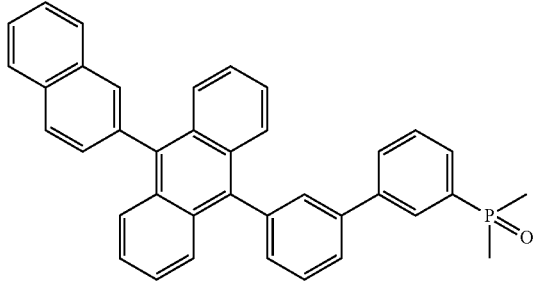
3x
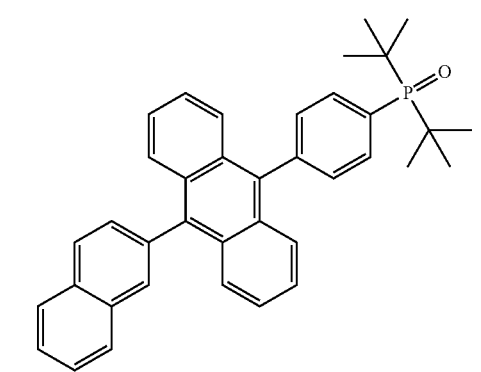
3u
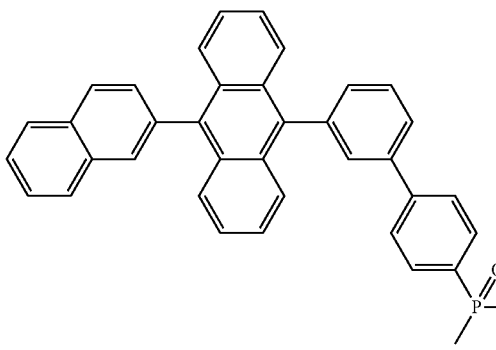
3y 3z
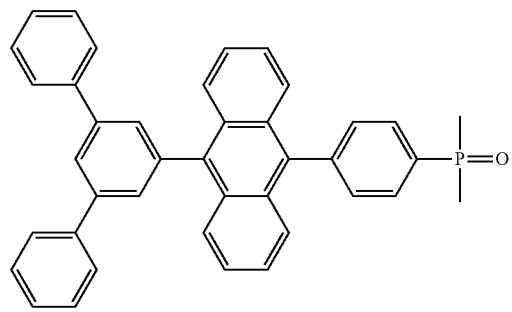
3aa
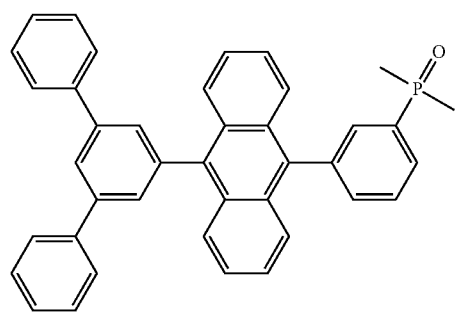
3bb
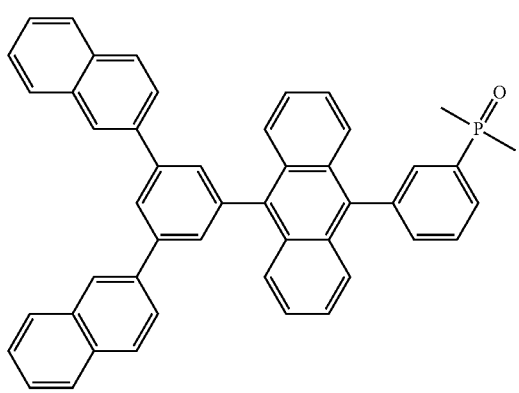
3cc
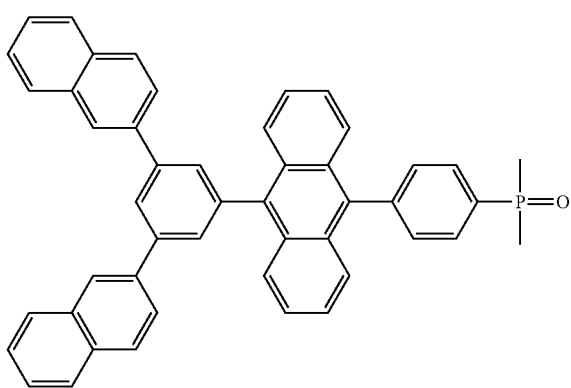
3dd
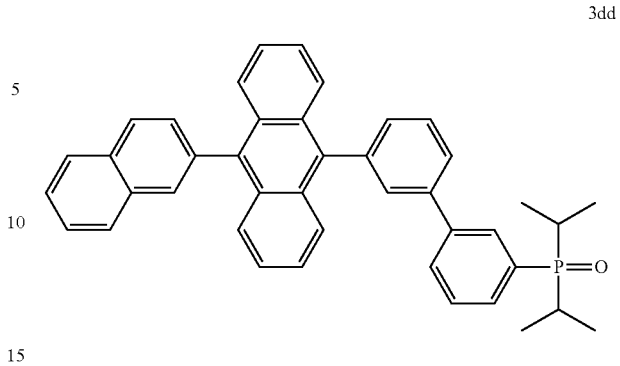
3ee
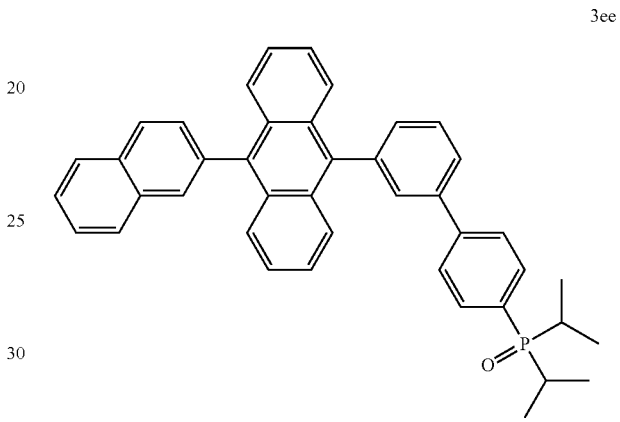
3ff
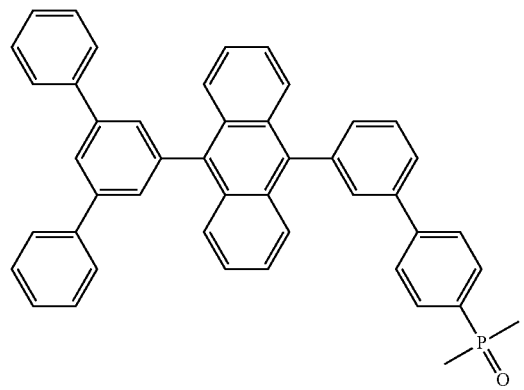
3gg 3hh
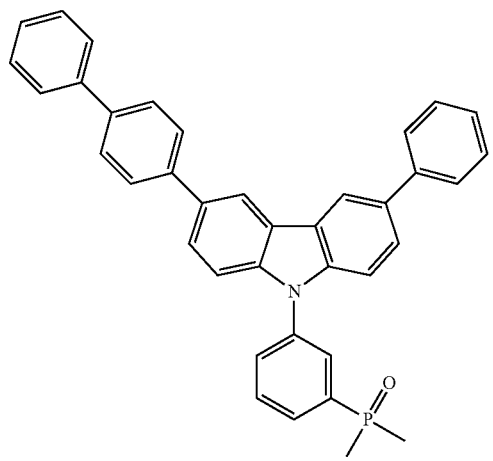
3ii
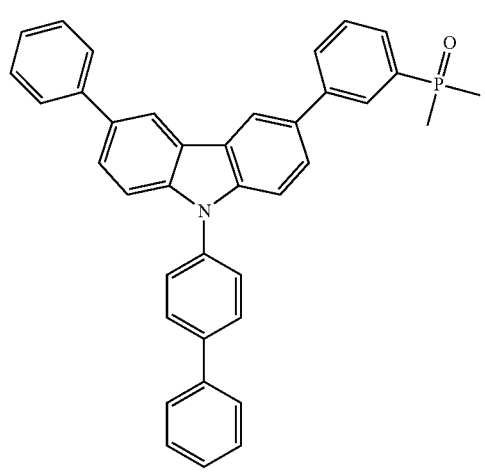
3jj
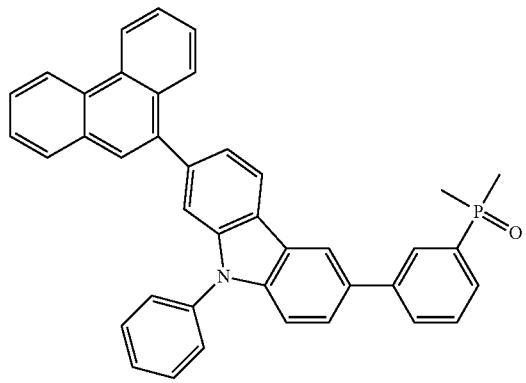
3kk
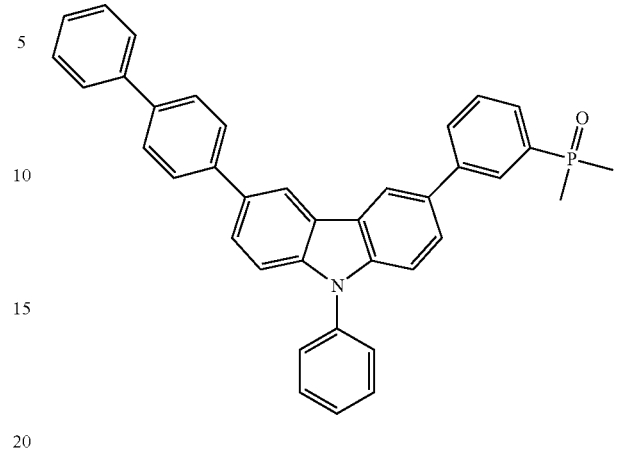
3ll
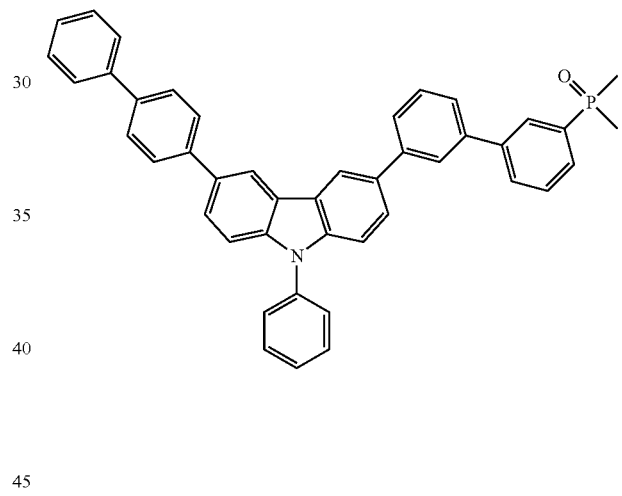
3mm
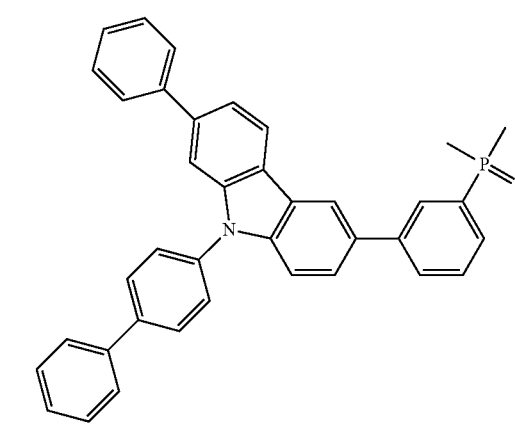

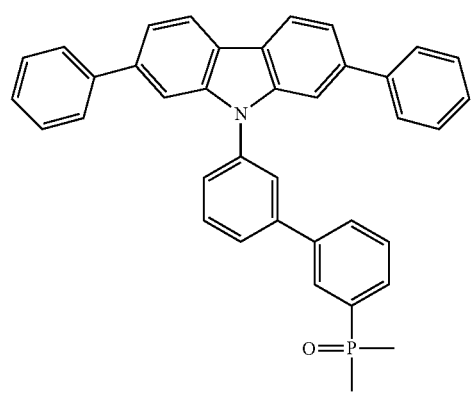
3nn
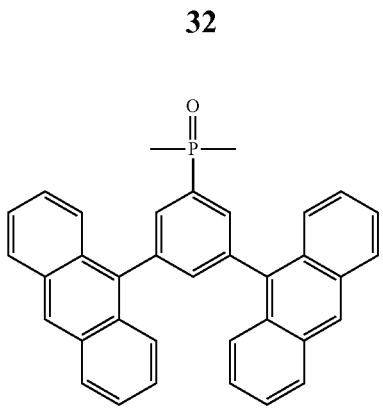
4a
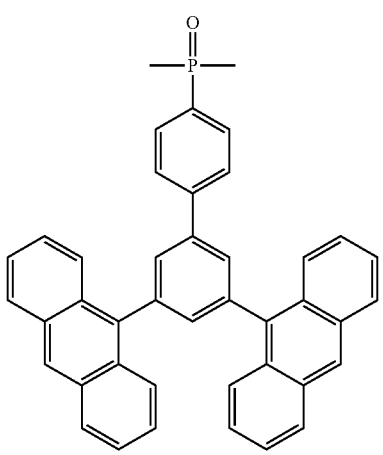
4b
3oo
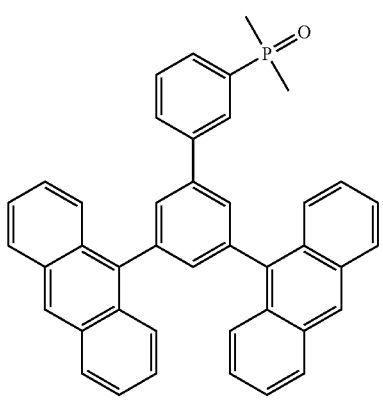
4c
3pp
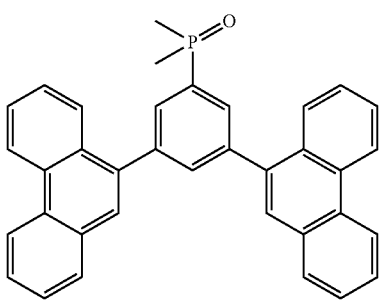
4d
In a further embodiment, n is 1 and m is 2. Preferred compound of formula (1) in the organic semiconductive layer according to the invention is selected from one of the following compounds 4a to 4f.

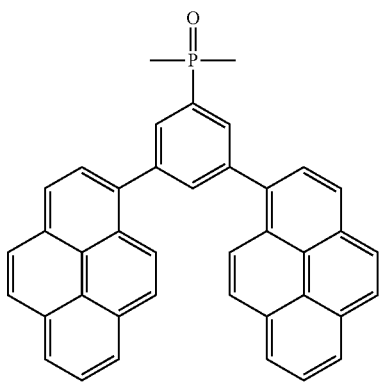
4e

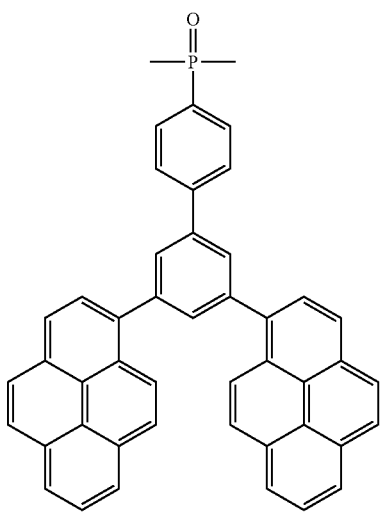
4f

In a further embodiment, A² is selected from particularly bulky substituents. Bulky substituents of the type shown below have a rigid three-dimensional structure which has been found to be particularly preferable. Preferred compound of formula (1) in the organic semiconductive layer according to the invention is selected from one of the following compounds 5a to 5c.

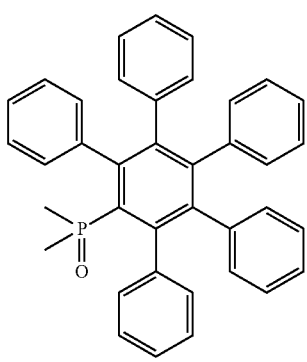
5a

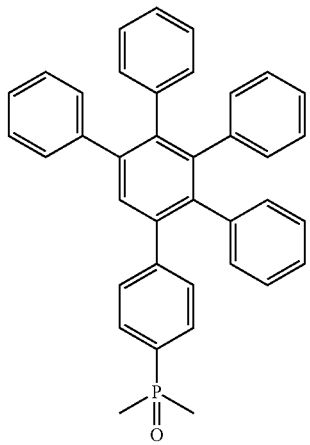
5b

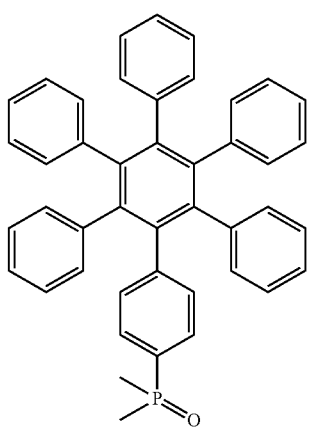
5c

In an another embodiment, the organic semiconductor layer comprises at least one compound of formula (1a)

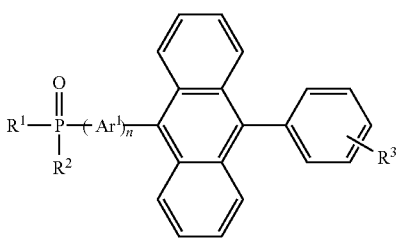
(1a)

wherein R¹ and R² are each independently selected from $C_1$ to $C_{16}$ alkyl;

Ar¹ is selected from $C_6$ to $C_{14}$ arylene or $C_3$ to $C_2$ heteroarylene, preferably phenylene or biphenylene;

R³ is independently selected from H, $C_1$ to $C_{12}$ alkyl or $C_{10}$ to $C_{20}$ aryl, preferably R³=H; and n is 1.

In extraordinary preferred embodiments, the compound of formula (1) in the organic semiconductive layer according to the invention is selected from one of the following compounds a to q.

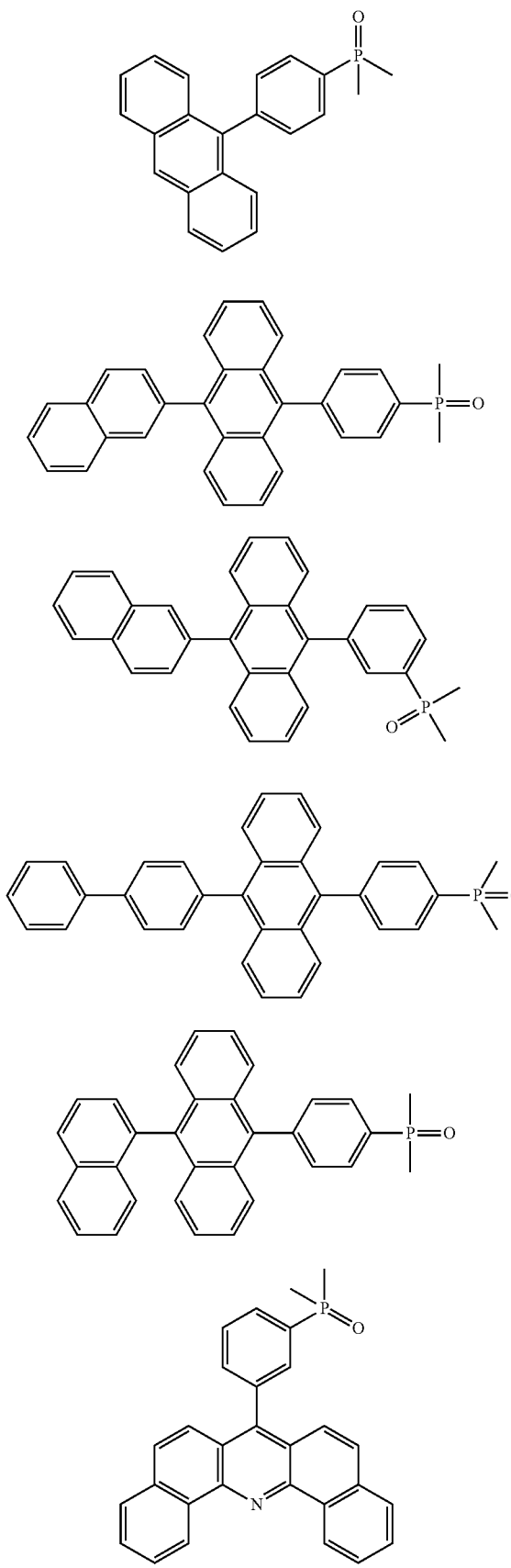
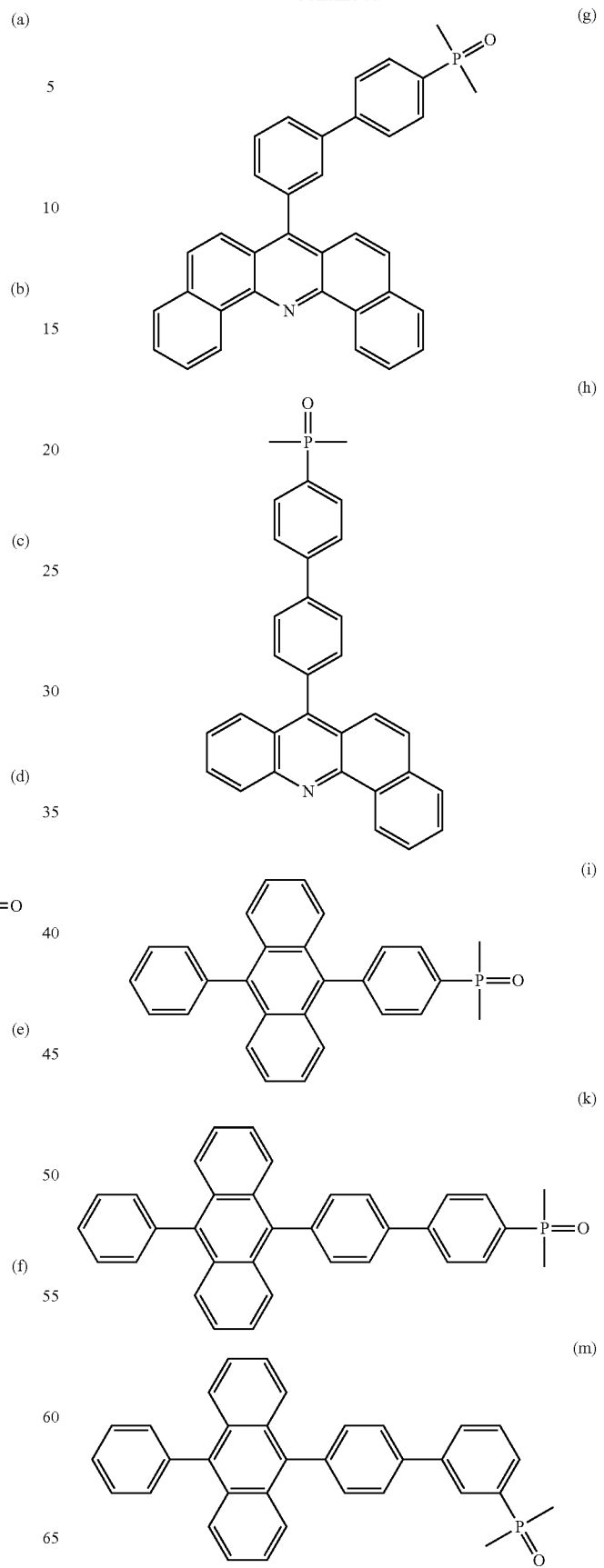

(n)

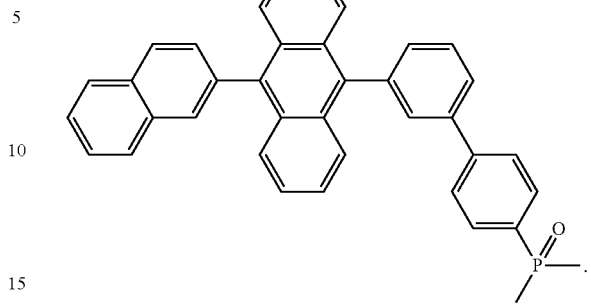

(o)

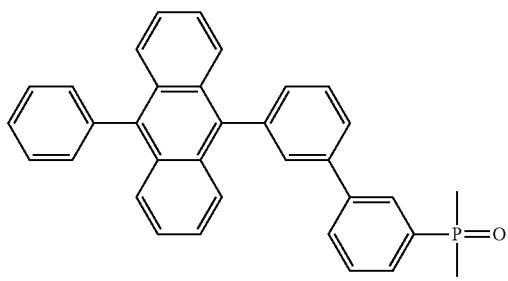

(p)

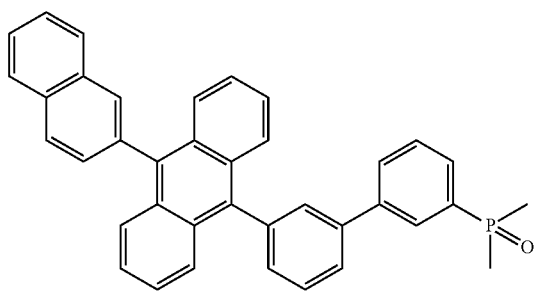

(q)

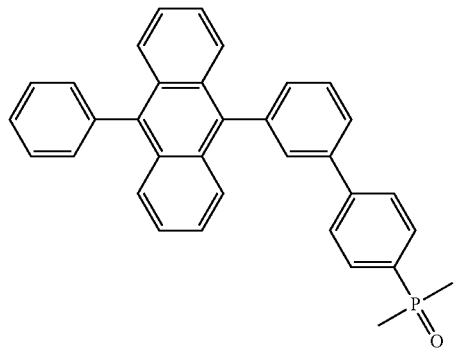

By selecting the compound of formula (1) from at least one of the above compounds (a) to (q) best performance of the inventive layers was observed.

With respect to the inventive organic semiconductive layer as well as with respect to the inventive compound, the compound mentioned in the experimental part (Tables referring to "starting materials and products") are most preferred.

Depending on the intended purpose, the inventive organic semiconductive layer may be doped. In a preferred embodiment, the organic semiconductive layer is doped, preferably electrically doped. Best results were achieved by the following groups of dopants.

In this regard, it is preferred that the organic semiconductive layer comprises alkali organic complex and/or an alkali halide.

Preferably, the alkali organic complex and/or alkali halide are a lithium organic complex and/or lithium halide.

Suitable organic ligands to form a lithium organic complex that can be used for the electron transport layer are disclosed, for example, in US 2014/0048792 and Kathirgamanathan Poopathy; Arkley, Vincent; Surendrakumar, Sivagnanasundram; Chan, Yun F.; Ravichandran, Seenivasagam Ganeshamurugan, Subramaniam; Kumaraverl, Muttulingam; Antipan-Lara, Juan; Paramaswara, Gnanamolly; Reddy, Vanga R., Digest of Technical Papers—Society for Information Display International Symposium (2010), 41(Bk. 1), 465-468.

Particularly preferred lithium organic complexes are shown in Table 1.

TABLE 1

| Lithum organic complex that can be suitable used in the orgainic semiconductive layer | | | |
|---|---|---|---|
| Compound | Name | Structure | Publication |
| LiQ | lithium 8-hydroxyquinolate | | WO 2013079217 A1 |
| Li-1 | lithium tetra(1H-pyrazol-1-yl)borate | | WO 2013079676 A1 |

TABLE 1-continued

Lithium organic complex that can be suitable used in the orgainic semiconductive layer

| Compound | Name | Structure | Publication |
|---|---|---|---|
| Li-2 | lithium 2-(diphenyl-phosphoryl)phenolate | | WO 2013079678A1 |
| Li-3 | lithium 2-(pyridin-2-yl)phenolate | | JP 2008195623 |
| Li-4 | lithium 2-(1-phenyl-1H-benzo[d]imidazol-2-yl)phenolate | | JP 2001291593, |
| Li-5 | lithium 2-(benzo[d]oxazol-2-yl)phenolate | | US 20030165711 |
| Li-6 | lithium 2-(diphenyl-phosphoryl)pyridin-3-olate | | EP 2724388 |

The organic ligand of the lithium organic complex of the organic semiconductive layer may be selected from the group comprising a quinolate, a borate, a phenolate, a pyridinolate or a Schiff base ligand, or Table 1;

preferably the lithium quinolate complex has the formula I, II, or m:

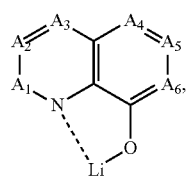

(I)

-continued

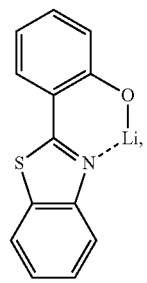

(II)

-continued

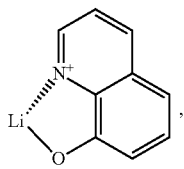
(III)

wherein $A_1$ to $A_6$ are same or independently selected from CH, CR, N, O;

R is same or independently selected from hydrogen, halogen, alkyl or aryl or heteroaryl with 1 to 20 carbon atoms; and more preferred $A_1$ to $A_6$ are CH;

preferably the borate based organic ligand is a tetra (1H-pyrazol-1-yl)borate;

preferably the phenolate is a 2-(pyridin-2-yl)phenolate or a 2-(diphenylphosphoryl)phenolate;

preferably the lithium Schiff base has the structure 100, 101, 102 or 103:

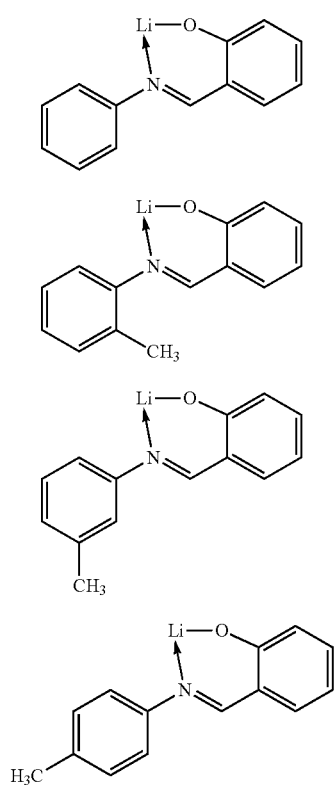

more preferred the lithium organic complex is selected from a compound of Table 1.

The lithium halide of the organic semiconductive layer may be selected from the group comprising a LiF, LiCl, LiBr or LiJ, and preferably LiF.

When the organic semiconductive layer comprising a compound of formula (1) is an electron transport layer or electron injection layer and further comprises a dopant selected from a lithium organic complex and/or of a lithium halide, particularly low operating voltage and high efficiency and lifetime are obtained.

It is also preferred that the organic semiconductive layer comprises a zero-valent metal dopant.

The zero-valent metal dopant is selected from alkali metals, alkaline earth metals, rare earth metals and/or group 3 transition metals. Preferably, the zero-valent metal dopant is selected from the group consisting of Li, Na, K, Rb, Cs, Mg, Ca, Sr, Ba, Yb, Sm, Eu, Nd, Tb, Gd, Ce, La, Sc and Y, more preferred the zero-valent metal dopant is selected from the group consisting of Li, Na, Mg, Ca, Ba, Yb, and even more preferred the zero-valent metal dopant is selected from the group consisting of Li, Mg, Ba, Yb.

When the organic semiconductive layer comprising a compound of formula (1) is an electron injection layer and/or n-type charge generation layer and further comprises a dopant selected from a zero-valent metal dopant, particularly low operating voltage and high efficiency and lifetime are obtained. For alternative purposes, it may be preferred that the organic semiconductive layer is free of a dopant and consists of the at least one compound of formula (1). This is particularly true, if no dopant is necessary to be present in the inventive layer for operating the same. In particular, the semiconductive organic layer may be free of an alkali organic complex and/or halide and/or zero-valent metal.

In an embodiment, the organic semiconductive layer is located between the anode and the cathode. Preferably, the layer is located closer to the cathode than to the anode. Preferably, the layer is adjacent to the cathode. Also preferred, the organic semiconductive layer is arranged between the emission layer and the cathode. If a hole blocking layer is present, the organic semiconductive layer is arranged between the hole blocking layer and the cathode.

In an embodiment, the organic semiconductive layer is an electron transport layer. Preferably, the layer is adjacent to a cathode or an electron injection layer, if present. In another aspect, the organic semiconductive layer is the electron transport layer and the layer is arranged adjacent to a charge generation layer.

In another embodiment, the organic semiconductive layer is an electron injection layer. Preferably, the layer is arranged between a cathode and an electron transport layer.

More preferred, the organic semiconductive layer is an electron transport layer and/or an electron injection layer.

In an embodiment, the organic semiconductive layer is an n-type charge generation layer (CGL). The n-type CGL is arranged between the anode and cathode. If at least one emission layer is present, the n-type CGL is arranged between the first and second emission layer. Preferably, the n-type COL is adjacent to an emission layer and/or p-type CGL. More preferred, the n-type CGL is arranged between an emission layer and a p-type CGL.

In another aspect, the organic semiconductive layer is not an anode layer or a cathode layer. If not discussed otherwise, the terms anode (cathode), anode (cathode) layer and anode (cathode) electrode are used synonymously herein.

In another aspect, the organic semiconductive layer is not an emission layer. Preferably, the organic semiconductive layer is free of emitter.

In a preferred embodiment, the organic semiconductive layer is in direct contact with the emission layer.

In another aspect, the organic semiconductive layer is in direct contact with the cathode.

In another aspect, the organic semiconductive layer is arranged between the emission layer and an electron injection layer and is in direct contact with both layers.

In another aspect, the organic semiconductive layer is arranged between the emission layer and an n-type CGL and is in direct contact with both layers. In another aspect, the organic semiconductive layer is arranged between an electron transport layer and a p-type CGL and is in direct contact with both layers.

In another aspect, the organic semiconductive layer is arranged between the emission layer and a p-type COL and is in direct contact with both layers.

In another aspect, the organic semiconductive layer is arranged between the emission layer and the cathode layer and is in direct contact with both layers.

In another aspect, the organic semiconductive layer is arranged between an electron transport layer and the cathode layer and is in direct contact with both layers.

The object is further achieved by an organic electroluminescent device (OLED) comprising the inventive organic semiconductive layer.

The organic electroluminescent device (OLED) may be a bottom- or top-emission device.

According to another aspect, the organic electroluminescent device according to the present invention may comprise more than one emission layer, preferably two or three emission layers. An OLED comprising more than one emission layer is also described as a tandem OLED or stacked OLED.

Another aspect is directed to a device comprising at least one organic electroluminescent device (OLED). A device comprising organic light-emitting diodes is for example a display or a lighting panel.

In the present invention, the following defined terms, these definitions shall be applied, unless a different definition is given in the claims or elsewhere in this specification.

In the context of the present specification the term "different" or "differs" in connection with the matrix material means that the matrix material differs in their structural formula.

In the context of the present specification the term "different" or "differs" in connection with the lithium compound means that the lithium compound differs in their structural formula.

The external quantum efficiency, also named EQE, is measured in percent (%).

The lifetime, also named LT, between starting brightness and 97% of the original brightness is measured in hours (h).

The operating voltage, also named V. is measured in Volt (V) at 10 milliAmpere per square centimeter (mA/cm$^2$).

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The terms "OLED" and "organic electroluminescent device" and "organic light-emitting diode" are simultaneously used and have the same meaning.

The term "electron transport layer stack" as used in the specification comprises at least two electron transport layers or at least three electron transport layers.

The term "different compound" as used in connection with the matrix compound means that the matrix compound differs from the other matrix compound in its chemical formula.

As used herein, "weight percent", "wt.-%", "percent by weight", "% by weight", and variations thereof refer to a composition, component, substance or agent as the weight of that component, substance or agent of the respective electron transport layer divided by the total weight of the respective electron transport layer thereof and multiplied by 100. It is understood that the total weight percent amount of all components, substances and agents of the respective electron transport layer and electron injection layer are selected such that it does not exceed 100 wt.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

In the context that the electron transport layer is free of a zero-valent metal dopant, alkali halide, alkali organic complex and/or emitter, the term "free of" means that the so called "free of" electron transport layer may comprise of about 5 wt.-% or less of a zero-valent metal dopant, alkali halide, alkali organic complex and/or emitter, preferably about 0.5 wt.-% or less, and more preferably about 0.05 wt.-% or less, and even more preferably about 0.005 wt.-% or less of a zero-valent metal dopant, alkali halide, alkali organic complex and/or emitter and most preferred is free of a zero-valent metal dopant, alkali halide, alkali organic complex and/or emitter.

Substrate

The substrate may be any substrate that is commonly used in manufacturing of organic light-emitting diodes. If light is emitted through the substrate, the substrate may be a transparent material, for example a glass substrate or a transparent plastic substrate, having excellent mechanical strength, thermal stability, transparency, surface smoothness, ease of handling, and waterproofness. If light is emitted through the top surface, the substrate may be a transparent or non-transparent material, for example a glass substrate, a plastic substrate, a metal substrate or a silicon substrate.

Anode Electrode

The anode electrode may be formed by depositing or sputtering a compound that is used to form the anode electrode. The compound used to form the anode electrode may be a high work-function compound, so as to facilitate hole injection. The anode material may also be selected from a low work function material (i.e. Aluminum). The anode electrode may be a transparent or reflective electrode. Transparent conductive compounds, such as indium tin oxide (ITO), indium zinc oxide (IZO), tin-dioxide ($SnO_2$), and zinc oxide (ZnO), may be used to form the anode electrode 120. The anode electrode 120 may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

Hole Injection Layer

The hole injection layer (HIL) 130 may be formed on the anode electrode 120 by vacuum deposition, spin coating, printing, casting, slot-die coating, Langmuir-Blodgett (LB) deposition, or the like. When the HIL 130 is formed using vacuum deposition, the deposition conditions may vary according to the compound that is used to form the HIL 130, and the desired structure and thermal properties of the HIL 130. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL 130 is formed using spin coating, printing, coating conditions may vary according to a compound that is used to form the HIL 130, and the desired structure and thermal properties of the HIL 130. For example, the coating conditions may include a coating speed of about 2000 rpm to about 5000 rpm, and a thermal treatment temperature of about 80° C. to about 200° C. Thermal treatment removes a solvent after the coating is performed.

The HIL 130 may be formed of any compound that is commonly used to form an HIL. Examples of compounds that may be used to form the HIL 130 include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)poly(4-styrenesulfonate) (PEDOT/PSS), polyaniline/camphor sulfonic acid (Pani/CSA), and polyaniline)/poly(4-styrenesulfonate (PANI/PSS).

The HIL 130 may be a pure layer of p-dopant or may be selected from a hole-transporting matrix compound doped with a p-dopant. Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis (naphthalen-1-yl)-N,N'-bis(phenyl)-benzidine) doped with F4TCNQ. α-NPD doped with 2,2'-(perfluoronaphthalen-2, 6-diylidene) dimalononitrile (PD1). α-NPD doped with 2,2', 2"-(cyclopropane-1,2,3-triylidene)tris(2-(p-cyanotetrafluorophenyl)acetonitrile) (PD2). Dopant concentrations can be selected from 1 to 20 wt.-%, more preferably from 3 wt.-% to 10 wt.-%.

The thickness of the HIL 130 may be in the range of about 1 nm to about 100 nm, and for example, about 1 nm to about 25 nm. When the thickness of the HIL 130 is within this range, the HIL 130 may have excellent hole injecting characteristics, without a substantial increase in driving voltage.

Hole Transport Layer

The hole transport layer (HTL) 140 may be formed on the HIL 130 by vacuum deposition, spin coating, slot-die coating, printing, casting, Langmuir-Blodgett (LB) deposition, or the like. When the HTL 140 is formed by vacuum deposition or spin coating, the conditions for deposition and coating may be similar to those for the formation of the HIL 130. However, the conditions for the vacuum or solution deposition may vary, according to the compound that is used to form the HTL 140.

The HTL 140 may be formed of any compound that is commonly used to form a HTL. Compound that can be suitably used is disclosed for example in Yasuhiko Shirota and Hiroshi Kageyama, Chem. Rev. 2007, 107, 953-1010 and incorporated by reference. Examples of the compound that may be used to form the HTL 140 are: a carbazole derivative, such as N-phenylcarbazole or polyvinylcarbazole; an amine derivative having an aromatic condensation ring, such as N,N'-bis(3-methylphenyl)-N,N'-diphenyl-[1,1-biphenyl]-4,4'-diamine (TPD), or N,N'-di(naphthalen-1-yl)-N,N'-diphenyl benzidine (alpha-NPD); and a triphenylamine-based compound, such as 4,4',4"-tris(N-carbazolyl) triphenylamine (TCTA). Among these compounds, TCTA can transport holes and inhibit excitons from being diffused into the EML.

The thickness of the HTL 140 may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL 140 may be 170 am to 200 nm.

When the thickness of the HTL 140 is within this range, the HTL 140 may have excellent hole transporting characteristics, without a substantial increase in driving voltage.

Electron Blocking Layer

The function of the electron blocking layer (EBL) 150 is to prevent electrons from being transferred from the emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer is selected between 2 and 20 nm.

The electron blocking layer may comprise a compound of formula Z below

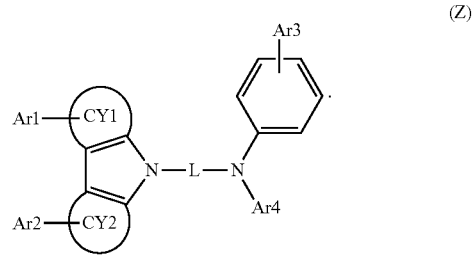

(Z)

In Formula Z,

CY1 and CY2 are the same as or different from each other, and each independently represent a benzene cycle or a naphthalene cycle, Ar1 to Ar3 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable triplet control layer, in particular the triarylamine compounds, are described in EP 2 722 908 A1.

Emission Layer (EML)

The EML 150 may be formed on the HTL by vacuum deposition, spin coating, slot-die coating, printing, casting, LB, or the like. When the EML is formed using vacuum deposition or spin coating, the conditions for deposition and coating may be similar to those for the formation of the HIL. However, the conditions for deposition and coating may vary, according to the compound that is used to form the EML.

The emission layer (EML) may be formed of a combination of a host and a dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TBADN), distyrylarylene (DSA), Bis(2-(2-hydroxyphenyl)benzo-thiazolate) zinc (Zn(BTZ) 2), E3 below, AND, Compound 1 below, and Compound 2 below.

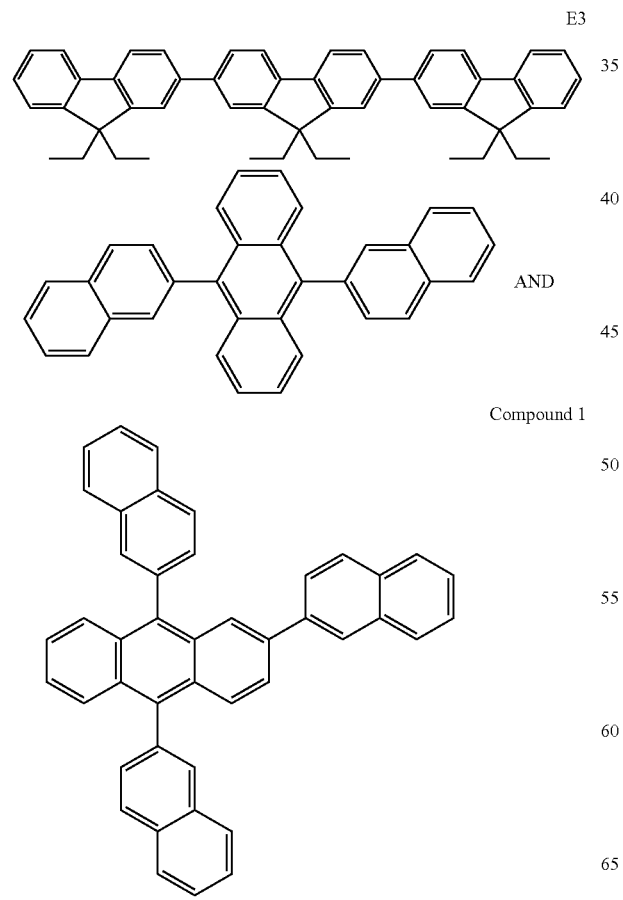

E3

AND

Compound 1

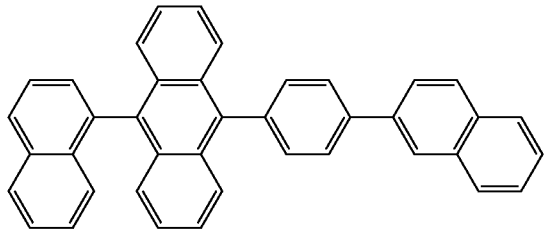

Compound 2

The dopant may be a phosphorescent or fluorescent emitter. Phosphorescent emitters and emitters which emit light via a thermally activated delayed fluorescence (TADF) mechanism are preferred due to their higher efficiency. The emitter may be a small molecule or a polymer.

Examples of a red dopant are PtOEP, Ir(piq) 3, and Btp 2Ir(acac), but are not limited thereto. These compounds are phosphorescent emitters, however, fluorescent red dopants could also be used.

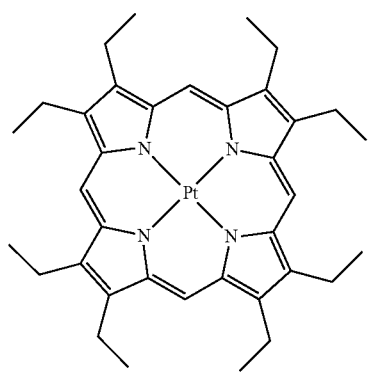

PtOEP

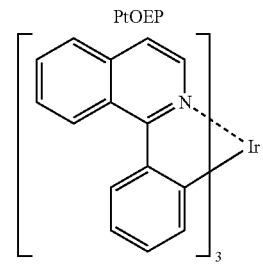

Ir(piq)₃

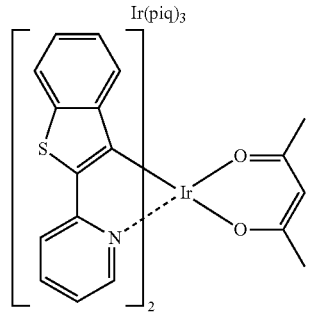

Btp₂Ir(acac)

Examples of a phosphorescent green dopant are Ir(ppy) 3 (ppy=phenylpyridine), Ir(ppy) 2(acac), Ir(mpyp) 3 are shown below. Compound 3 is an example of a fluorescent green emitter and the structure is shown below.

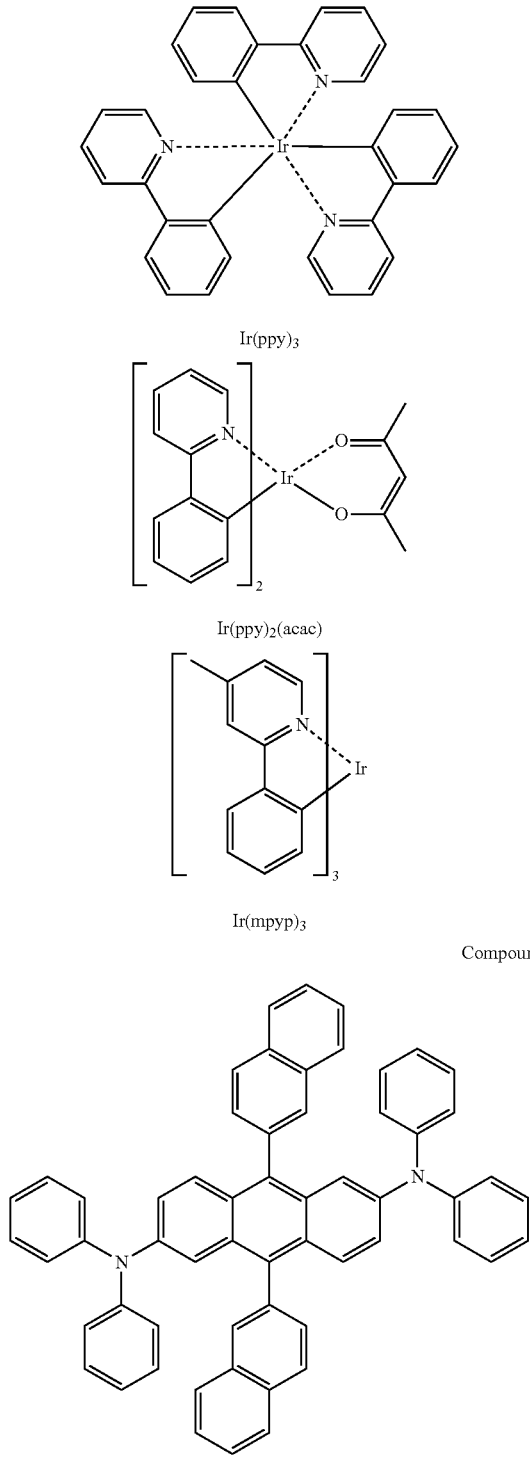

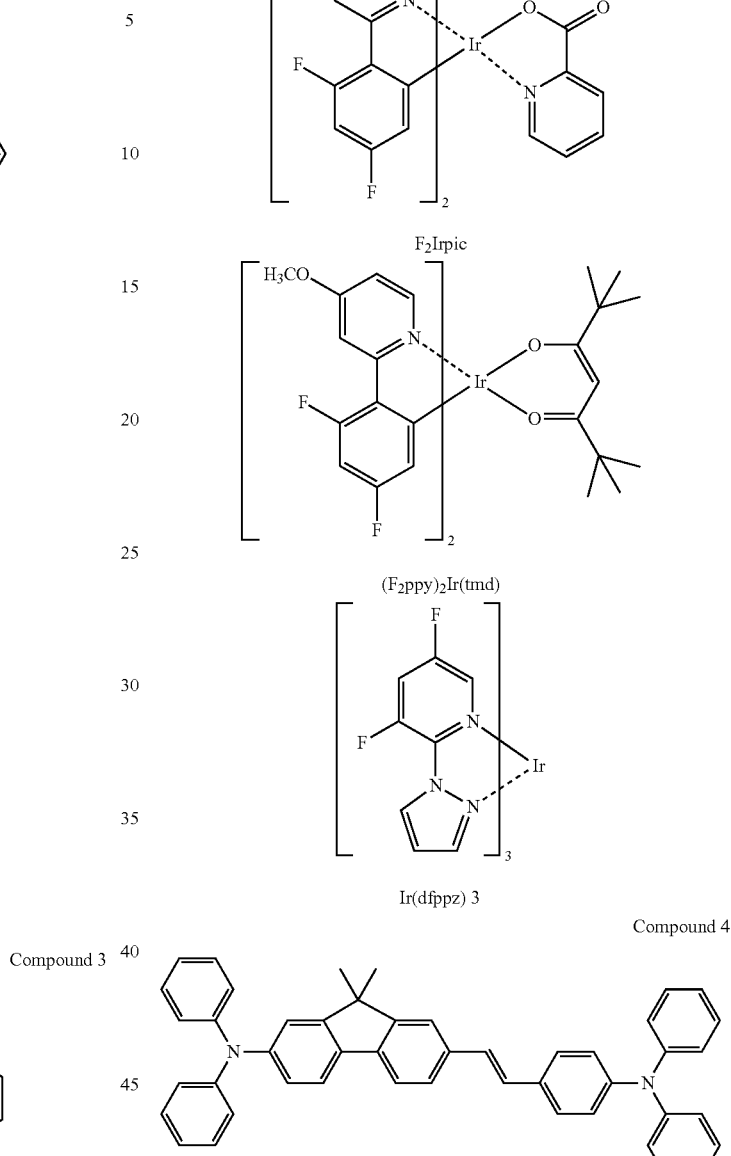

Examples of a phosphorescent blue dopant are F₂Irpic, (F₂ppy)₂Ir(tmd) and Ir(dfppz) 3, ter-fluorene, the structures are shown below. 4.4'-bis(4-diphenyl aminostyryl)biphenyl (DPAVBi), 2,5,8,11-tetra-tert-butyl perylene (TBPe), and Compound 4 below are examples of fluorescent blue dopants.

The amount of the dopant may be in the range of about 0.01 to about 50 parts by weight, based on 100 parts by weight of the host. Alternatively, the emission layer may consist of a light-emitting polymer. The EML may have a thickness of about 10 nm to about 100 nm, for example, about 20 nm to about 60 nm. When the thickness of the EML is within this range, the EML may have excellent light emission, without a substantial increase in driving voltage.

Hole Blocking Layer (HBL)

When the EML comprises a phosphorescent dopant, a hole blocking layer (HBL) may be formed on the EML, by using vacuum deposition, spin coating, slot-die coating, printing, casting, LB deposition, or the like, in order to prevent the diffusion of triplet excitons or holes into the ETL.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include an oxadiazole derivative, a triazole derivative, and a phenanthroline derivative.

The HBL may have a thickness of about 5 nm to about 100 nm, for example, about 10 nm to about 30 nm. When the thickness of the HBL is within this range, the HBL may have excellent hole-blocking properties, without a substantial increase in driving voltage.

Compounds Used in the Electron Transport Layer (ETL)

The OLED according to the present invention may not contain an electron transport layer (ETL). However, the OLED according to the present invention may optional contain an electron transport layer (ETL).

According to various embodiments the OLED may comprises an electron transport layer or an electron transport layer stack comprising at least a first electron transport layer and at least a second electron transport layer.

According to various embodiments of the OLED of the present invention the electron transport layer may comprises at least one matrix compound. Preferably, the matrix compound is an organic compound. More preferred, the matrix compound is a covalent organic matrix compound. In other words, the matrix compound comprises covalent bonds. It is to be understood that "substantially covalent" means compounds comprising elements bound together mostly by covalent bonds.

According to various embodiments of the OLED the matrix compound may be selected from:
an anthracene based compound or a heteroaryl substituted anthracene based compound, preferably 2-(4-(9,10-di(naphthalen-2-yl)anthracene-2-yl)phenyl)-1-phenyl-1H-benzo[d]imidazole and/or N4,N4"-di(naphthalen-1-yl)-N4,N4"-diphenyl-[1,1':4',1"-terphenyl]-4,4"-diamine;
a phosphine oxide based compound, preferably (3-(dibenzo[c,h]acridin-7-yl)phenyl)diphenylphosphine oxide and/or phenyl bis(3-(pyren-1-yl)phenyl)phosphine oxide and/or 3-Phenyl-3H-benzo[b]dinaphtho[2,1-d:1',2'-f]phosphepine-3-oxide; or
a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline.

According to various embodiments of the OLED the matrix compound of the electron transport layer may be preferably selected from:
a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide; or
a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline.

According to various embodiments of the OLED the matrix compound of the electron transport layer may be more preferred selected from:
a phosphine oxide based compound, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide.

According to various embodiments of the OLED of the present invention the thicknesses of the electron transport layer may be in the range of about ≥0.5 nm to about ≤95 nm, preferably of about ≥3 nm to about ≤80 nm, further preferred of about ≥5 nm to about ≤60 nm, also preferred of about ≥6 nm to about ≤40 nm, in addition preferred about ≥8 nm to about ≤20 nm and more preferred of about ≥10 nm to about ≤18 nm.

According to various embodiments of the OLED of the present invention the thicknesses of the electron transport layer stack can be in the range of about ≥25 nm to about ≤100 nm, preferably of about ≥30 nm to about ≤80 nm, further preferred of about ≥35 nm to about ≤60 nm, and more preferred of about ≥36 nm to about ≤40 nm.

According to one embodiment of the OLED, the electron transport layer comprises of about ≥50 wt.-% to about ≤60 wt.-% of a first lithium halide or a first lithium organic complex and about ≤50 wt.-% to about ≥40 wt.-% of a matrix compound of:
a phosphine oxide based compound, preferably (3-(dibenzo[c,h]acridin-7-yl)phenyl))diphenylphosphine oxide, 3-phenyl-3H-benzo[b]dinaphtho[2,1-d:1',2'-f]phosphepine-3-oxide and/or phenyl bis(3-(pyren-1-yl)phenyl)phosphine oxide; or
a substituted phenanthroline compound, preferably 2,4,7,9-tetraphenyl-1,10-phenanthroline, 4,7-diphenyl-2,9-di-p-tolyl-1,10-phenanthroline, or 2,9-di(biphenyl-4-yl)-4,7-diphenyl-1,10-phenanthroline.

The light-emitting diode (OLED) may comprises at least two electrodes, an anode electrode and a cathode electrode.

The electron transport layer/s or electron transport layer stack is not an electrode. The electron transport layer/s or electron transport layer are sandwiched between two electrodes, namely sandwiched between an anode and a second cathode.

The ETL may be formed optional on an EML or on the HBL if the HBL is formed. The ETL includes a first layer including a first lithium halide or a first lithium organic complex; and optional a second electron transport layer including a second lithium halide or a second lithium organic complex, wherein optional the first lithium organic complex is not the same as the second lithium organic complex and wherein the first lithium halide is not the same as the second lithium halide.

The ETL includes a first layer comprising a first matrix compound and a lithium halide or a lithium organic complex; and optional a second electron transport layer comprising a second matrix compound and a metal dopant selected from a group comprising alkali, alkaline earth and rare earth metals.

The ETL includes a first layer comprising a first matrix compound and a lithium halide or a lithium organic complex; and optional a second electron transport layer comprising a second matrix compound and is free of dopant.

The ETL may have a stacked structure, preferably of two ETL-layers, so that injection and transport of electrons may be balanced and holes may be efficiently blocked. In a conventional OLED, since the amounts of electrons and holes vary with time, after driving is initiated, the number of excitons generated in an emission area may be reduced. As a result, a carrier balance may not be maintained, so as to reduce the lifetime of the OLED.

However, in the ETL, the first layer and the second layer may have similar or identical energy levels, so that the carrier balance may be uniformly maintained, while controlling the electron-transfer rate.

Matrix compound for the electron layer that can be suitable used are selected from the group comprising anthracene compounds, preferably 2-(4-(9,10-di(naphthalen-2-yl)anthracen-2-yl)phenyl)-1-phenyl-1H-benzo[d]imidazole Anthracene compounds that can be used as matrix materials are disclosed in U.S. Pat. No. 6,878,469 B.

Other matrix compounds that can be used are diphenylphosphine oxide, preferably (3-(dibenzo[c,h]acridin-7-yl)phenyl)diphenylphosphine oxide, phenylbis(3-(pyren-1-yl)phenyl)phosphine oxide, 3-phenyl-3H-benzo[b]dinaphtho[2,1-d:1',2'-f]phosphepine-3-oxide, phenyldi(pyren-1-yl)phosphine oxide.

Diphenylphosphine oxide compounds that can be used as matrix materials are disclosed in EP 2395571 A1, WO2013079217 A1, EP 13187905, EP13199361 and JP2002063989 A1.

Other suitable matrix compounds that can be used are phenanthroline compounds, preferably selected from the group comprising of 2,4,7,9-tetraphenyl-1,10-phenanthroline, 4,7-diphenyl-2,9-di-p-tolyl-1,10-phenanthroline, and 2,9-di(biphenyl-4-yl)-4,7-diphenyl-1,10-phenanthroline. Phenanthroline compounds that can be used as matrix materials are disclosed in EP 1786050 A1.

The matrix compound of the electron transport layer may be a compound that efficiently transports electrons, such as an anthracene-based compound, diphenylphosphine oxide based compound, or a phenanthroline based compound, preferably a matrix compound mentioned in Table 4. For example, the matrix compound of the electron transport layer may be selected from the group consisting of Compound 5, a compound represented by Formula 2, and a compound represented by Formula 3 below:

Compound 5

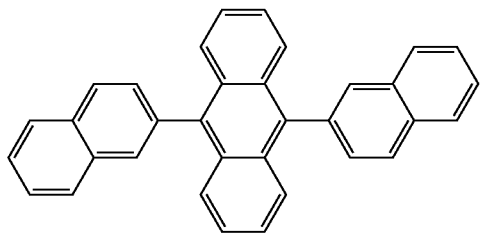

Formula 2

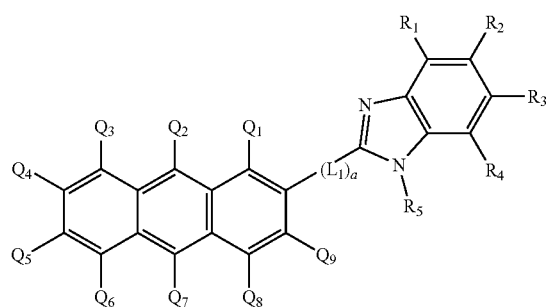

Formula 3

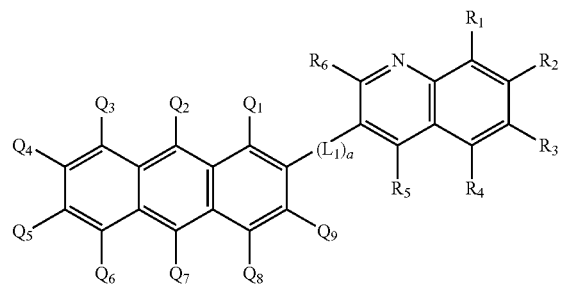

In Formulae 2 and 3, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group. At least two adjacent $R_1$ to $R_6$ groups are optionally bonded to each other, to form a saturated or unsaturated ring. $L_1$ is a bond, a substituted or unsubstituted $C_1$-$C_{30}$ alkylene group, a substituted or unsubstituted $C_6$-$C_{30}$ arylene group, or a substituted or unsubstituted $C_3$-$C_{30}$ hetero arylene group. $Q_1$ through $Q_9$ are each independently a hydrogen atom, a substituted or unsubstituted $C_6$-$C_{30}$ aryl group, or a substituted or unsubstituted $C_3$-$C_{30}$ hetero aryl group, and "a" is an integer from 1 to 10.

For example, $R_1$ to $R_6$ may be each independently selected from the group consisting of a hydrogen atom, a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group.

In particular, in Formula 2 and/or 3, $R_1$ to $R_4$ may each be a hydrogen atom, $R_5$ may be selected from the group consisting of a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group. In addition, in Formula 3, $R_1$ to $R_6$ may each be a hydrogen atom.

For example, in Formula 2 and/or 3, $Q_1$ to $Q_9$ are each independently a hydrogen atom, a phenyl group, a naphthyl group, an anthryl group, a pyridinyl group, and a pyrazinyl group. In particular, in Formulae 2 and/or 3, $Q_1$, $Q_3$-$Q_6$, $Q_8$ and $Q_9$ are hydrogen atoms, and $Q_2$ and $Q_7$ may be each independently selected from the group consisting of a phenyl group, a naphthyl group, an anthryl group, a pyridinyl group, and a pyrazinyl group.

For example, $L_1$, in Formula 2 and/or 3, may be selected from the group consisting of a phenylene group, a naphthylene group, an anthrylene group, a pyridinylene group, and a pyrazi-nylene group. In particular, $L_1$ may be a phenylene group or a pyridinylene group. For example, "a" may be 1, 2, or, 3.

The matrix compound for the ETL-layer may be further selected from Compound 5, 6, or 7 below:

Compound 6
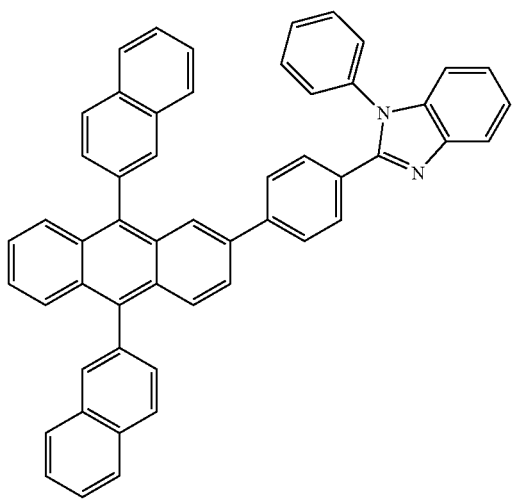 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]
Compound 7
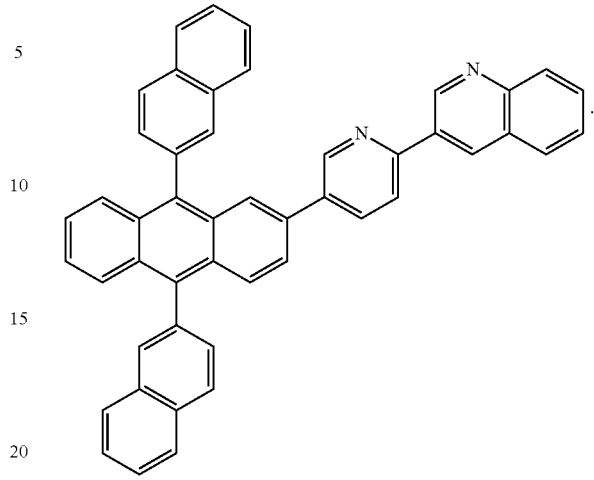
TABLE 2
Chemical structures of matrix materials that can be suitable used for ETL- and /or EIL-layer
| Compound | Name | Structure | Publication |
|---|---|---|---|
| MX 1 | 2-(4-(9,10-di(naphthalen-2-yl)anthracen-2-yl)phenyl)-1-phenyl-1H-benzo[d]imidazole | | US 6878469 B2 |
| MX 2 | (3-(dibenzo[c,h]acridin-7-yl)phenyl)diphenylphosphine oxide | | EP 2395571B1, WO2013079217A1 |

TABLE 2-continued

Chemical structures of matrix materials that can be suitable used for ETL- and /or EIL-layer

| Compound | Name | Structure | Publication |
|---|---|---|---|
| MX 3 | Phenylbis(3-(pyren-1-yl)phenyl)phosphine oxide | | EP13187905.8 |
| MX 4 | 3-Phenyl-3H-benzo[b]dinaphtho[2,1-d:1',2'-f]phosphepine-3-oxide | | EP13199361.0 |
| MX 5 | Phenyldi(pyren-1-yl)phosphine oxide | | JP4876333 |
| MX 6 | 2,4,7,9-tetraphenyl-1,10-phenanthroline | | EP1786050 |

TABLE 2-continued

Chemical structures of matrix materials that can be suitable used for ETL- and /or EIL-layer

| Compound | Name | Structure | Publication |
|---|---|---|---|
| MX 8 | 2,9-di(biphenyl-4-yl)-4,7-diphenyl-1,10-phenanthroline | | EP1786050 |
| MX 9 | bis(4-(anthracen-9-yl)phenyl)(phenyl)phosphine oxide | | EP13187905 |
| MX 10 | 4,7-diphenyl-2,9-di-p-tolyl-1,10-phenanthroline | | EP1786050 |
| MX 11 | 1-(4-(10-([1,1'-biphenyl]-4-yl)anthracen-9-yl)phenyl)-2-ethyl-1H-benzo[d]imidazole | | WO2010134352 |

The electron transport layer may comprises a lithium halide or a lithium organic complex.

Suitable organic ligands to form a lithium organic complex that can be used for the electron transport layer are disclosed, for example, in US 2014/0048792 and Kathirganmnathan, Poopathy, Arkley, Vincent; Surendrakumar, Sivagnanasundrm; Chan, Yun F.; Ravichandran, Seenivasagam; Ganeshamurugan, Subramaniam; Kumaraverl, Muttulingam; Antipan-Lara, Juan; Paramaswara, Gnanamolly; Reddy, Vanga R, Digest of Technical Papers—Society for Information Display International Symposium (2010), 41(Bk. 1), 465-468.

The organic ligand of the lithium organic complex of the electron transport layer may be selected from the group comprising a quinolate, a borate, a phenolate, a pyridinolate or a Schiff base ligand, or Table 1;

preferably the lithium quinolate complex has the formula m:

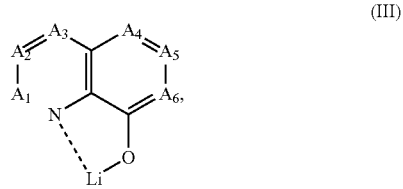

(III)

wherein $A_1$ to $A_6$ are same or independently selected from CH, CR, N, O;

R is same or independently selected from hydrogen, halogen, alkyl or aryl or heteroaryl with 1 to 20 carbon atoms; and more preferred $A_1$ to $A_6$ are CH;

preferably the borate based organic ligand is a tetra (1H-pyrazol-1-yl)borate;

preferably the phenolate is a 2-(pyridin-2-yl)phenolate or a 2-(diphenylphosphoryl)phenolate;

preferably the lithium Schiff base has the structure 100, 101, 102 or 103:

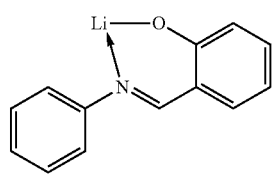

100

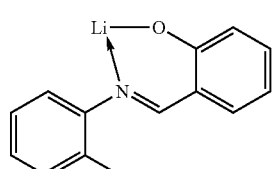

101

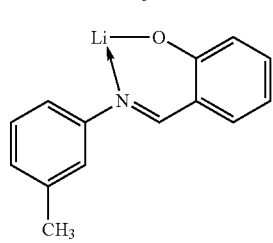

102

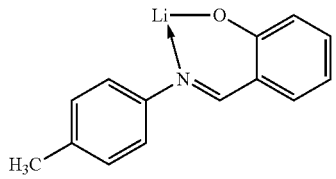

103 more preferred the lithium organic complex is selected from a compound of Table 1.

The lithium halide of the electron transport layer may be selected from the group comprising a LiF, LiCl, LiBr or LiJ, and preferably LiF.

The ETL may be formed on the EML by vacuum deposition, spin coating, slot-die coating, printing, casting, or the like. When the ETL is formed by vacuum deposition or spin coating, the deposition and coating conditions may be similar to those for formation of the HIL 130. However, the deposition and coating conditions may vary, according to a compound that is used to form the ETL.

Electron Injection Layer (EIL)

The optional EIL, which may facilitates injection of electrons from the cathode, may be formed on the ETL, preferably directly on the electron transport layer. Examples of materials for forming the EIL include LiQ, LiF, NaCl, CsF, $Li_2O$, BaO, Ca, Ba, Yb, Mg which are known in the art. Deposition and coating conditions for forming the EIL are similar to those for formation of the HIL, although the deposition and coating conditions may vary, according to a material that is used to form the EIL.

The thickness of the EIL may be in the range of about 0.1 nm to 10 nm, for example, in the range of 0.5 nm to 9 nm. When the thickness of the EIL is within this range, the EIL may have satisfactory electron-injecting properties, without a substantial increase in driving voltage.

Cathode Electrode

The cathode electrode is formed on the EIL if present. The cathode electrode may be a cathode, which is an electron-injecting electrode. The cathode electrode may be formed of a metal, an alloy, an electrically conductive compound, or a mixture thereof. The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. In addition, the cathode electrode may be formed of a transparent conductive material, such as ITO or IZO.

The thickness of the cathode electrode may be in the range of about 5 nm to 1000 nm, for example, in the range of 10 nm to 100 nm. When the cathode electrode is in the range of 5 nm to 50 nm, the electrode will transparent even if a metal or metal alloy is used.

The cathode electrode is not an electron injection layer or electron transport layer.

Since the layers of the ETL have similar or identical energy levels, the injection and transport of the electrons may be controlled, and the holes may be efficiently blocked. Thus, the OLED may have long lifetime.

Charge Generation Layer

The charge generation layer (COL) 140 is composed of a double layer.

To be more specific, the charge generation layer can be a pn junction charge generation layer joining n-type charge generation layer 185 and p-type charge generation layer 135.

The pn junction charge generation layer generates charges or separates them into holes and electrons; and injects the charges into the individual light emission layer. In other words, the n-type charge generation layer 185 provides electrons for the first light emission layer 150 near the anode while the p-type charge generation layer 135 provides holes to the second light emission layer 151 near the cathode 190, by which luminous efficiency of an organic light emitting device incorporating multiple light emission layers can be further improved and at the same time, driving voltage can be lowered.

The p-type charge generation layer 135 can be composed of metal or organic material doped with p-type dopant. Here, the metal can be one or an alloy consisting of two or more selected from a group consisting of Al, Cu, Fe, Pb, Zn, Au, Pt, W, In, Mo, Ni, and Ti. Also, p-type dopant and host used for organic material doped with the p-type can employ conventional materials. For example, the p-type dopant can be one selected from a group consisting of tetrafluoro-7,7,8,8-tetracyanoquinodimethane (F4-TCNQ), derivative of tetracyanoquinodimethane, radialene derivative, iodine, FeCl3, FeF3, and SbC15. Also, the host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNB).

The n-type charge generation layer 185 can be composed of metal or organic material doped with n-type. The metal can be one selected from a group consisting of Li, Na, K, Rb, Cs, Mg, Ca, Sr, Ba, La, Ce, Sm, Eu, Tb, Dy, and Yb. Also, n-type dopant and host used for organic material doped with the n-type can employ conventional materials. For example, the n-type dopant can be alkali metal, alkali metal compound, alkali earth metal, or alkali earth metal compound. More specifically, the n-type dopant can be one selected from a group consisting of Cs, K, Rb, Mg, Na, Ca, Sr, Eu and Yb. The host material can be one selected from a group consisting of tris(8-hydroxyquinoline)aluminum, triazine, hydroxyquinoline derivative, benzazole derivative, and silole derivative.

In a preferred embodiment, the host material is selected from compound of formula (1).

In another preferred embodiment, the electron transport layer comprised compound of formula (1) and an n-type charge generation layer (185), which is arranged adjacent to the electron transport layer. The n-type charge generation layer according to one example may include compounds of the following Chemical Formula X.

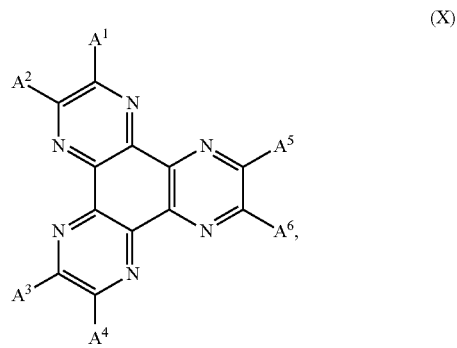

(X)

wherein
each of $A^1$ to $A^6$ may be hydrogen, a halogen atom, nitrile (—CN), nitro (—NO₂), sulfonyl (—SO₂R), sulfoxide (—SOR), sulfonamide (—SO₂NR), sulfonate (—SO₃R), trifluoromethyl (—CF₃), ester (—COOR), amide (—CONHR or —CONRR'), substituted or unsubstituted straight-chain or branched-chain C1-C12 alkoxy, substituted or unsubstituted straight-chain or branched-chain C1-C12 alkyl, substituted or unsubstituted straight-chain or branched chain C2-C12 alkenyl, a substituted or unsubstituted aromatic or non-aromatic heteroring, substituted or unsubstituted aryl, substituted or unsubstituted mono- or di-arylamine, substituted or unsubstituted aralkylamine, or the like. Herein, each of the above R and R' may be substituted or unsubstituted $C_1$-$C_{60}$ alkyl, substituted or unsubstituted aryl, or a substituted or unsubstituted 5- to 7-membered heteroring, or the like.

Particularly preferred is an n-type charge generation layer comprising CNHAT

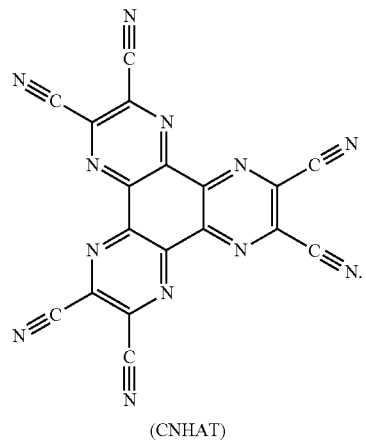

(CNHAT)

The p-type charge generation layer is arranged on top of the n-type charge generation layer. As the materials for the p-type charge generation layer (135), aryl amine-based compounds may be used. One embodiment of the aryl amine-based compounds includes compounds of the following Chemical Formula Y:

(Y)

wherein
$Ar_1$, $Ar_2$ and $Ar_3$ are each independently hydrogen or a hydrocarbon group.

Herein, at least one of Ar1, Ar2 and Ar3 may include aromatic hydrocarbon substituents, and each substituent may be the same, or they may be composed of different substituents. When Ar1, Ar2 and Ar3 are not aromatic hydrocarbons, they may be hydrogen; a straight-chain, branched-chain or cyclic aliphatic hydrocarbon; or a heterocyclic group including N, O, S or Se.

Organic Light-Emitting Diode (OLED)

According to another aspect of the present invention, there is provided an organic light-emitting diode (OLED) comprising: a substrate; a anode electrode formed on the substrate; a hole injection layer, a hole transport layer, an emission layer, and a cathode electrode.

According to another aspect of the present invention, there is provided an organic light-emitting diode (OLED) comprising: a substrate; a anode electrode formed on the substrate; a hole injection layer, a hole transport layer, an electron blocking layer, an emission layer, hole blocking layer and a cathode electrode.

According to another aspect of the present invention, there is provided an organic light-emitting diode (OLED) comprising: a substrate; a anode electrode formed on the substrate; a hole injection layer, a hole transport layer, and electron blocking layer, an emission layer, hole blocking layer, electron transport layer, and a cathode electrode.

According to another aspect of the present invention, there is provided an organic light-emitting diode (OLED) comprising: a substrate; a anode electrode formed on the substrate; a hole injection layer, a hole transport layer, an electron blocking layer, an emission layer, hole blocking layer, electron transport layer, an electron injection layer, and a cathode electrode.

According to various embodiments of the present invention, there is provided an organic light-emitting diode (OLED) further comprising an electron injection layer formed between the electron transport layer and the cathode electrode.

According to various embodiments of the OLED of the present invention, the OLED may not comprises an electron injection layer.

According to various embodiments of the OLED of the present invention, the OLED may not comprises an electron transport layer.

According to various embodiments of the OLED of the present invention, the OLED may not comprises an electron transport layer and an electron injection layer.

According to one aspect an OLED can comprise a layer structure of a substrate that is adjacent arranged to an anode electrode, the anode electrode is adjacent arranged to a first hole injection layer, the first hole injection layer is adjacent arranged to a first hole transport layer, the first hole transport layer is adjacent arranged to a first electron blocking layer, the first electron blocking layer is adjacent arranged to a first emission layer, the first emission layer is adjacent arranged to a first electron transport layer, the first electron transport layer is adjacent arranged to an n-type charge generation layer, the n-type charge generation layer is adjacent arranged to a p-type charge generation layer, the p-type charge generation layer is adjacent arranged to a second hole injection layer, the second hole injection layer is adjacent arranged to a second hole transport layer, the second hole transport layer is adjacent arranged to a second electron blocking layer, the second electron blocking layer is adjacent arranged to a second emission layer, between the second emission layer and the cathode electrode an optional electron transport layer and/or an optional injection layer are arranged.

According to another aspect of the present invention, there is provided a method of manufacturing an organic light-emitting diode (OLED), the method using.
- at least one deposition source, preferably two deposition sources and more preferred at least three deposition sources; and/or
- deposition via vacuum thermal evaporation; and/or
- deposition via solution processing, preferably the processing is selected from spin-coating, printing, casting and/or slot-die coating.

According to another aspect, there is provided a method comprising the steps, wherein
- on a substrate (110) an anode (120) is formed,
- on the anode (120) an emission layer (150) is formed,
- on the emission layer (150) an electron transport layer (160) is formed,
- on the electron transport layer (160) a cathode electrode (190) is formed,
- optional a hole injection layer (130), a hole transport layer (140), an electron blocking layer (145), an emission layer (150), and a hole blocking layer, are formed in that order between the at least anode (120) and the electron transport layer (160),
- optional an electron injection layer (180) is arranged between the electron transport layer (160) and the cathode (190).

Finally, the object is achieved by a compound of formula (1)

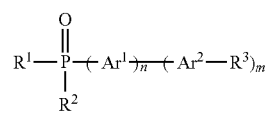

wherein $R^1$ and $R^2$ are each independently selected from $C_1$ to $C_{16}$ alkyl;

$Ar^1$ is selected from $C_6$ to $C_{14}$ arylene or $C_3$ to $C_{12}$ heteroarylene;

$Ar^2$ is independently selected from $C_{14}$ to $C_{40}$ arylene comprising a conjugated system of at least 14 delocalized electrons or $C_8$ to $C_{40}$ heteroarylene comprising a conjugated system of at least 14 delocalized electrons;

$R^3$ is independently selected from H, $C_1$ to $C_{12}$ alkyl or $C_{10}$ to $C_{20}$ aryl;

$Ar^1$, $A^2$ and $R^3$ may each independently be unsubstituted or substituted with at least one $C_1$ to $C_{12}$ alkyl group; and n is 0 or 1;

m is 1 in case of n=0; and m is 1 or 2 in case of n=1; and wherein compounds with $R^1$ and $R^2$ being iso-propyl, n being 0 and $Ar^2$ being anthracenylene or phenanthrylene and $R^3$ being H are excluded.

Definitions and explanations provided with respect to the compounds of formula (1) in the organic semiconductive layer are also true with respect to the inventive compound and throughout the whole application text.

To simplify the synthesis of the inventive compounds, it may be preferred that $R^1$ and $R^2$ are selected the same. That is, it is preferred that $R^1$ and $R^2$ are the same $C_1$ to $C_{16}$ alkyl group.

To adjust the chemical and physical properties, such as solubility, of the inventive compound, it may be preferred that $R^1$ and $R^2$ are each independently selected from $C_1$ to $C_{10}$ alkyl, preferably $C_1$ to $C_8$ alkyl, more preferably $C_1$ to $C_6$ alkyl, further preferred $C_1$ to $C_4$ alkyl.

It is further preferred that $Ar^1$ is selected from a group consisting of phenylene, biphenylene, naphthylene, fluorenylene, pyridylene, quinolinylene and pyrimidinylene.

It is further preferred that $Ar^1$ is selected from $C_6$ to $C_{14}$ arylene.

It is likewise preferred that n is 1.

It is likewise preferred that n is 1 and m is 1.

It may further be preferred that $Ar^2$ is unsubstituted and $R^3$ is hydrogen.

It may further be preferred that $Ar^2$ is unsubstituted and $R^3$ is hydrogen and n=1 and m=1.

In another preferred embodiment, $A^2$ consists of one unsubstituted condensed aromatic system or is represented by one of the following formulas

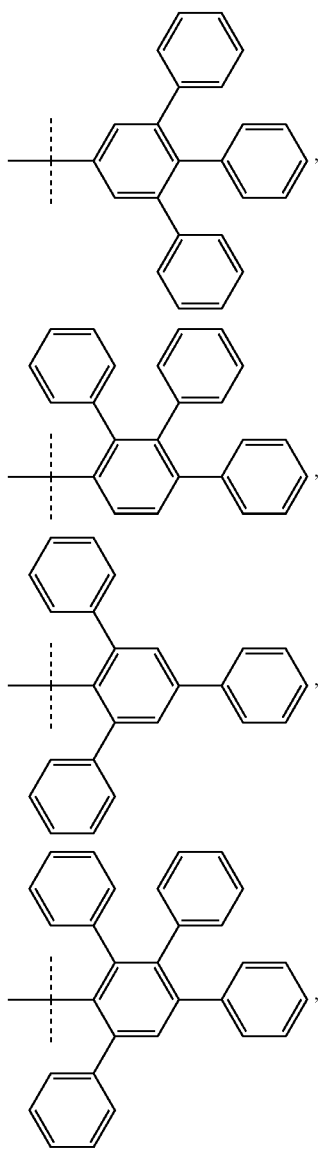

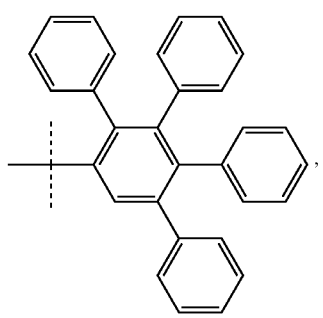

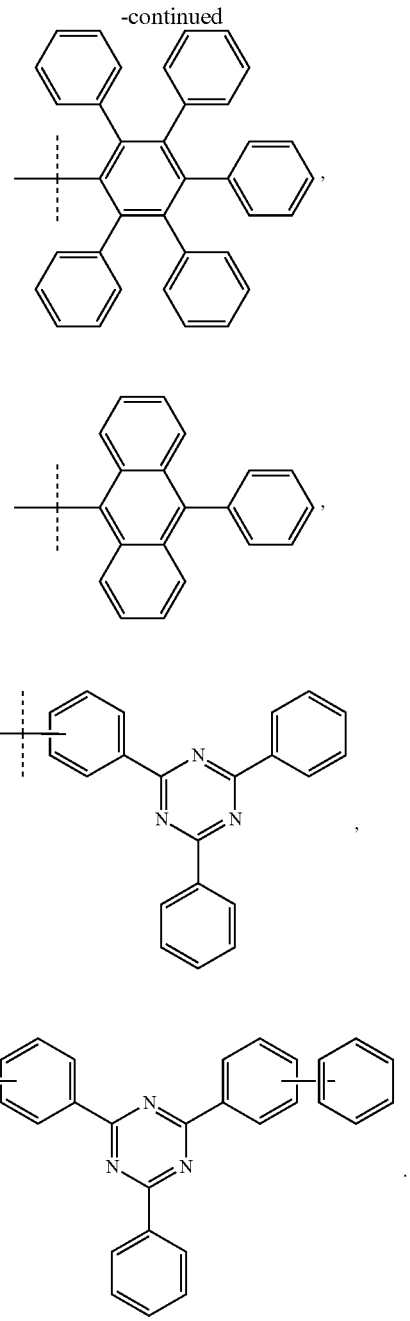

The condensed aromatic system may be selected from the group consisting of 9,9'-spirobi[fluorene]-2,7-ylene, 9,9'-spirobi[fluorene]-3,6-ylene, spiro[fluorene-9,9'-xanthene]-2,7-ylene, spiro[fluorene-9,9'-xanthene]-3,6-ylene, benzofluorenylen, dibenzofluorenylene, anthracenylene, chrysenylene, pyrenylene, phenanthrylene, carbazoylene, benzoacridinylene, dibenzoacridinylene, dibenzofuranylene, naphthobenzofuranylene, dinaphthobenzo-furanylene, dibenzothiophenylene, naphthobenzothiophenylene, dinaphthothiophenylene.

Furthermore, it is preferred that $Ar^2$ is selected from a group consisting of pyrenylene, carbazoylene, benzo[c]acridinylene, dibenzo[c,h]acridinylene, dibenzo[a,j]acridinylene, triazenylene, benzofluorenylene or from a group of the following formulas (IVa) to (IVp),

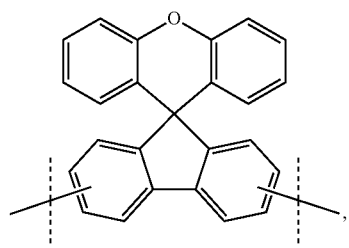 (IVa)
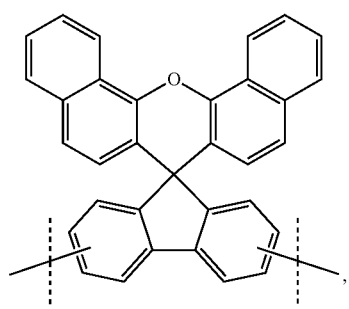 (IVb)
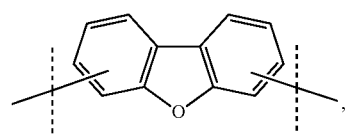 (IVc)
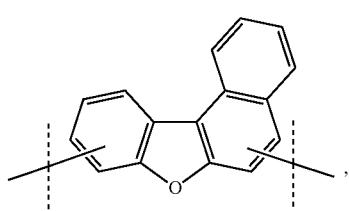 (IVd)
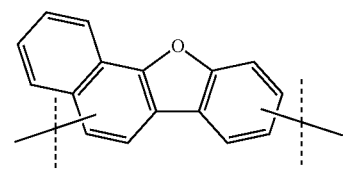 (IVe)
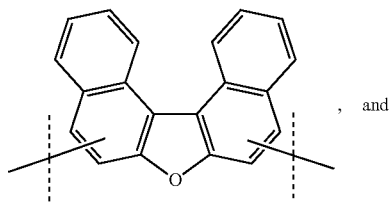 (IVf) , and
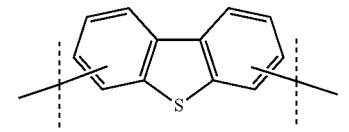 (IVg)
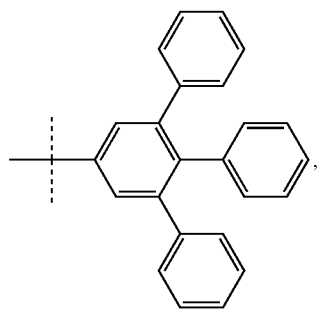 (IVh)
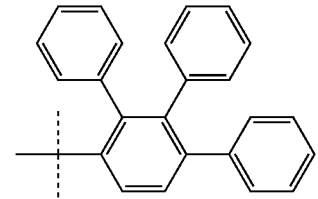 (IVi)
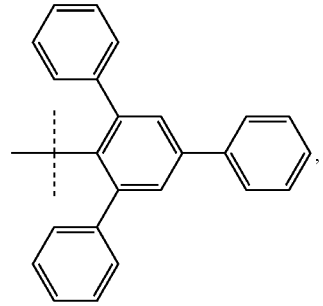 (IVj)
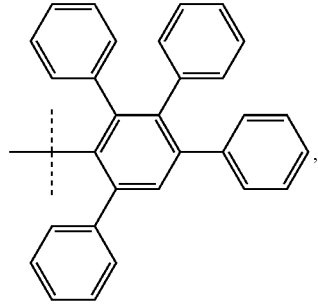 (IVk)
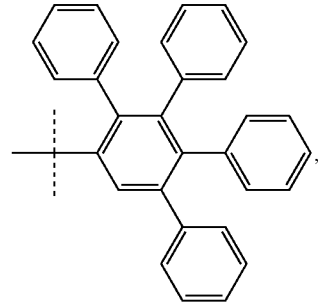 (IVl)

-continued

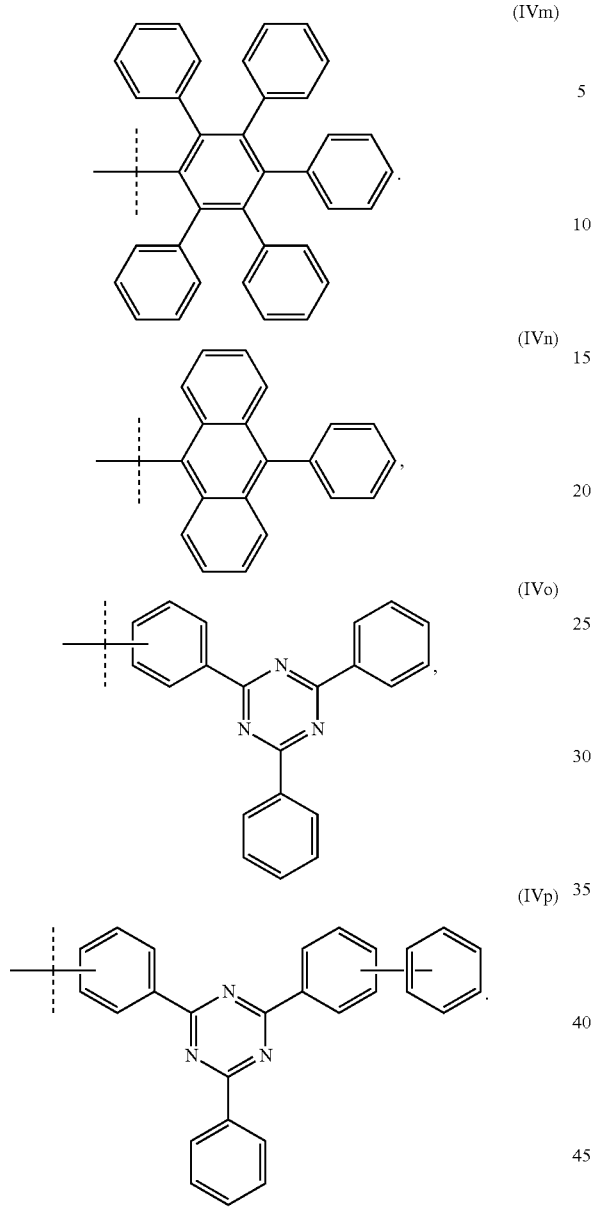

Furthermore preferred, Ar² is selected from a group consisting of pyrenylene, benzo[c]acridinylene, dibenzo[c,h]acridinylene and dibenzo[a,j]acridinylene.

Preferably, Ar² is free of indolyl.

More preferred, Ar² is selected from $C_{14}$ to $C_{40}$ arylene, preferably, $C_{14}$ to $C_{22}$ arylene.

In a preferred embodiment, $R^3$ is selected from H, biphenyl, terphenyl, fluorenyl, naphthyl, phenanthryl, pyrenyl, carbazoyl, dibenzofuranyl or dinapthofuranyl, preferably from H, phenyl, biphenyl or naphthyl.

In the preferred embodiment where $R^3$ is selected from the above-mentioned preferred embodiments, the physical properties are particularly suited to industrial applications.

Likewise, it is preferred that Ar¹, Ar² and $R^3$ are each independently unsubstituted or substituted with at least one $C_1$ to $C_6$ alkyl group, preferably $C_1$ to $C_4$ alkyl group.

Most preferred, Ar¹, Ar² and $R^3$ are unsubstituted.

In an embodiment, n is 0 and m is 1. Preferred compound of formula (1) according to the invention is selected from one of the following compounds 1a to 1i.

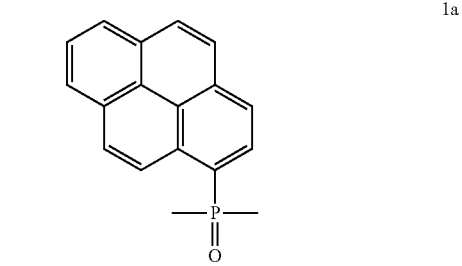

1a

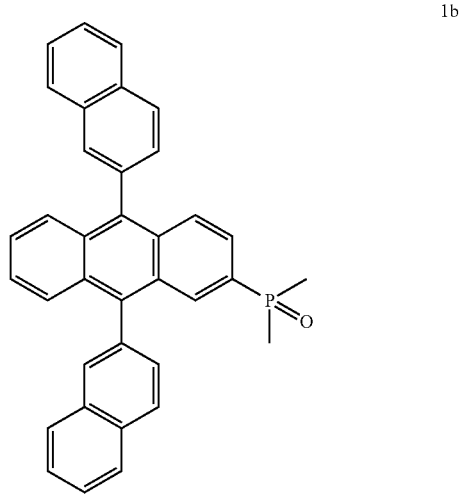

1b

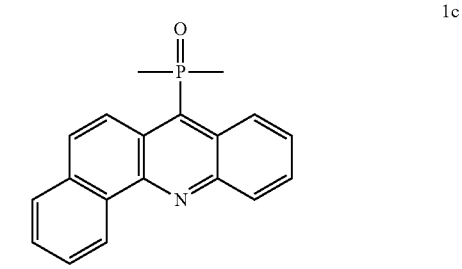

1c

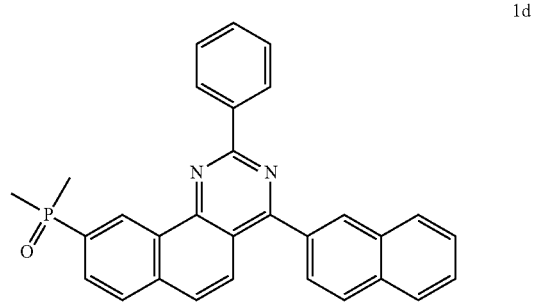

1d

In a further embodiment, n is 1 and m is 1 and $R^3$ is H. Preferred compound of formula (1) according to the invention is selected from one of the following compounds 2a to 2gg.
1e
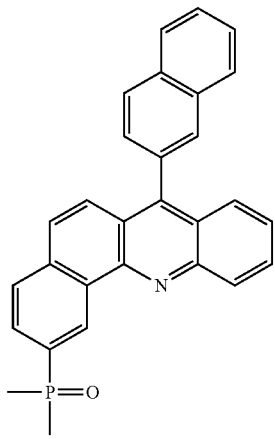
1f
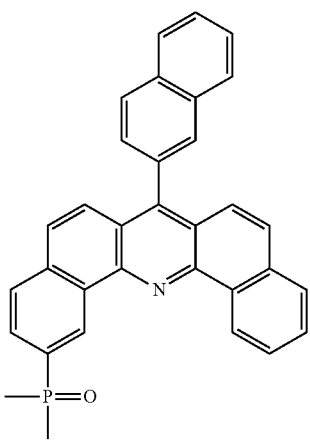
1g
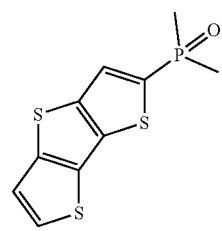
1h
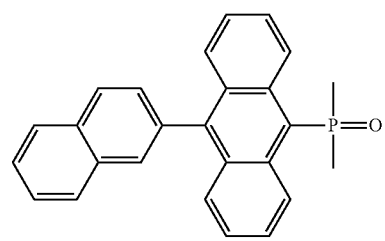
1i
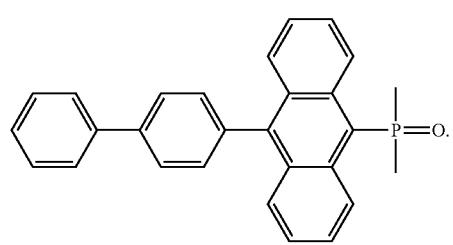
2a
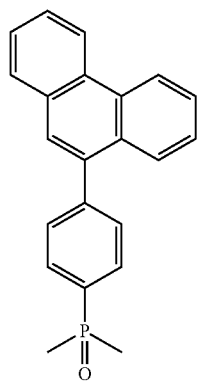
2b
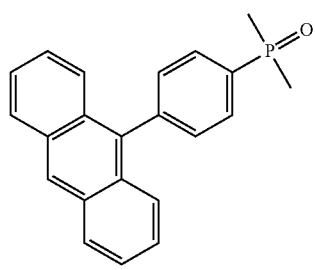
2c
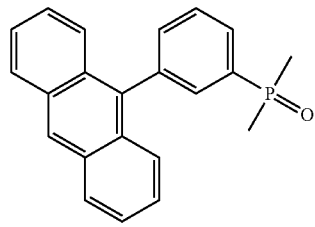
2d
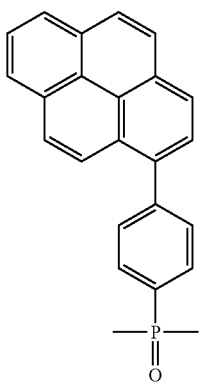

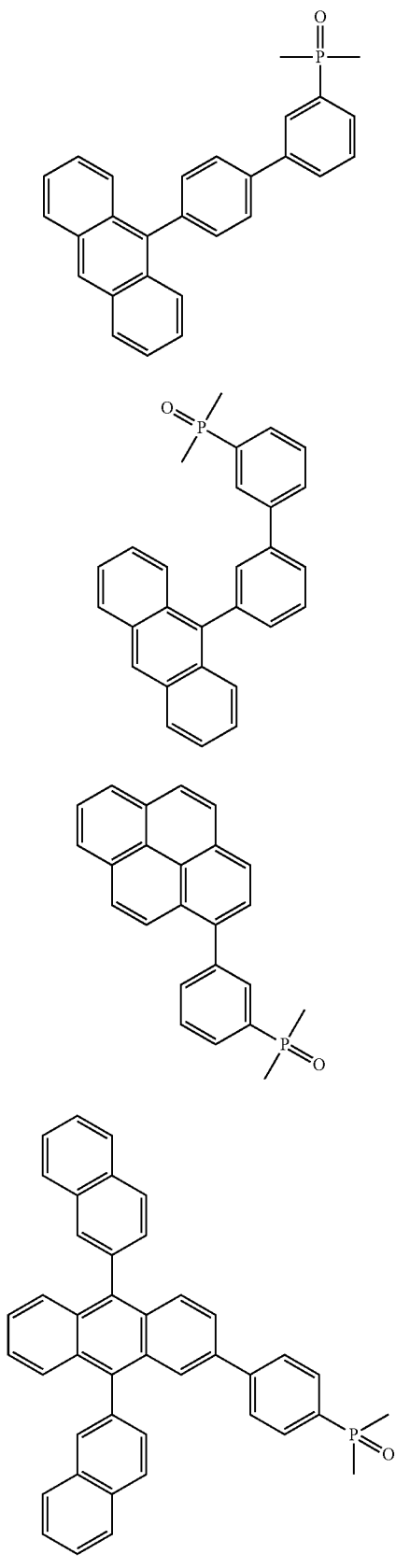
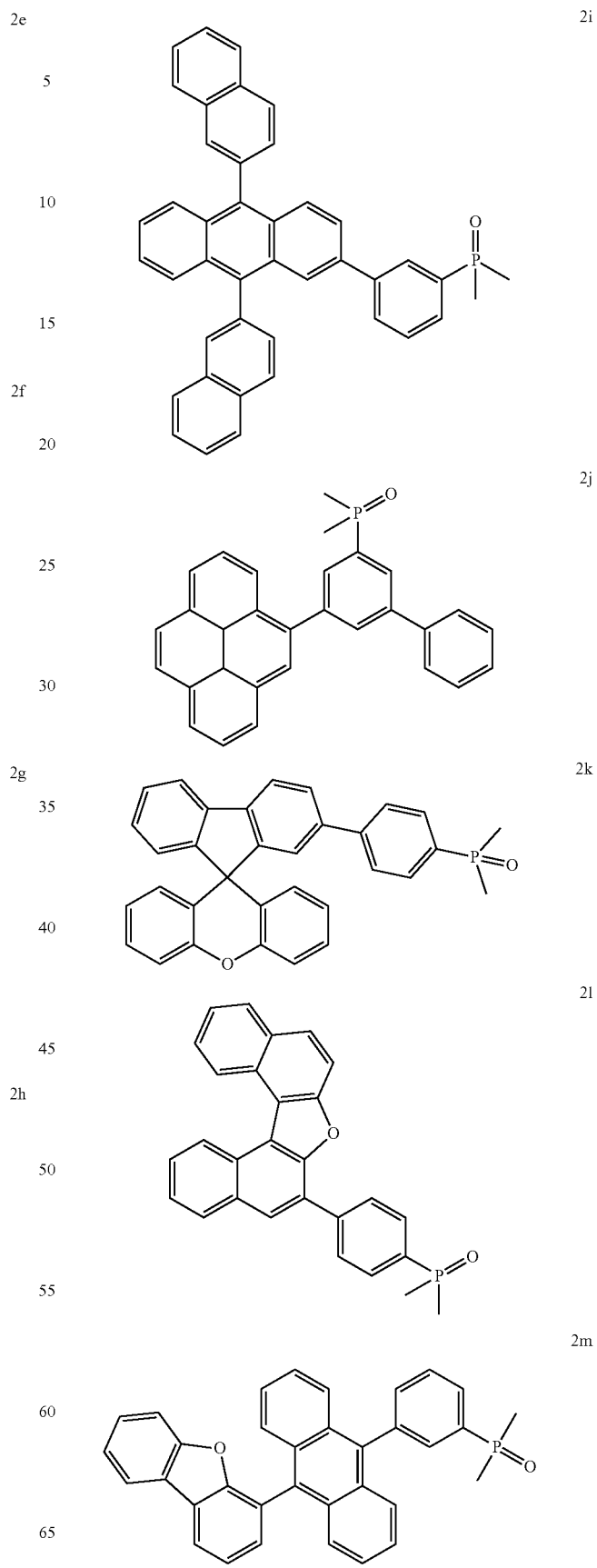

2n
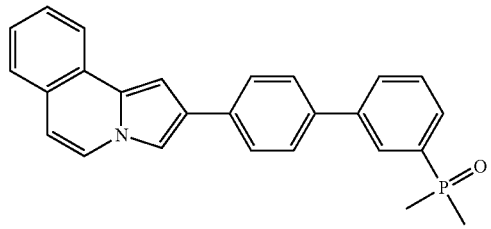
2o
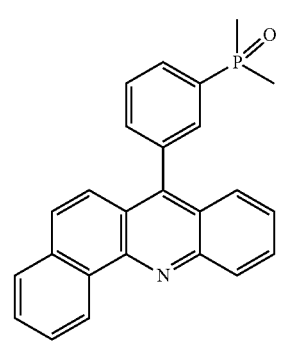
2p
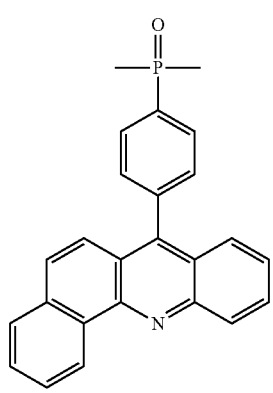
2q
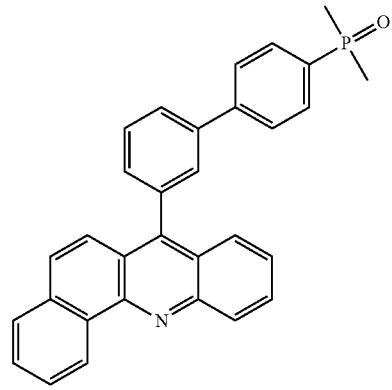
2r
2s
2t
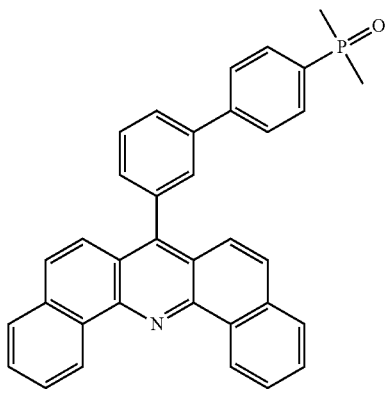

2u 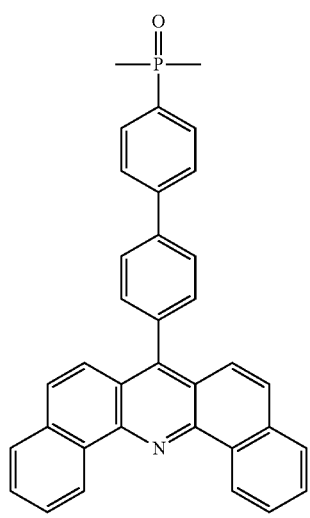
2v 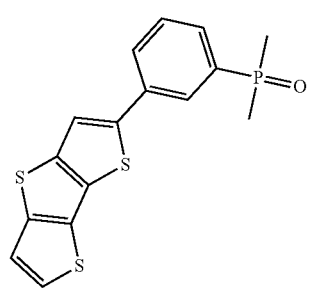
2w 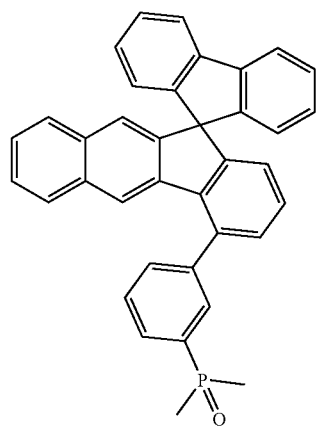
2x 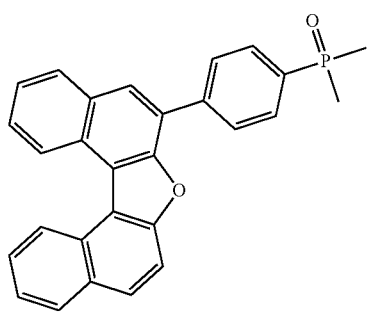
2y 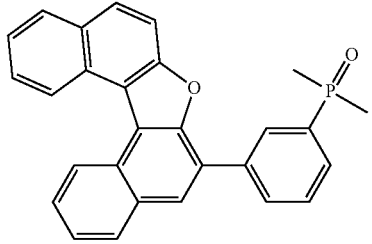
2z 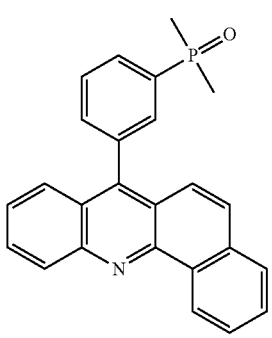
2aa 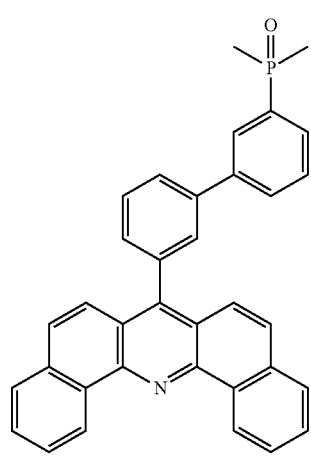
2bb 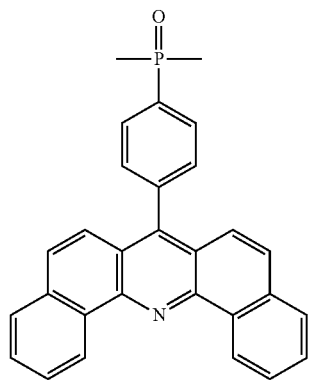

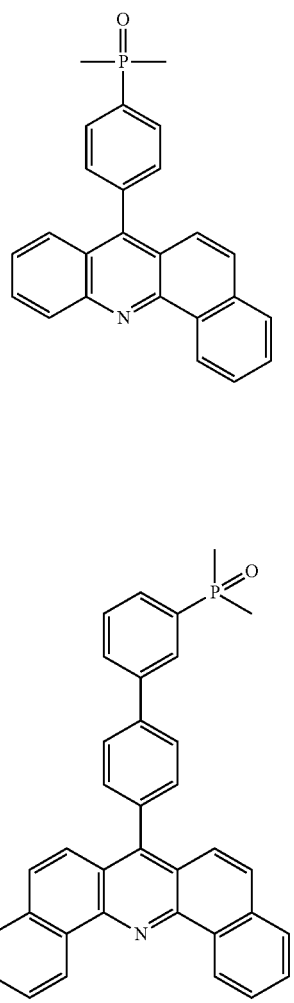
2cc
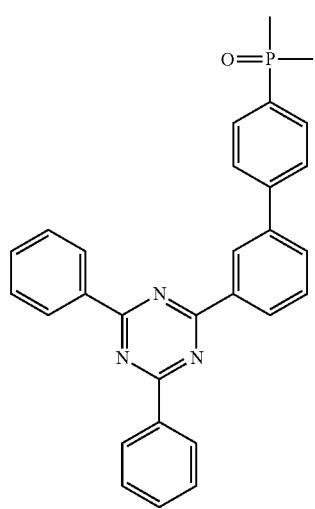
2dd
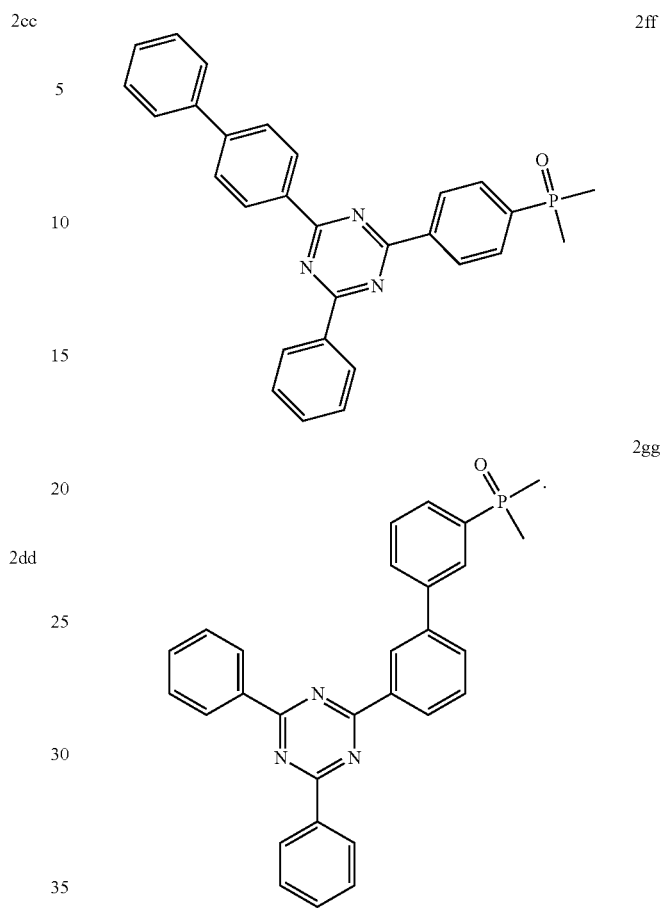
2ff
2gg
In a further embodiment, n is 1 and m is 1 and R³ is $C_1$ to $C_{12}$ alkyl or $C_{10}$ to $C_{20}$ aryl. Preferred compound of formula (1) according to the invention is selected from one of the following compounds 3a to 3pp.
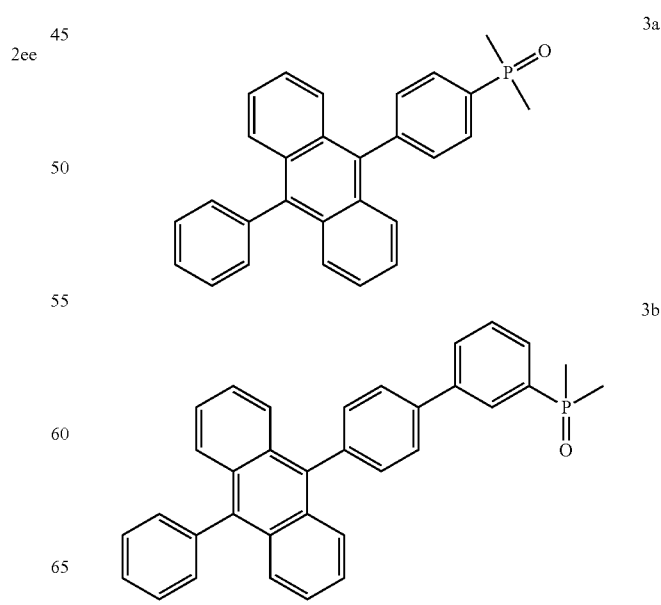
2ee
3a
3b -continued
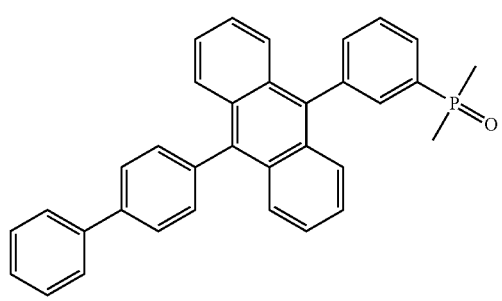
3c
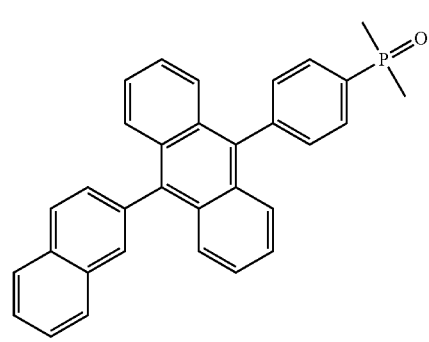
3d
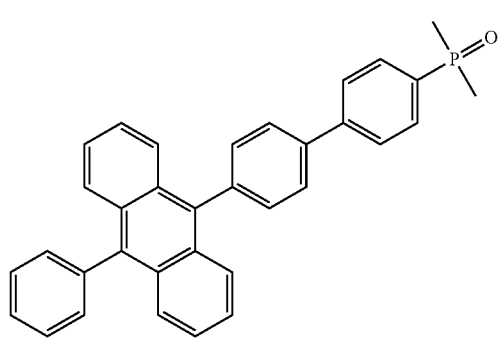
3e
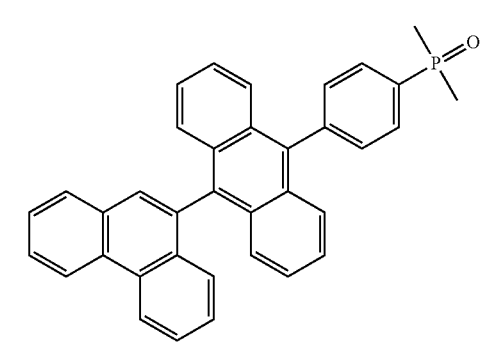
3f
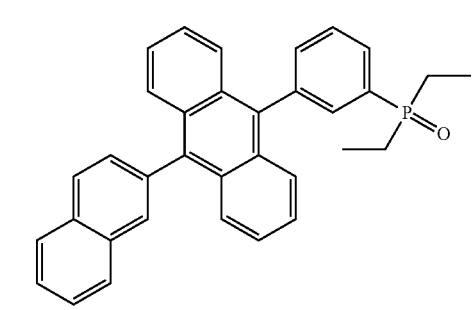
3g
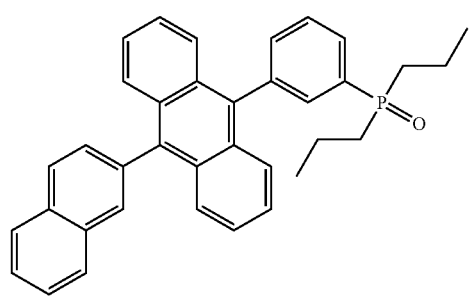
3h
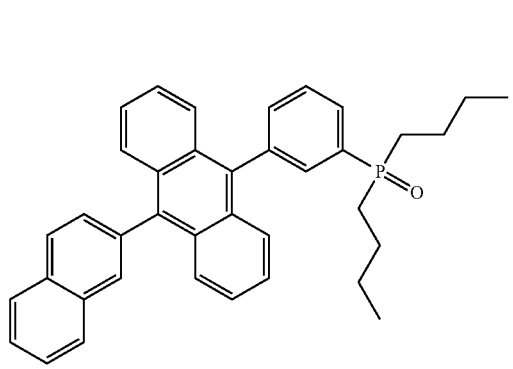
3i
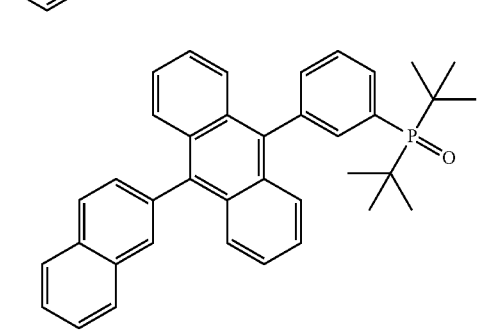
3j
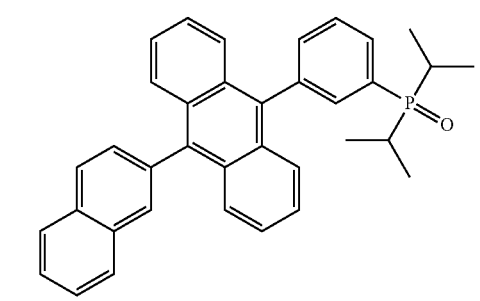
3k
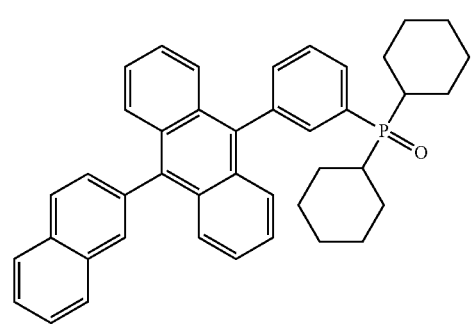
3l -continued
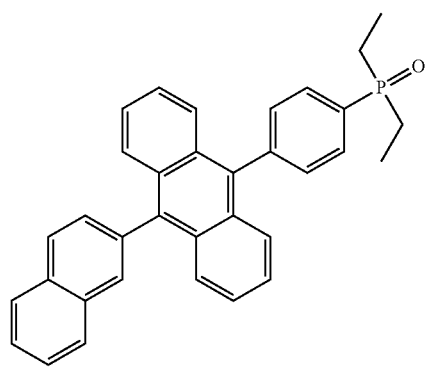
3m
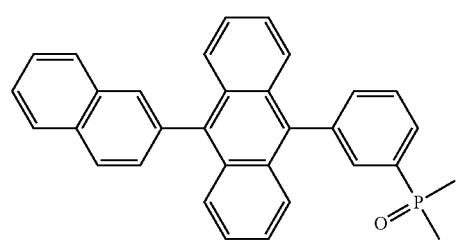
3n
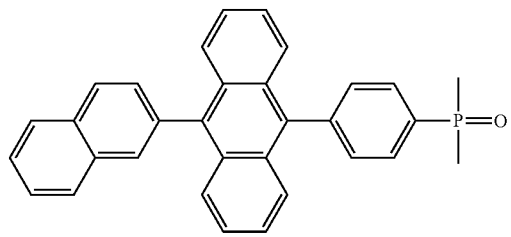
3o
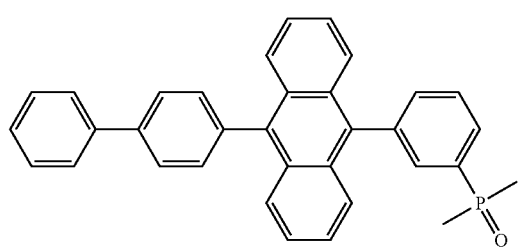
3p
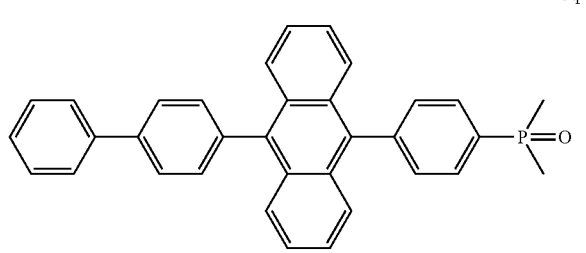
3q
-continued
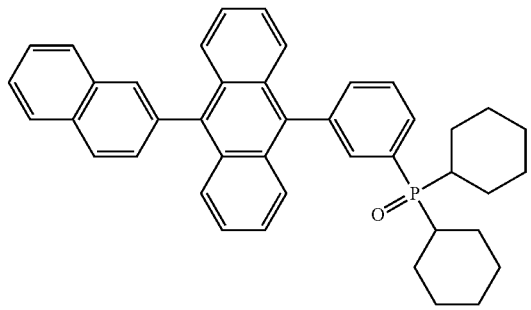
3r
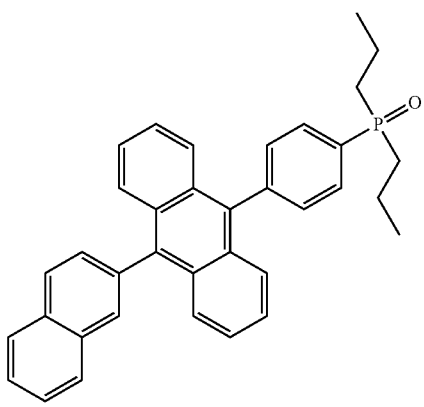
3s
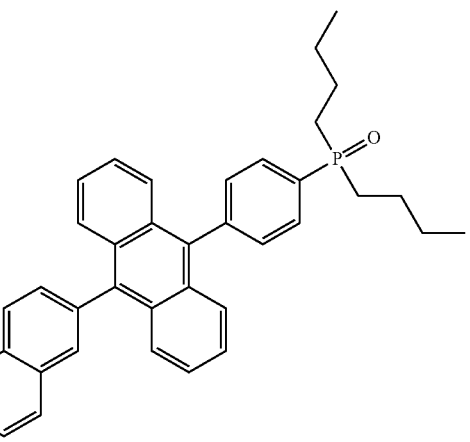
3t
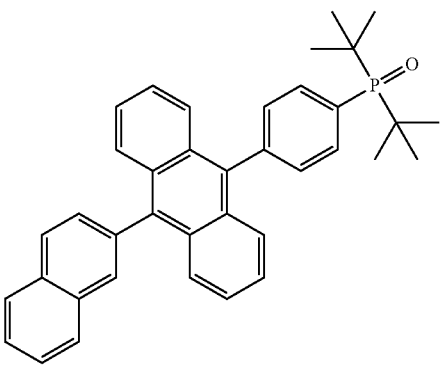
3u 3v 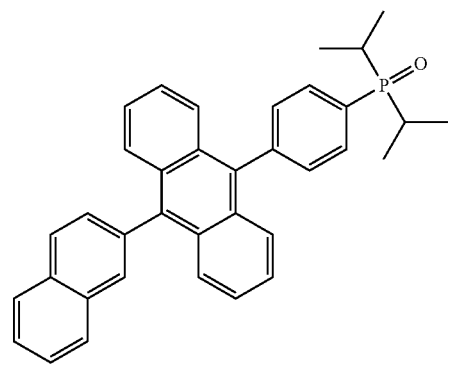
3w 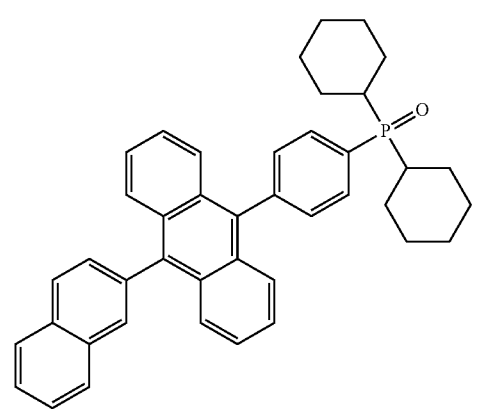
3x 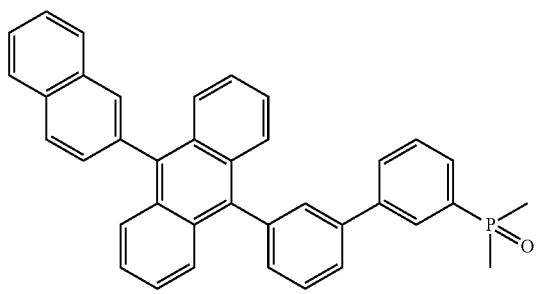
3y 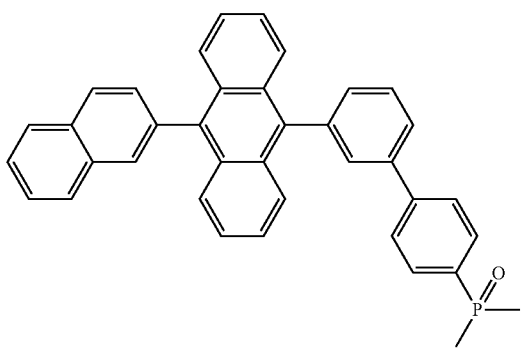
3z 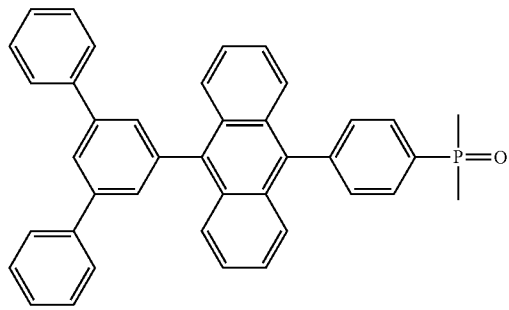
3aa 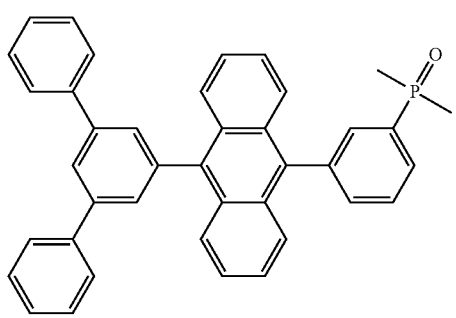
3bb 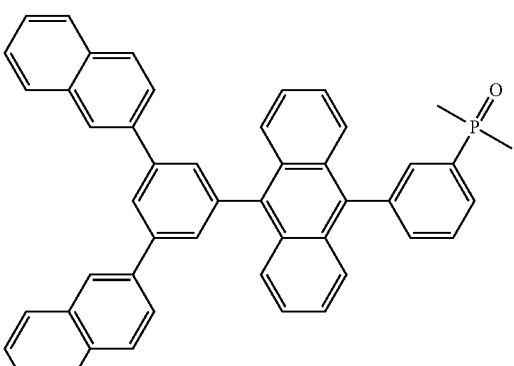
3cc 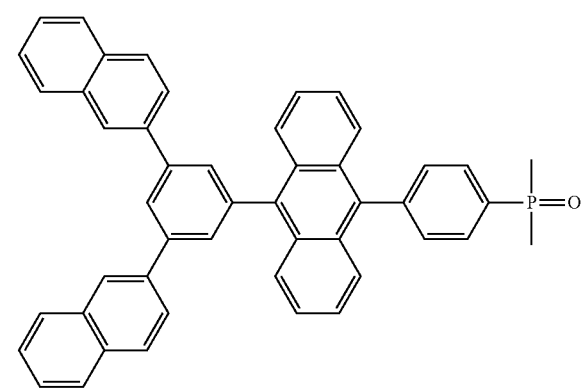

-continued
3dd
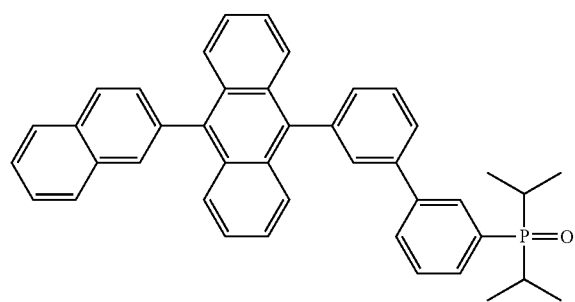
3ee
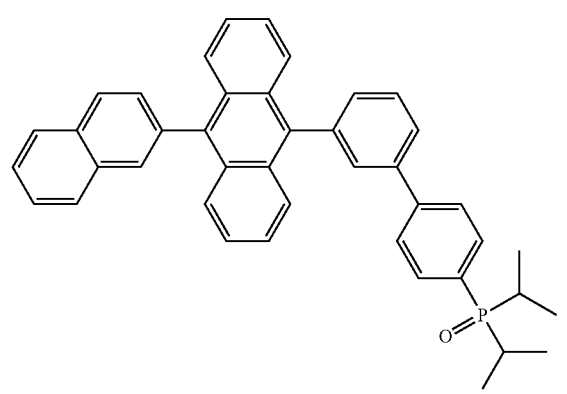
3ff
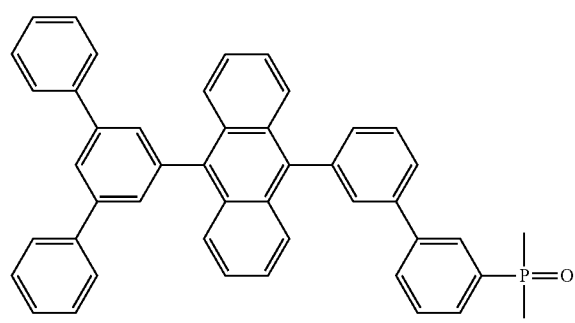
3gg
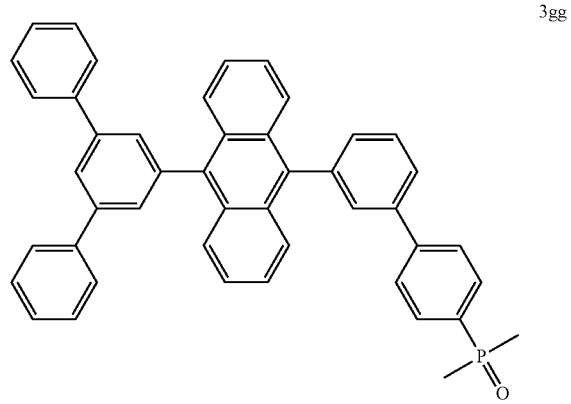
-continued
3hh
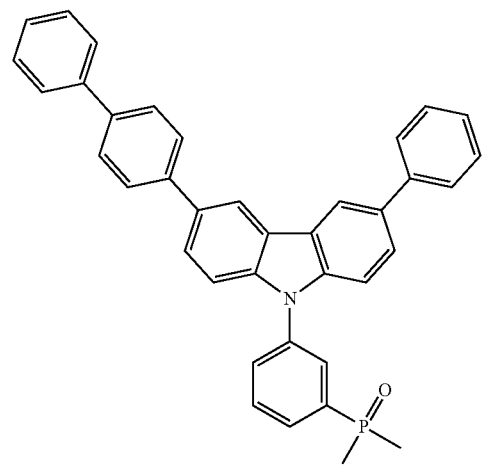
3ii
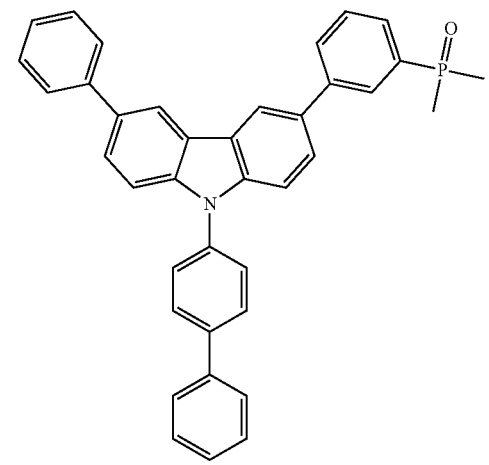
3jj
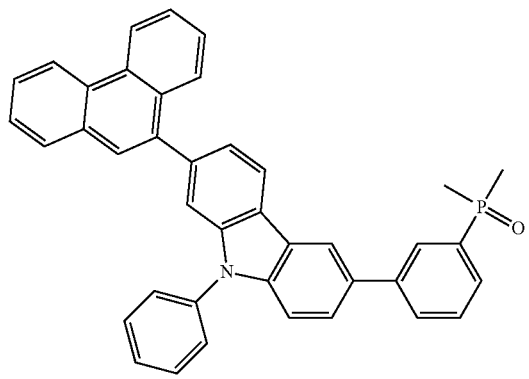

3kk
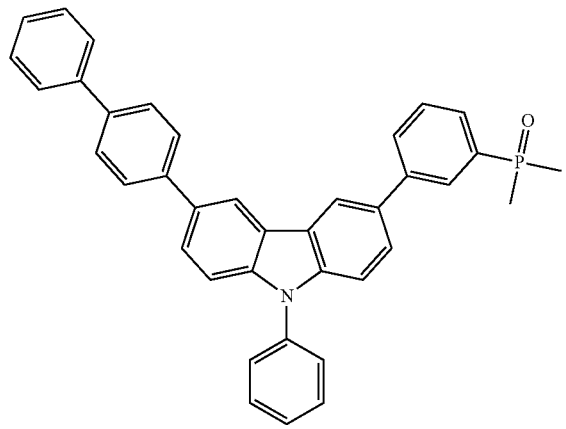
3ll
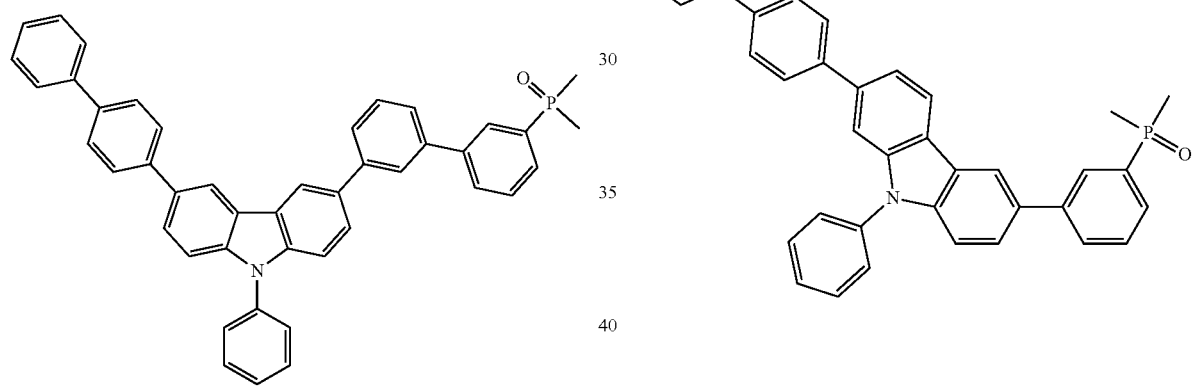
3mm
3nn
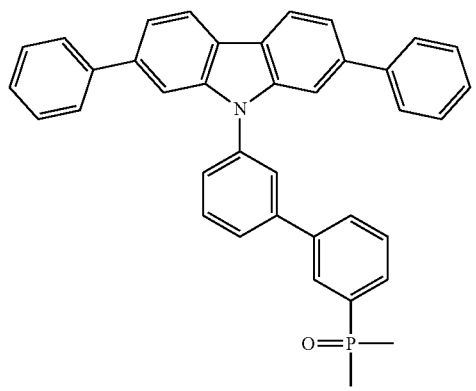
3oo
3pp
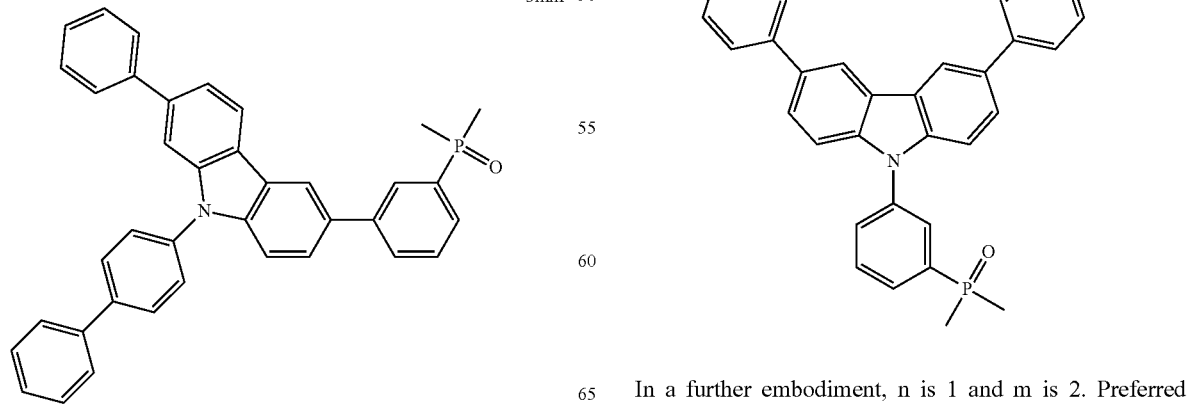
In a further embodiment, n is 1 and m is 2. Preferred compound of formula (1) according to the invention is selected from one of the following compounds 4a to 4f.

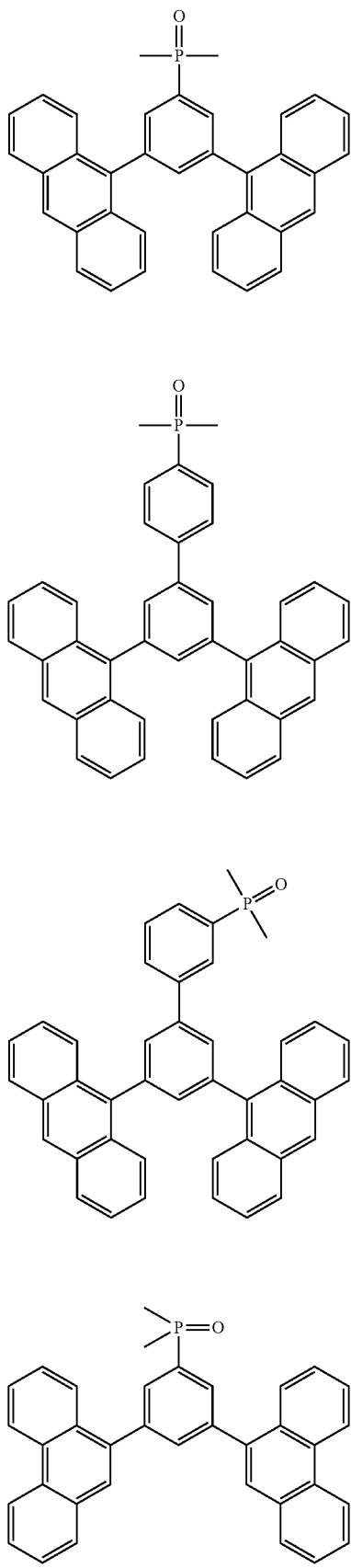
4a
4b
4c
4d
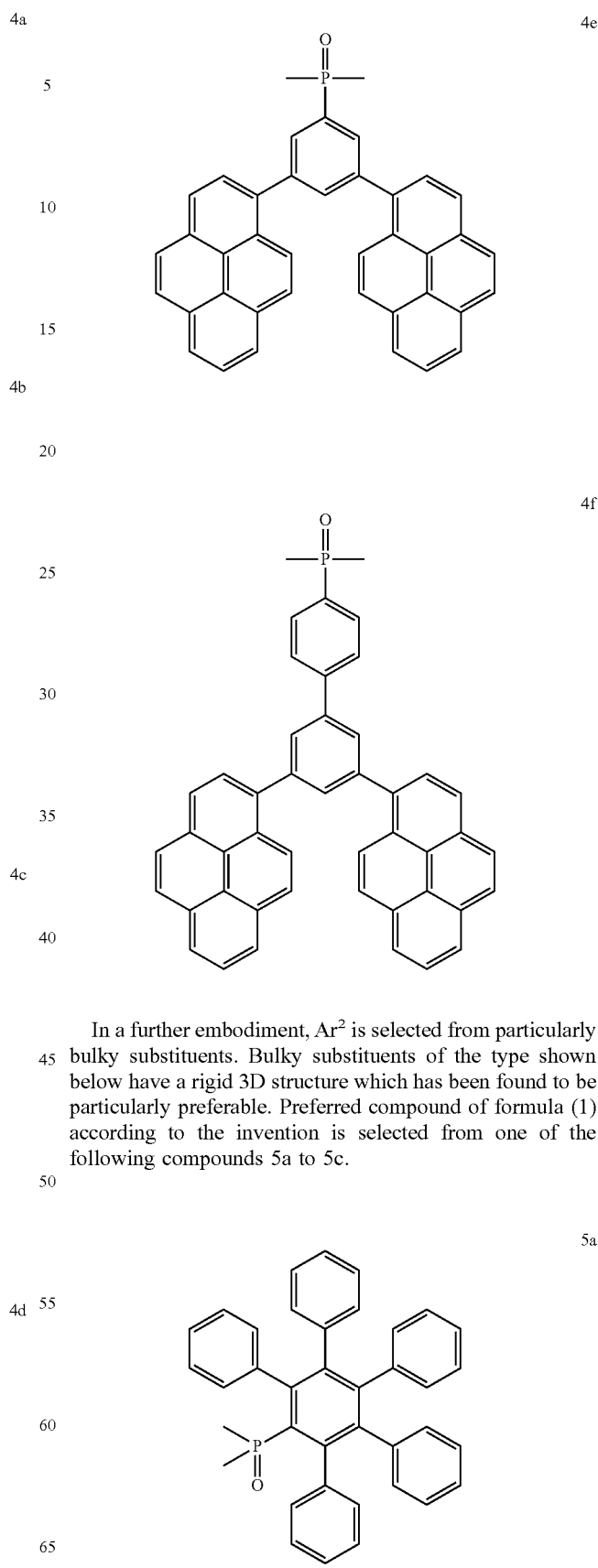
4e
4f
In a further embodiment, Ar² is selected from particularly bulky substituents. Bulky substituents of the type shown below have a rigid 3D structure which has been found to be particularly preferable. Preferred compound of formula (1) according to the invention is selected from one of the following compounds 5a to 5c.
5a -continued

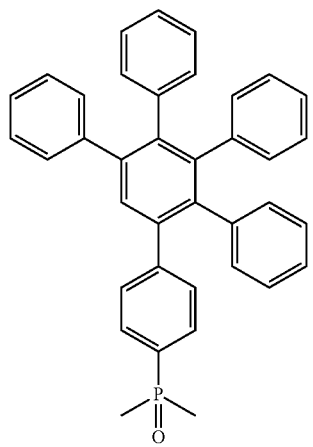
5b

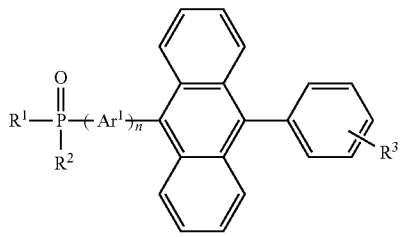
5c

In an another embodiment, the organic semiconductor layer comprises at least one compound of formula (1a)

(1a)

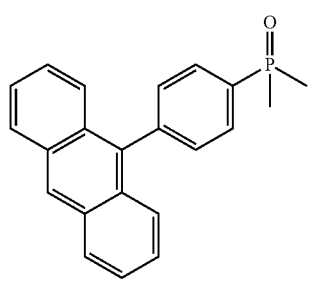 (a)

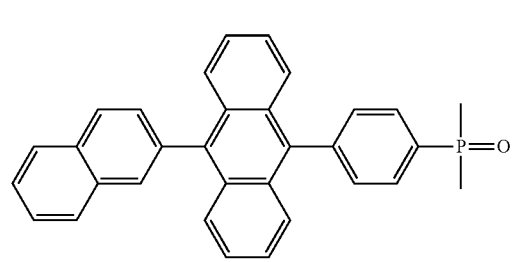 (b)

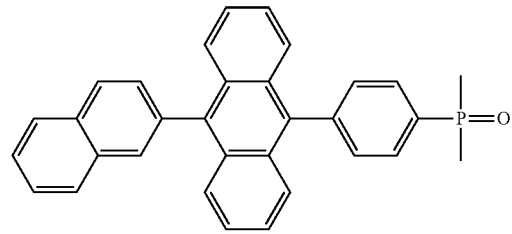 (c)

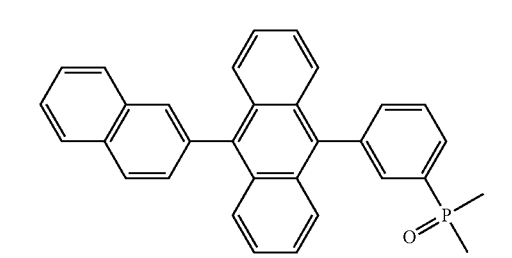 (d)

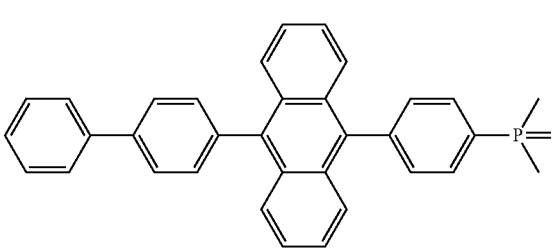 (e)

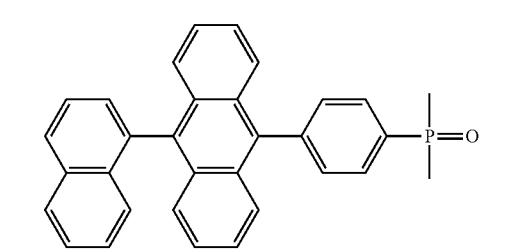 (f)

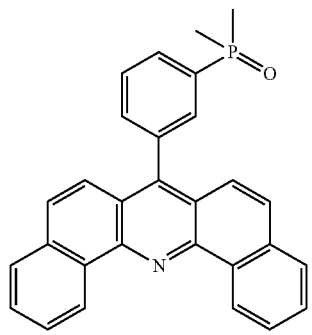

wherein $R^1$ and $R^2$ are each independently selected from $C_1$ to $C_{16}$ alkyl;

$Ar^1$ is selected from $C_6$ to $C_{14}$ arylene or $C_3$ to $C_{12}$ heteroarylene, preferably phenylene or biphenylene;

$R^3$ is independently selected from H, $C_1$ to $C_{12}$ alkyl or $C_{10}$ to $C_{20}$ aryl, preferably $R^3$=H; and n is 1.

Finally, it is preferred that the compound is selected from one of the following compounds a to q.

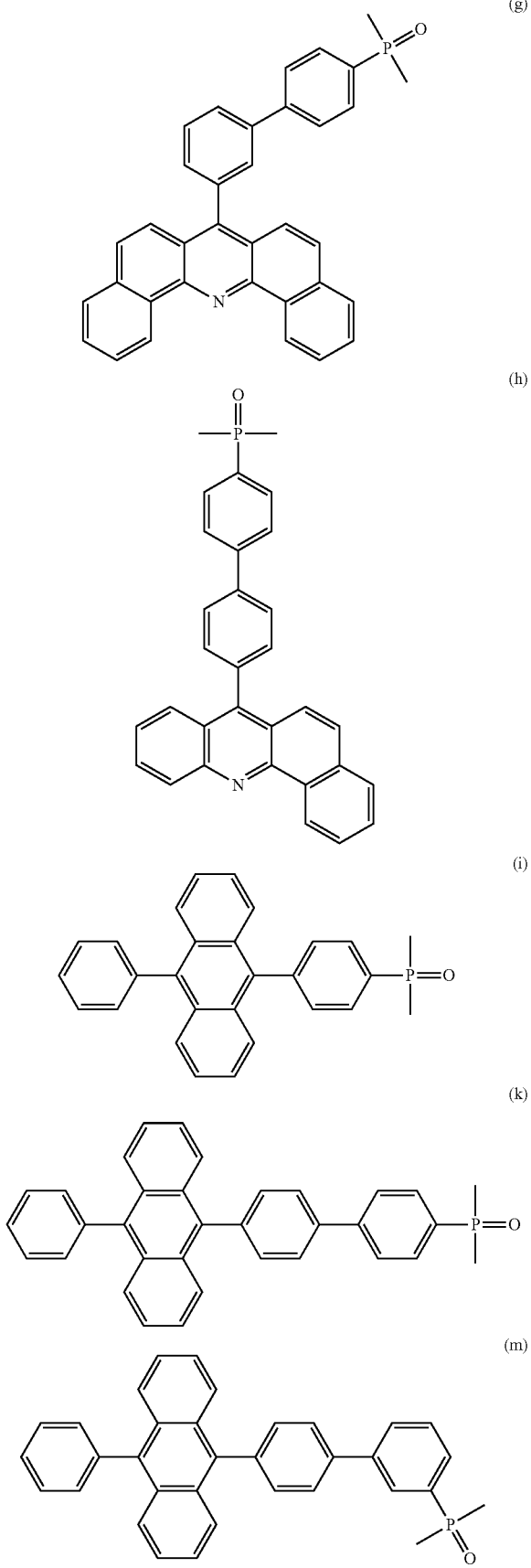
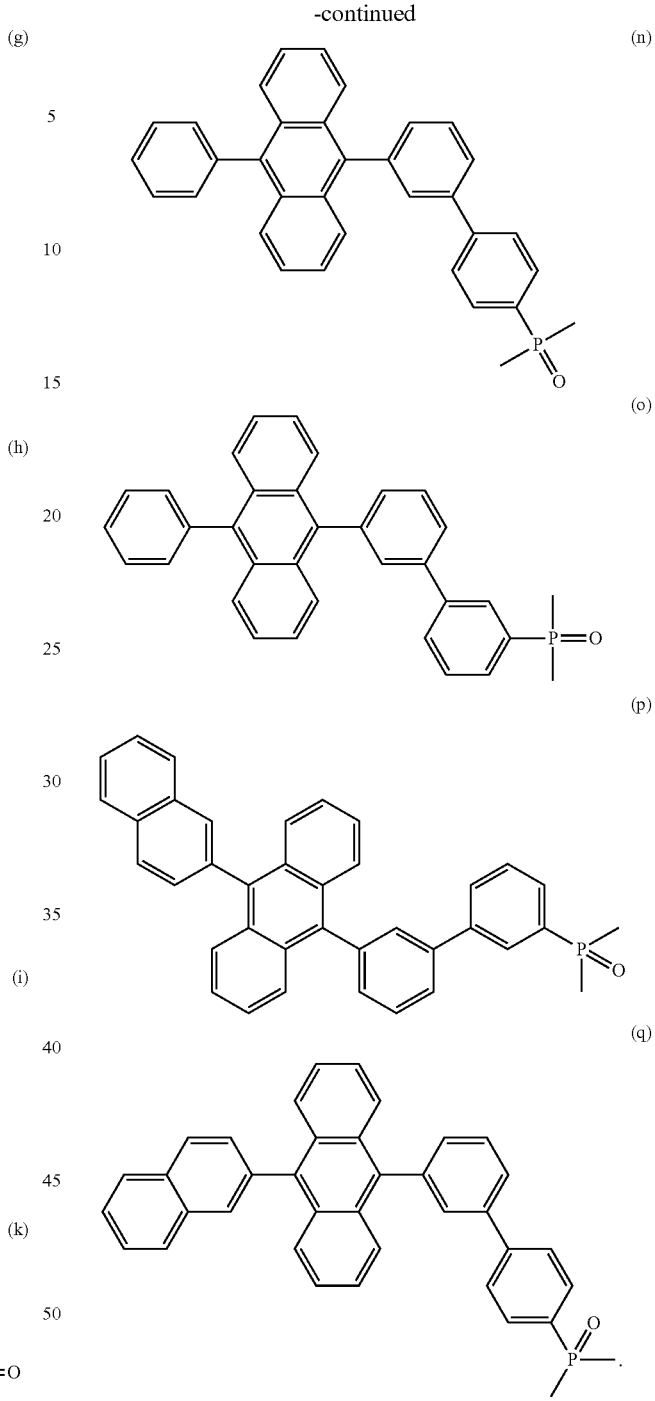

It was surprisingly found by the inventors that improved performance of OLEDs known in the art can be achieved by replacing diaryl phosphine oxide compounds (known in the art) by dialkyl phosphine oxide compounds (in accordance with the invention) in the electron transport/injection layer.

A beneficial effect is noticeable in a layer which is free of dopant, as well as in a doped layer, particularly when doped with lithium organic complex or zero-valent metal.

A variety of dialkyl phosphine oxide compounds has been investigated and observed to show a particular beneficial effect. In detail, the organic semiconductive layer, the device and the compounds disclosed above were suitable to solve the problem underlying the present invention by featuring reduced drive voltage and/or improved external quantum efficiency and/or improved lifetime of OLEDs.

Further particular preferred embodiments of the present invention are related to organic light-emitting diodes (OLED). Preferred embodiments in this regard are as follows.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
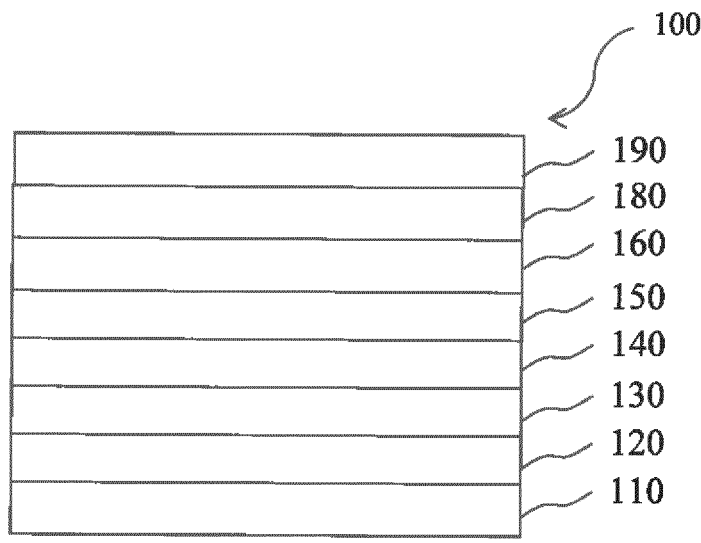
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode (OLED) 100, according to an exemplary embodiment of the present invention. The OLED 100 includes a substrate 110, an anode 120, a hole injection layer (HIL) 130, a hole transport layer (HTL) 140, an emission layer (EML) 150, an electron transport layer (ETL) 160. The electron transport layer (ETL) 160 comprising or consisting of the compound of formula (1) is formed directly on the EML 150. Onto the electron transport layer (ETL) 160 an electron injection layer (EIL) 180 is disposed. The cathode 190 is disposed directly onto the electron injection layer (EIL) 180.

Instead of a single electron transport layer 160, optional an electron transport layer stack (ETL) can be used.

Figure 2:
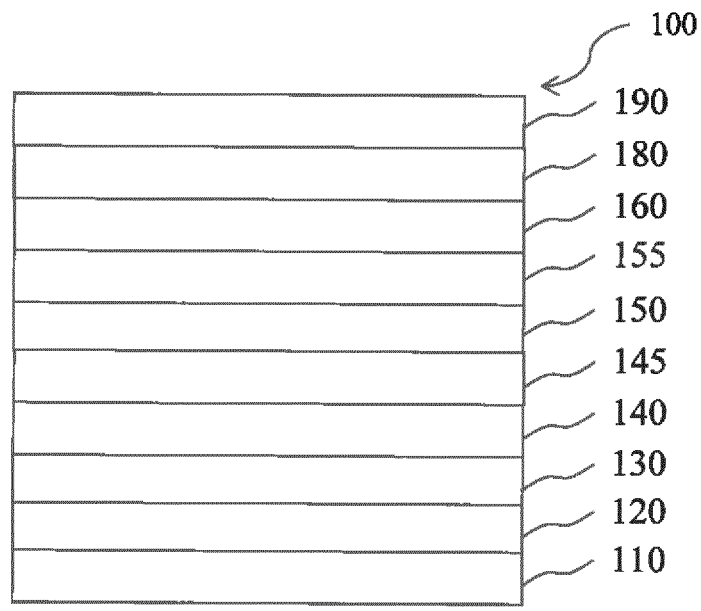
FIG. 2 is a schematic sectional view of an OLED, according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron blocking layer (EBL) 145 and a hole blocking layer (HBL) 155.

Referring to FIG. 2 the OLED 100 includes a substrate 110, an anode 120, a hole injection layer (HIL) 130, a hole transport layer (HTL) 140, an electron blocking layer (EBL) 145, an emission layer (EML) 150, a hole blocking layer (HBL) 155, an electron transport layer (ETL) 160, an electron injection layer (EIL) 180 and a cathode electrode 190. The electron transport layer (ETL) 160 and/or the electron injection layer (EIL) 180 comprise or consist of the compound of formula (1).

In the description above the method of manufacture an OLED 100 of the present invention is started with a substrate 110 onto which an anode 120 is formed, on the anode electrode 120, an hole injection layer 130, hole transport layer 140, optional an electron blocking layer 145, an emission layer 150, optional a hole blocking layer 155, optional at least one electron transport layer 160, optional at least one electron injection layer 180, and a cathode 190 are formed, in that order or the other way around.

Figure 3:
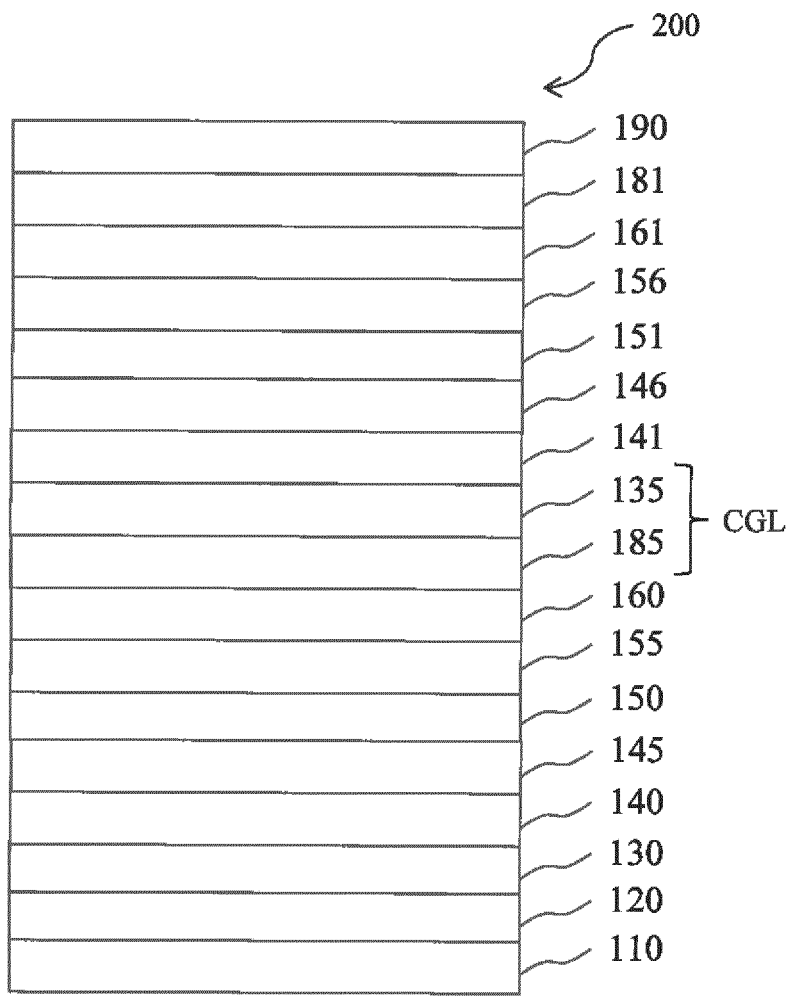
FIG. 3 is a schematic sectional view of a tandem OLED comprising a charge generation layer, according to an exemplary embodiment of the present invention.

FIG. 3 is a schematic sectional view of a tandem OLED 200, according to another exemplary embodiment of the present invention. FIG. 3 differs from FIG. 2 in that the OLED 100 of FIG. 3 further comprises a charge generation layer and a second emission layer.

Referring to FIG. 3 the OLED 200 includes a substrate 110, an anode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type COL) 185 which may comprise compound of formula (1), a p-type charge generation layer (p-type GCL) 135, a second hole transport layer (HTL) 141, a second electron blocking layer (EBL) 146, a second emission layer (EML) 151, a second hole blocking layer (EBL) 156, a second electron transport layer (ETL) 161, a second electron injection layer (EIL) 181 and a cathode 190. The electron transport layers (ETL) 160 and 161 and/or the electron injection layer (ELL) 180 and/or the n-type charge generation layer (n-type CGL) 185 comprise or consist of the compound of formula (1).

In the description above the method of manufacture an OLED 200 of the present invention is started with a substrate 110 onto which an anode 120 is formed, on the anode electrode 120, a first hole injection layer 130, first hole transport layer 140, optional a first electron blocking layer 145, a first emission layer 150, optional a first hole blocking layer 155, optional at least one first electron transport layer 160, an n-type COL 185, a p-type CGL 135, a second hole transport layer 141, optional a second electron blocking layer 146, a second emission layer 151, an optional second hole blocking layer 156, an optional at least one second electron transport layer 161, an optional electron injection layer 181, and a cathode 190 are formed, in that order or the other way around.

While not shown in FIG. 1, FIG. 2 and FIG. 3, a sealing layer may further be formed on the cathode electrodes 190, in order to seal the OLEDs 100 and 200. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

EXAMPLES

Preparation of Compounds of Formula (1)

Dialkyphosphine oxides may be prepared using known procedures (method a: Hays, R. H., *The Journal of Organic Chemistry* 1968 33 (10), 3690-3694; method b: W. Voskuil and J. F. Arens *Org. Synth.* 1968, 48, 47).

Method 1

Synthesis of dialkylphosphine oxide with $R^1=R^2$

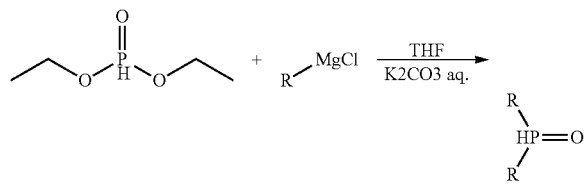

Diethyl phosphonate (0.95 eq) is added to an ice cooled (Grignard solution in THF (3 eq) at such a rate that a temperature of the reaction mixture is maintained at 20-30° C. Ater stirring at room temperature for 1 h the mixture is hydrolyzed by mixing it with an ice-cold saturated aqueous solution of potassium carbonate (3 eq). Precipitated magnesium carbonate is removed by filtration and washed several time with ethanol. Combined filtrates are concentrated in vacuum to give a crude material, which could be further purified by distillation or re-crystallization from an appropriate solvent.

Method 2

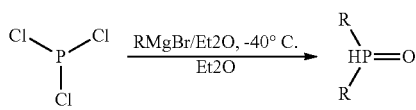

Grignard solution in THF or Et$_2$O (2 eq.) was added dropwise to a solution of phosphorus trichloride (1 eq) in diethyl ether (2 ml/mmol of PCl3) at −40° C. The reaction mixture is stirred for 30 min at −40° and then allowed to reach room temperature over 3 h. Reaction is terminated by addition of water (~3 eq). A solvent is evaporated at reduced pressure, an oily residue with some solid is diluted with dichloromethane, filtered, the solution is evaporated to dryness yielding an clear oil. This oily residue is then dissolved in a boiling heptane/ethyl acetate mixture (1:10), the solution allowed to cool down to the room temperature, two liquid phases are formed upon cooling. The upper (heptane) phase is discharged; the lower phase is concentrated in vacuum yielding a crude product. Additional purification could be achieved by re-crystallization or by vacuum distillation.

Starting materials and products

| Starting compound | Method | Product | Yield/MS data |
|---|---|---|---|
| Methylmagnesium chloride | 1 | Dimethylphosphine oxide | 70.8%/78 [M]+ |
| Ethylmagnesium bromide | 1 | Diethyphosphine oxide | */106 [M+] |
| Isopropylmagnesium bromide | 2 | Diisopropylphosphine oxide | */134 [M+] |
| Tert-butylmagnesium bromide | 2 | Di-tert-butylphosphine oxide | */162 [M+] |
| Butylmagnesium bromide | 1 | Dibutylphosphine oxide | |
| Cyclohexylmagnesium bromide | 2 | Dicyclohexylphosphine oxide | 100%/214 [M]+ |

Typical Procedure for Coupling of Dialkylphosphine Oxide with Arylhalides

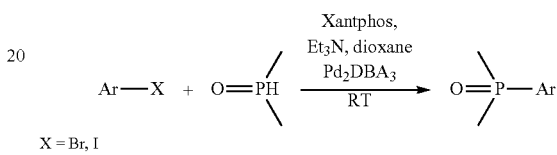

X = Br, I

Schlenck flask is charged with arylhalide (1 eq), dialkylphosphine oxide (1 eq.) and sealed with a rubber septum. Atmosphere is replaced by Argon and the starting compounds are dissolved in anhydrous dioxane or suspended in dioxane-THF mixture (1:1 vol.) In a separate vial, a mixture of tris(dibenzylideneacetone)dipalladium (0.005 eq), Xantphos (0.01 eq) and triethylamine (1.17 eq.) is dissolved in anhydrous dioxane (75 ml/mmol) at 24° C. for 10 min. This catalyst solution is added to the mixture of phosphine oxide and aryl halide and the reaction mixture was stirred for 12-24 h at 24° C.

Work Up Procedure 1:

A precipitated solid (trimethylamine salt) is separated by filtration through sintered glass filter (Pore size 4), washed two times with dioxane, combined filtrates are evaporated to a dryness under reduced pressure using a rotary evaporator. The residue is dissolved in water, pH is set to alkaline (~14) using aqueous potassium hydroxide solution. Resulting yellow turbid aqueous layer is sequentially extracted with hexane and diethyl ether. Combined organic layers are extracted with ~0.5M aqueous KOH solution, aqueous phases are combined, acidified by hydrochloric acid and extracted with dichloromethane. Combined extracts are washed with saturated sodium hydrocarbonate solution, brine and dried over magnesium sulfate. Solvent is removed under reduced pressure, residue is triturated with hexane, white crystalline precipitate is collected by vacuum filtration, washed with hexane and dried.

Work Up Procedure 2:

Reaction mixture is diluted with water, precipitated material is collected by suction using a sintered glass filter (pore 4), washed with water, methanol and dried. Crude product could be further purified by re-crystallization from appropriate solvent. Final purification is achieved by sublimation in a high vacuum.

Starting materials and products

| Starting compound(s) | Product/(work-up procedure) | Yield/MS data |
|---|---|---|
| 1-bromo-4-iodobenzene, dimethylphosphine oxide | (4-bromophenyl)dimethylphosphine oxide/(a-1) | 75%/232 [M]+ |

-continued

| Starting compound(s) | Product/(work-up procedure) | Yield/MS data |
| --- | --- | --- |
| 1-bromo-3-iodobenzene, dimethylphosphine oxide | (3-bromophenyl)dimethylphosphine oxide/(a-1) | 70.8%/232 [M]+ |
| 1-bromo-4-iodobenzene, diethylphosphine oxide | (4-bromophenyl)diethylphosphine oxide/(a-1) | 88.6%/262 [M]+ |
| Diisopropylphosphine oxide, 1-bromo-4-iodobenzene | (4-bromophenyl)diisopropylphosphine oxide/(a-1) | 73.21%/288[M]+ |
| Diisopropylphosphine oxide, 1-bromo-3-iodobenzene | (3-bromophenyl)diisopropylphosphine oxide/(a-1) | 66.37%/288[M]+ |
| Chlorodiisopropylphosphine, 1-bromo-3-iodobenzene | (3-bromophenyl)diisopropylphosphine oxide/(b) | 66.2%/288[M]+ |
| Chlorodiisopropylphosphine, 1-bromo-4-iodobenzene | (4-bromophenyl)diisopropylphosphine oxide/(b) | 61.6%/288[M]+ |
| Di-tert-butylphosphine oxide, 1-bromo-4-iodobenzene, | (4-bromophenyl)di-tert-butylphosphine oxide/(b) | — |
| Di-tert-butylphosphine oxide, 1-bromo-3-iodobenzene | (3-bromophenyl)di-tert-butylphosphine oxide/(b) | — |
| Dibutylphosphine oxide, 1-bromo-4-iodobenzene | (4-bromophenyl)dibutylphosphine oxide/(a-1) | — |
| Dibutylphosphine oxide, 1-bromo-3-iodobenzene | (3-bromophenyl)dibutylphosphine oxide/(a-1) | — |
| Dicyclohexylphosphine oxide, 1-bromo-4-iodobenzene, | (4-bromophenyl)dicyclohexylphosphine oxide/(a-1) | — |
| Dicyclohexylphosphine oxide, 1-bromo-3-iodobenzene | (3-bromophenyl)dicyclohexylphosphine oxide | 59.42%/368[M]+ |

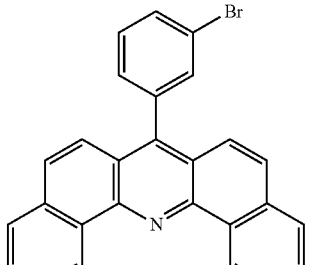

dimethylphosphine oxide

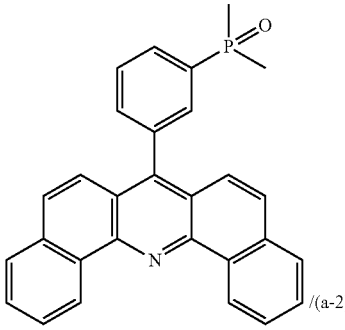

/(a-2)

76.5%/432[M + H]+, 885 [M + Na]+

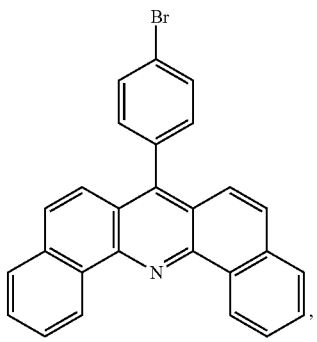

dimethylphosphine oxide

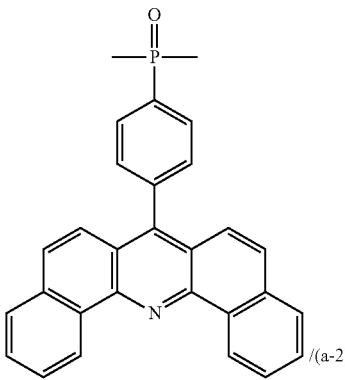

/(a-2)

55.36%/432[M + H]+, 454[M + Na]+, 885[2M + Na]+

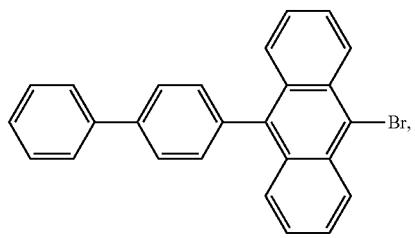

dimethylphosphine oxide

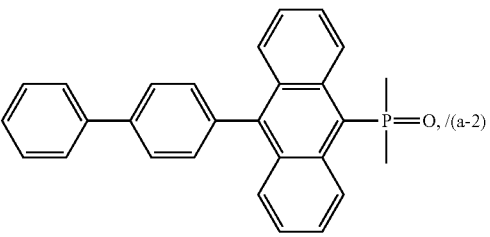

/(a-2)

41.6%/406[M]+

Starting materials and products

| Starting compound(s) | Product/(work-up procedure) | Yield/MS data |
|---|---|---|
| 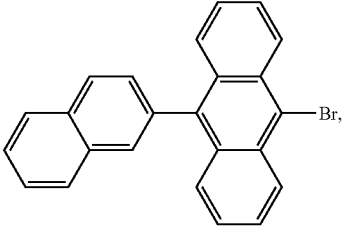 dimethylphosphine oxide | 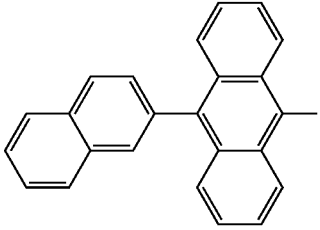 /(a-2) | 66%/381[M] + 403[M + Na]⁺ |

Procedures for Suzuki-Miyaura Coupling

Method a.

A three neck round bottom flask, equipped with dropping funnel, reflux condenser and magnetic stir bar is charged with boronic ester (1 eq) and bromophenyldialkylphosphine oxide (1.5 eq), the flask is sealed with a rubber septum, evacuated and back-filled with argon (2 times). Anhydrous THF (10 ml/mmol of boronic ester) is added through the septum using a double-tipped needle. Separately, a catalyst is prepared by suspending of bis(dibenzylidenaceton)palladium (0.02 eq) and tri-tert-butylphosphane (0.04 eq) in a small amount of anhydrous THF under Argon. The catalyst suspension is added to the reaction mixture through the septum with a syringe. Deoxygenated aqueous solution of tetrabutylammonium hydroxide (~20% wt., 2 eq) is added dropwise to the reaction mixture at room temperature (addition time ~30 min). Reaction mixture is stirred at room temperature for 2 h, precipitated product is separated by filtration, washed with water, methanol, and hexane, dried in vacuum at 40° C. for 48 h. Crude product is then triturated with hot dichloromethane/hexane mixture (1:1 vol, ~300 ml), hot filtered and dried in vacuum at 50° C. for 1 h and at 120° for 1 h. Final purification is achieved by sublimation in a high vacuum.

Method b.

Potassium carbonate (51.4 mmol, 3 eq.) is dissolved in ~25 ml of deionized water, the solution is degassed with $N_2$ for 30 min. Glyme (175 ml) is degassed in a 500 mL 3-necked round bottom flask with $N_2$ for 30 min. The flask is then charged with boronic ester (17.14 mmol, 1 eq.), bromophenyldialkylphosphine oxide (17.99 mmol, 1.05 eq.) and tetrakis(triphenylphosphin)palladium(0) (0.51 mmol, 0.03 eq.) under a positive nitrogen pressure. The degassed potassium carbonate solution is added using a syringe, nitrogen purged reflux condenser is attached to the flask and a reaction mixture heated to 90° C. with stirring for 12 h. The mixture is allowed to cool down to the room temperature, a precipitate is collected by filtration, washed with water, methanol, dried in vacuum at 40° C. to give a crude product, which could be further purified by re-crystallization or trituration with appropriate solvents. Final purification is achieved by sublimation in a high vacuum.

Method c.

Potassium carbonate (20 mmol, 2 eq.) is dissolved in ~10 ml of deionized water, the solution is degassed with $N_2$ for 30 min. Dioxane (40 ml) is degassed in a 100 mL 3-necked round bottom flask with $N_2$ for 30 rein. The flask is then charged with corresponding arylboronic acid, arylbromide or arylchloride (10 mmol, 1 eq.), dialkylphosphine oxide derivative (22 mmol, 1.1 eq.) and tetrakis(triphenylphosphin)palladium(0) (0.2 mmol, 0.02 eq.) under a positive nitrogen pressure. The degassed potassium carbonate solution is added using a syringe, nitrogen purged reflux condenser is attached to the flask and a reaction mixture heated to 90° C. with stirring for 12 h. The mixture is allowed to cool down to the room temperature, a precipitate is collected by filtration, washed with water, methanol, dried in vacuum at 40° C. to give a crude product, which could be further purified by re-crystallization or trituration with appropriate solvents. Final purification is achieved by sublimation in a high vacuum.

Method d.

Potassium carbonate (40 mmol, 2 eq.) is dissolved in ~20 ml of deionized water, the solution is degassed with $N_2$ for 30 min. A mixture of toluene and ethanol (15:6 vol., 112 ml) is degassed in a 500 mL 3-necked round bottom flask with $N_2$ for 30 min. The flask is then charged with trifluoromethanesulfonate (20 mmol, 1 eq.), boronic acid pinacol ester (22 mmol, 1.1 eq.) and [1,1'-Bis(diphenylphosphino)ferrocene]dichloropalladium(II) (0.40 mmol, 0.02 eq.) under a positive nitrogen pressure. The degassed potassium carbonate solution is added using a syringe, nitrogen purged reflux condenser is attached to the flask and a reaction mixture heated to 90° C. with stirring for 12 h. The mixture is allowed to cool down to the room temperature, a precipitate is collected by filtration, washed with water, methanol, dried in vacuum at 40° C. to give a crude product, which could be further purified by re-crystallization or trituration with appropriate solvents. Final purification is achieved by sublimation in a high vacuum.

| Starting materials and products | | |
|---|---|---|
| Startng compound(s),/ coupling method | Product | Yield/ MS data |
| 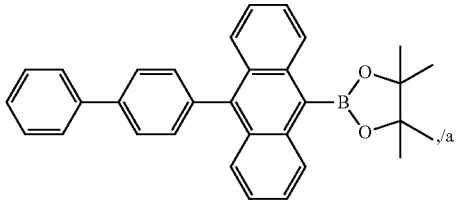 | 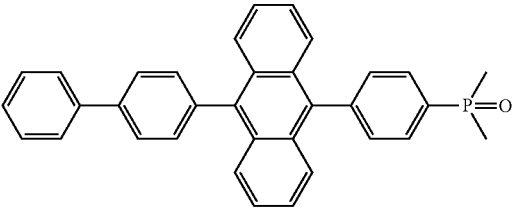 [SMILES: CP(C)(=O)c1ccc(-c2c3ccccc3c(-c3ccc(-c4ccccc4)cc3)c3ccccc23)cc1] | 89.6%/ 483[M + H]⁺ |
| 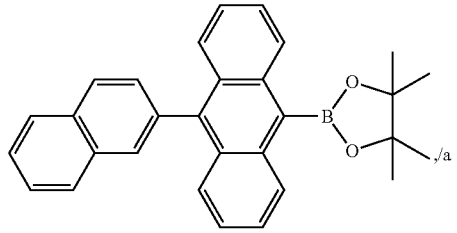 | 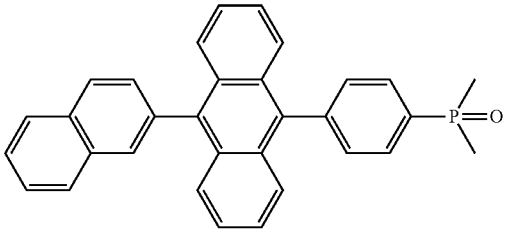 [SMILES: CP(C)(=O)c1ccc(-c2c3ccccc3c(-c3ccc4ccccc4c3)c3ccccc23)cc1] | 20.7%/ 457[M + H]⁺ |
| 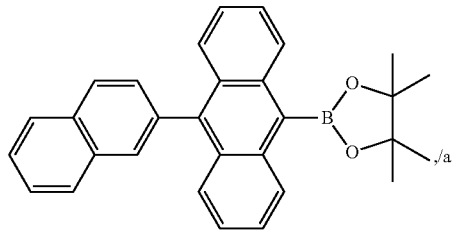 | 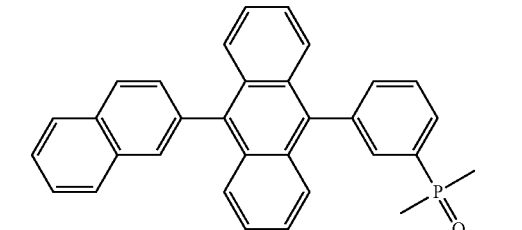 | 71.3%/ 457[M + H]⁺ |
| 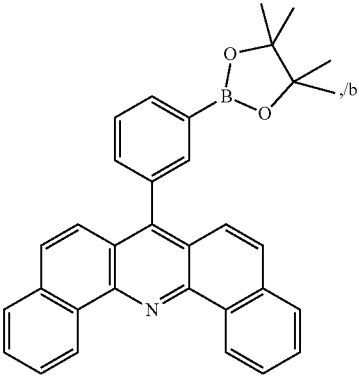 [SMILES: CC1(C)OB(c2cccc(-c3c4ccc5ccccc5c4nc4c3ccc3ccccc34)c2)OC1(C)C] | 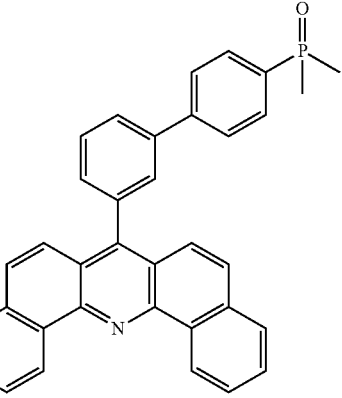 | 508[M]⁺ |
| 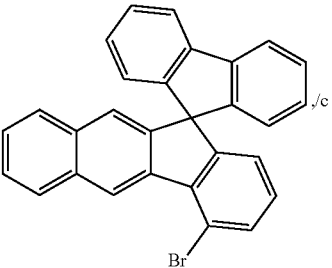 [SMILES: Brc1cccc2c1-c1cc3ccccc3cc1C21c2ccccc2-c2ccccc21] | 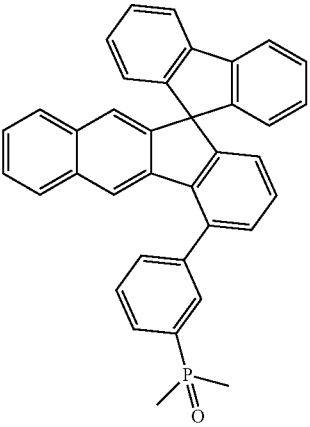 [SMILES: CP(C)(=O)c1cccc(-c2cccc3c2-c2cc4ccccc4cc2C32c3ccccc3-c3ccccc32)c1] | 51.1%/ 541[M + Na]⁺ |

-continued
| Starting compound(s),/ coupling method | Product | Yield/ MS data |
|---|---|---|
| 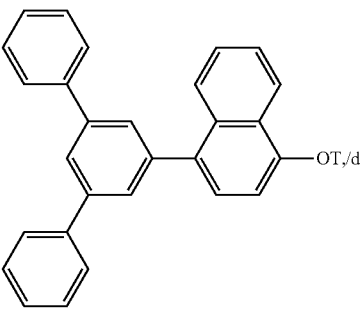 | 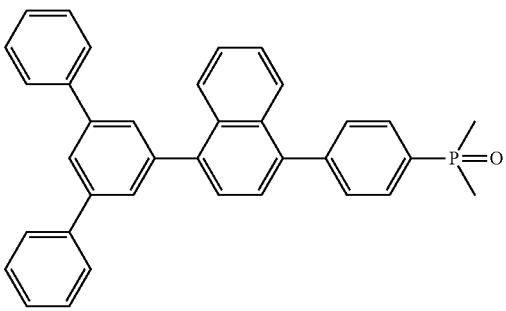 [SMILES: CP(C)(=O)c1ccc(-c2ccc(-c3cc(-c4ccccc4)cc(-c4ccccc4)c3)c3ccccc23)cc1] | 32.9%/ 509[M + H]+ |
| 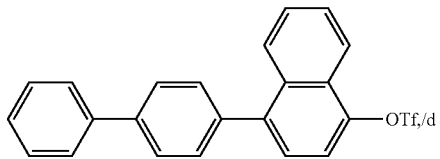 | 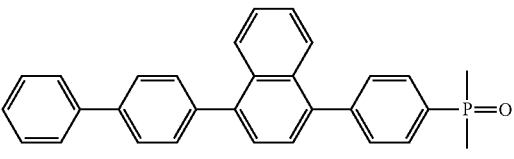 | 54.9%/ 433[M + H]+ |
| 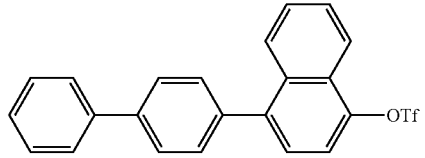 [SMILES: O=S(=O)(Oc1ccc(-c2ccc(-c3ccccc3)cc2)c2ccccc12)C(F)(F)F] | 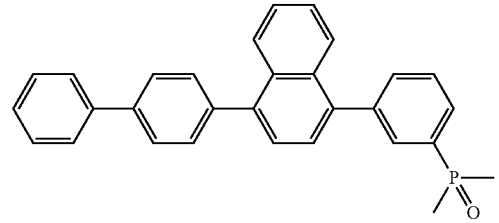 [SMILES: CP(C)(=O)c1cccc(-c2ccc(-c3ccc(-c4ccccc4)cc3)c3ccccc23)c1] | 37.7%/ 433[M + H]+ |
| 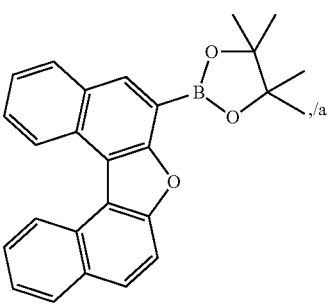 | 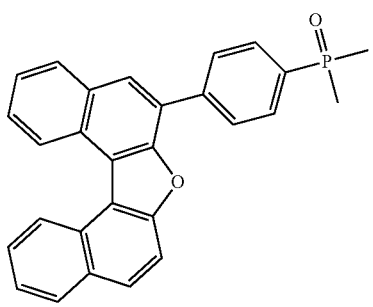 [SMILES: CP(C)(=O)c1ccc(-c2cc3ccccc3c3c2oc2ccc4ccccc4c23)cc1] | 51.4%/ 421[M + H]+ |
| 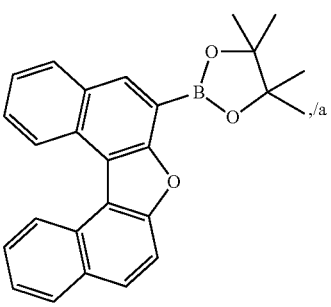 [SMILES: CC1(C)OB(c2cc3ccccc3c3c2oc2ccc4ccccc4c23)OC1(C)C] | 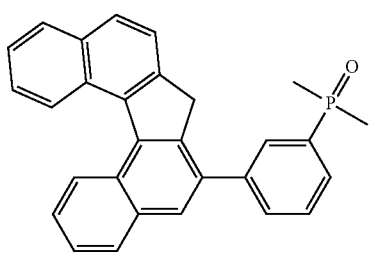 [SMILES: CP(C)(=O)c1cccc(-c2cc3ccccc3c3c2Cc2ccc4ccccc4c2-3)c1] | 57.3%/ 443[M + Na]+ |

-continued
| Starting compound(s)/coupling method | Product | Yield/MS data |
|---|---|---|
| 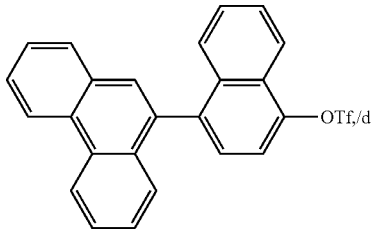 | 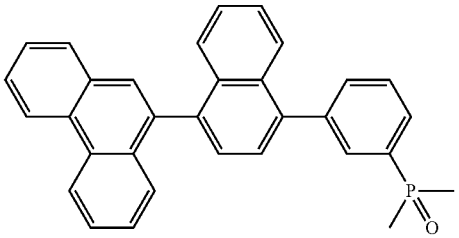 [SMILES: CP(C)(=O)c1cccc(-c2ccc(-c3cc4ccccc4c4ccccc34)c3ccccc23)c1] | 61.8%/479[M + Na]⁺ |
| 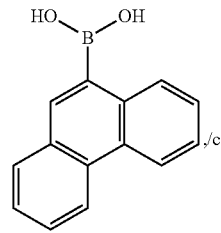 [SMILES: OB(O)c1cc2ccccc2c2ccccc12] | 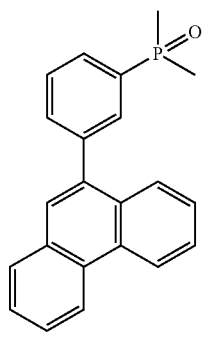 [SMILES: CP(C)(=O)c1cccc(-c2cc3ccccc3c3ccccc23)c1] | 97.5%/331[M + H]⁺ |
| 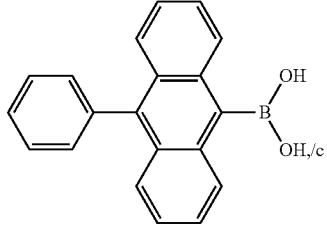 | 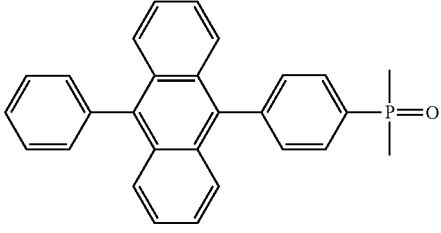 [SMILES: CP(C)(=O)c1ccc(-c2c3ccccc3c(-c3ccccc3)c3ccccc23)cc1] | 62.35%/407[M + H]⁺ |
| 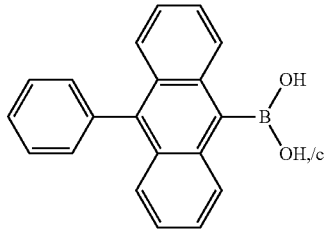 | 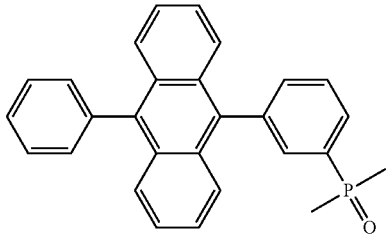 [SMILES: CP(C)(=O)c1cccc(-c2c3ccccc3c(-c3ccccc3)c3ccccc23)c1] | 83.11%/407[M + H]⁺ |
| 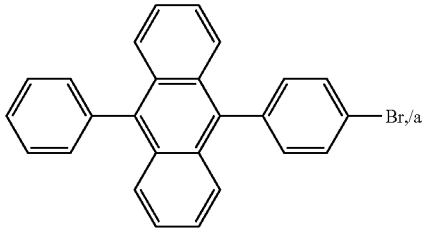 | 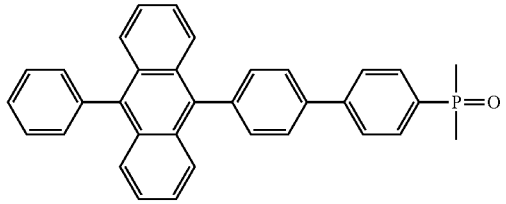 [SMILES: CP(C)(=O)c1ccc(-c2ccc(-c3c4ccccc4c(-c4ccccc4)c4ccccc34)cc2)cc1] | 94.5%/483[M + H]⁺ |

-continued

| Starting materials and products | | |
|---|---|---|
| Startng compound(s),/ coupling method | Product | Yield/ MS data |
| | | 58.7%/ 483[M + H]+ |
| | | 52.9%/ 533[M + Na]+ |
| | | 46.42%/ 561[M + Na]+ |
| | | 87%/ 483[M + H]+ |

-continued

| Starting compound(s),/ coupling method | Product | Yield/ MS data |
|---|---|---|
| [structure], Br,/c | [structure] | 91.7%/ 555[M + Na]+ |
| [structure], Br,/c | [structure] | 45.47%, 555[M + Na]+ |
| [structure], OH/B(OH),/c | [structure] | 60.11%, 593[M + H]+ |
| [structure], OH/B(OH),/c | [structure] | 31.4%, 513[M + H]+, 535[M + Na]+ |
| [structure], OH/B(OH),/c | [structure] | 49.42%, 507[M + Na]+ |

-continued

| Starting materials and products | | |
|---|---|---|
| Starting compound(s),/ coupling method | Product | Yield/ MS data |
| (structure) ,/b | (structure) | 71%, 809[M + Na]+ |
| (structure) ,/a | (structure) | 81.5%/ 382[M + H]+, 404[M + Na]+ |
| (structure) ,/a | (structure) | 32%/ 382[M + H]+ |
| (structure) ,/a | (structure) | 33.85%/ 530[M + Na]+ |

| Starting compound(s),/ coupling method | Product | Yield/ MS data |
|---|---|---|
| 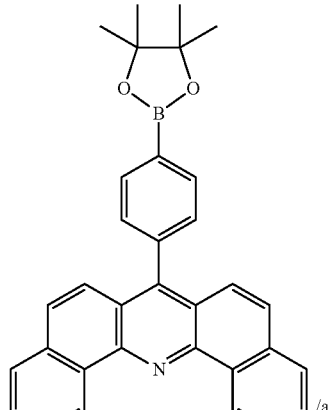,/a | 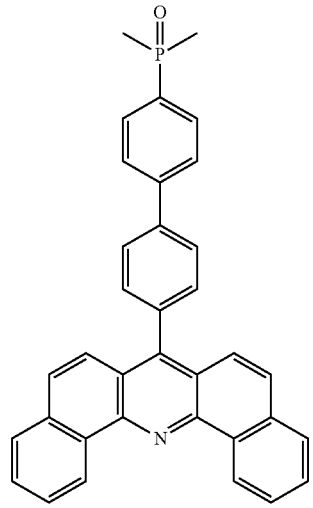 [SMILES: CP(C)(=O)c1ccc(-c2ccc(-c3c4ccc5ccccc5c4nc4c3ccc3ccccc34)cc2)cc1] | 63.55%/ 508[M + H]+, 530[M + Na]+ |
| 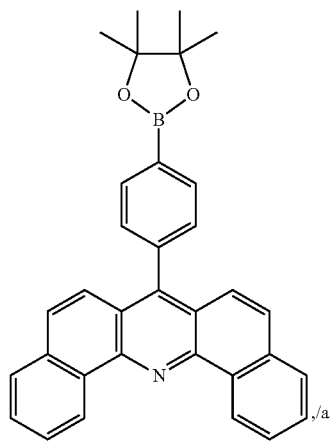,/a | 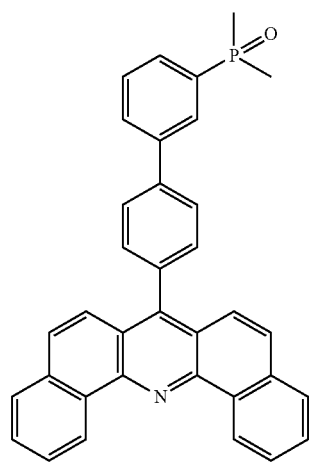 [SMILES: CP(C)(=O)c1cccc(-c2ccc(-c3c4ccc5ccccc5c4nc4c3ccc3ccccc34)cc2)c1] | 31.4%/ 508[M + H]+ |

-continued

| Starting materials and products | | |
|---|---|---|
| Starting compound(s),/ coupling method | Product | Yield/ MS data |
| | | 16.58%, 584[M + H]+ |
| | | 62.57%, 458[M + H]+, 480[M + Na]+ |

-continued

Starting materials and products

| Starting compound(s),/ coupling method | Product | Yield/ MS data |
|---|---|---|
| [structure: 2-(biphenyl-4-yl)-4-chloro-6-phenyl-1,3,5-triazine], Cl,/c | [structure: 2-(biphenyl-4-yl)-4-(4-(dimethylphosphoryl)phenyl)-6-phenyl-1,3,5-triazine] | 68.57%/ 462[M + H]+, 484[M + Na]+, 945[M + H]+ |
| [structure: 2-(3-bromophenyl)-4,6-diphenyl-1,3,5-triazine], /c | [structure: triazine with 3-(3'-(dimethylphosphoryl)biphenyl-3-yl) group] | 71.26%/ 462[M + H]+, 484[M + Na]+ |
| [structure: 2-(3-bromophenyl)-4,6-diphenyl-1,3,5-triazine], /c | [structure: triazine with 3-(4'-(dimethylphosphoryl)biphenyl-3-yl) group] | 35.67%/ 462[M + H]+, 945[2M + Na]+ |

Synthesis of Asymmetrical Dialkylphosphine Oxides

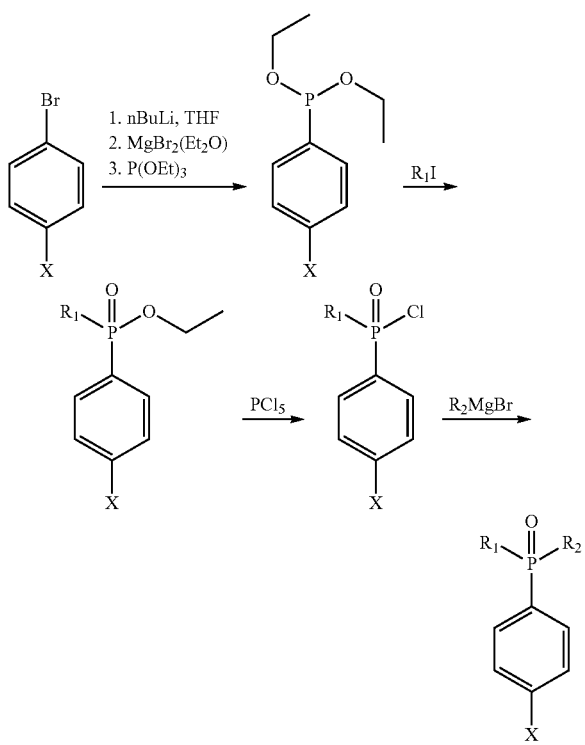

General Procedure for Diethyl Phosphonites

Aryl bromide (0.15 mol) is dissolved in dry tetrahydrofuran (150 mL) under $N_2$, the solution is cooled down to −78° C. nBuLi (0.158 mol, 1.05 eq) is added dropwise to the reaction mixture at this temperature, the mixture is stirred for 1 h at −78° C. for additional 1 hour. Magnesium bromide ethyl etherate (0.165 mol, 1.1 eq) is added at this temperature, and the mixture is allowed to reach a room temperature during 1 h. Triethylphosphite (0.1 mol, 0.66 eq) is added in one portion at room temperature, the mixture is then stirred at 50° for additional 1-3 h to complete the reaction. After removal the solvent under reduced pressure the crude materials is obtained. Further purification could be achieved by vacuum distillation.

| Starting materials and products | |
|---|---|
| Starting compound(s) | Product |
| 1,4-dibromobenzene | diethyl (4-bromophenyl)phosphonite |
| 1.3-dibromobenzene | diethyl (3-bromophenyl)phosphonite |

General Procedure for Phosphinate

The phosphonite (55.0 mmol) is added drop-wise to a two neck round bottom flask containing alkyl iodide (1.6 mmol, neat or a solution in THF) at a rate to maintain a steady reflux. The reaction was stirred for a further 18 h, and then purified via vacuum distillation.

| Starting materials and products | |
|---|---|
| Starting compound(s) | Product |
| diethyl (4-bromophenyl)phosphonite | ethyl (4-bromophenyl)(methyl)phosphinate |
| diethyl (3-bromophenyl)phosphonite | ethyl (3-bromophenyl)(methyl)phosphinate |
| diethyl (4-bromophenyl)phosphonite | ethy (4-bromophenyl)(ethyl)phosphinate |
| diethyl (3-bromophenyl)phosphonite | ethyl (3-bromophenyl)(ethyl)phosphinate |

General Procedure for Phosphinic Chloride

Phosphinate (35.0 mmol) is dissolved in 1,2-dichloroethane (30 ml) and phosphorus pentachloride (35.1 mmol) is added at a rate to maintain the temperature at 40° C. Following complete addition, the reaction is stirred overnight. The volatiles are removed under reduced pressure to afford a crude material, which could be further purified by vacuum distillation or re-crystallization from an appropriate solvent.

| Starting materials and products | |
|---|---|
| Starting compound(s) | Product |
| ethyl (4-bromophenyl)(methyl)phosphinate | (4-bromophenyl)(methyl)phosphinic chloride |
| ethyl (3-bromophenyl)(methyl)phosphinate | (3-bromophenyl)(methyl)phosphinic chloride |
| ethyl (4-bromophenyl)(ethyl)phosphinate | (4-bromophenyl)(ethyl)phosphinic chloride |
| ethyl (3-bromophenyl)(ethyl)phosphinate | (3-bromophenyl)(ethyl)phosphinic chloride |

General Procedure for Alkyl (Alkyl) Phosphine Oxides

A solution of phosphinic chloride (10 mmol) in anhydrous THF (10 ml) is slowly added to Grignard solution in THF (10.5 mmol) in THF or diethyl ether. The reaction mixture is stirred under reflux for 1 h, then cooled with an ice bath and quenched with saturated aqueous ammonium chloride solution. The mixture is poured into water, acidified with diluted hydrochloric acid, extracted with chloroform. The combined extracts were washed with saturated aqueous sodium hydrocarbonate solution, brine, dried over magnesium sulfate and concentrated in vacuum to give a crude product.

Further purification could be achieved by vacuum distillation or by re-crystallization from an appropriate solvent.

| Starting materials and products | |
|---|---|
| Starting compounds(s) | Products |
| (4-bromophenyl)(methyl)-phosphinic chloride | ![structure] |
| (3-bromophenyl)(methyl)-phosphinic chloride | ![structure] |

General Procedure for OLEDs with One Emission Layer (Single OLED)

General procedure for organic light-emitting diodes comprising of Examples 1 to 11 as well as of Comparative examples 1 to 3, comprising an organic semiconductive layer of formula (1) as electron transport layer and/or electron injection layer and/or n-type charge generation layer.

Bottom Emission Devices

For bottom emission devices—Examples 1 to 11 and comparative examples 1 to 3, a 15 Ω/cm² glass substrate (available from Corning Co.) with 100 nm ITO was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

Then, 92 wt.-% of (N4,N4''-di(naphthalen-1-yl)-N4,N4''-diphenyl-[1,1':4',1''-terphenyl]-4,4''-diamine) and 8 wt.-% of 2,2',2''-(cyclopropane-1,2,3-triylidene)tris(2-(p-cyanotetrafluorophenyl)acetonitrile) for comparative examples 1 to 3 or Biphenyl-4-yl(9,9-diphenyl-9H-fluoren-2-yl)-[4-(9-phenyl-9H-carbazol-3-yl)phenyl]-amine and 8 wt.-% of 2,2',2''-(cyclopropane-1,2,3-triylidene)tris(2-p-cyanotetrafluorophenyl)acetonitrile) for Examples 1 to 8 was vacuum deposited on the ITO electrode, to form a HIL having a thickness of 10 nm. Then (N4,N4''-di(naphthalen-1-yl)-N4,N4''-diphenyl-[1,1':4',1''-terphenyl]-4,4''-diamine) for comparative examples 1 to 3 or Biphenyl-4-yl(9,9-diphenyl-9H-fluoren-2-yl)-[4-(9-phenyl-9H-carbazol-3-yl)phenyl]-amine for examples 1 to 8 was vacuum deposited on the HIL, to form a HTL having a thickness of 130 nm. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 20 nm.

Bottom Emission Devices Comprising Organic Semiconductive Layer as Electron Transport Layer (ETL)

Then the organic semiconductive layer comprising compound of formula (1) is formed by depositing the compound, also named ETL matrix compound, according to Example 1 to Example 11 and Comparative examples 1 to 3 by depositing the compound from a first deposition source directly on the EML Further, the thickness d (in nm) of the ETL can be taken from Table 3.

An optional electron injection layer is deposited directly on top of the electron transport layer. The composition and thickness of the electron injection layer can be taken from Table 3.

Bottom Emission Devices Comprising Organic Semiconductive Layer as Electron Injection Layer (EIL)

Then the organic semiconductive layer comprising compound of formula (1) is formed by depositing the compound, also named EIL matrix compound, according to Example 1 to Example 11 and Comparative examples 1 to 3 by depositing the matrix compound from a first deposition source and the lithium organic complex or zero-valent metal dopant from a second deposition source directly on the EML The wt.-% of the lithium organic complex for the EL can be taken from Table 4, whereby the wt.-% amount of the matrix compound is added to 100 wt.-%, respectively. That means, that the EIL matrix compound are added in a wt.-% amount such that the given wt.-% of the lithium organic complex for the EIL and the matrix compound of the EIL are in total 100 wt.-%, based on the weight of the EIL. Further, the thickness d (in nm) of the EIL can be taken from Table 4.

The wt.-% of the zero-valent metal dopant for the EL can be taken from Table 5, whereby the wt.-% amount of the matrix compound is added to 100 wt.-%, respectively. That means, that the EIL matrix compound are added in a wt.-% amount such that the given wt.-% of the zero-valent metal dopant for the EL and the matrix compound of the EIL are in total 100 wt.-%, based on the weight of the EL. Further, the thickness d (in nm) of the EIL can be taken from Table 5.

The cathode was evaporated at ultra-high vacuum of $10^{-7}$ bar. Therefore, a thermal single co-evaporation of one or several metals was performed with a rate of 0, 1 to 10 nm/s (0.01 to 1 Å/s) in order to generate a homogeneous cathode with a thickness of 5 to 1000 nm. The cathode electrode was formed from 100 nm aluminum.

The OLED stack is protected from ambient conditions by encapsulation of the device with a glass slide. Thereby, a cavity is formed, which includes a getter material for further protection.

The beneficial effect of inventive compounds of formula (1) on the performance of bottom emission devices can be seen in Tables 3, 4 and 5.

Top Emission Devices

For top emission devices, the anode electrode was formed from 100 nm silver on glass substrate which is prepared by the same methods as described above.

Then, 92 wt.-% of biphenyl-4-yl(9,9-diphenyl-9H-fluoren-2-yl)-[4-(9-phenyl-9H-carbazol-3-yl)phenyl]-amine (CAS 1242056-42-3) and 8 wt.-% of 2,2',2''-(cyclopropane-1,2,3-triylidene)tris(2-(p-cyanotetrafluorophenyl)acetonitrile) is vacuum deposited on the ITO electrode, to form a HIL having a thickness of 10 nm. Then biphenyl-4-yl(9,9-diphenyl-9H-fluoren-2-yl)-[4-(9-phenyl-9H-carbazol-3-yl)phenyl]-amine (CAS 1242056-42-3) is vacuum deposited on the HIL, to form a HTL having a thickness of 130 nm. 97 wt.-% of ABH113 (Sun Fine Chemicals) as a host and 3 wt.-% of NUBD370 (Sun Fine Chemicals) as a dopant are deposited on the HTL, to form a blue-emitting EML with a thickness of 20 nm.

Top Emission Device Comprising Organic Semiconductive Layer of Compound of Formula (1)

The organic semiconductive layer comprising compound of formula (1) is deposited as described for bottom emission devices above.

The cathode electrode is formed from 13 nm magnesium (90 vol.-%) and silver (10 vol.-%) alloy, followed by 60 nm biphenyl-4-yl(9,9-diphenyl-9H-fluoren-2-yl)-[4-(9-phenyl-9H-carbazol-3-yl)phenyl]-amine (CAS 1242056-42-3).

The OLED stack is protected from ambient conditions by encapsulation of the device with a glass slide. Thereby, a cavity is formed, which includes a getter material for further protection. To assess the performance of the inventive examples compared to the prior art, the current efficiency is measured under ambient conditions (20° C.). Current voltage measurements are performed using a Keithley 2400 sourcemeter, and recorded in V. At 10 mA/cm² for bottom emission and 15 mA/cm² for top emission devices, a calibrated spectrometer CAS140 from Instrument Systems is used for measurement of CIE coordinates and brightness in Candela Lifetime LT of the device is measured at ambient conditions (20° C.) and 15 mA/cm², using a Keithley 2400 sourcemeter, and recorded in hours. The brightness of the device is measured using a calibrated photo diode. The lifetime LT is defined as the time till the brightness of the device is reduced to 97% of its initial value.

In bottom emission devices, the emission is predominately Lambertian and quantified in percent external quantum efficiency (EQE). To determine the efficiency EQE in % the light output of the device is measured using a calibrated photodiode at 10 mA/cm².

In top emission devices, the emission is forward directed, non-Lambertian and also highly dependent on the microcavity. Therefore, the efficiency EQE will be higher compared to bottom emission devices. To determine the efficiency EQE in % the light output of the device is measured using a calibrated photodiode at 15 mA/cm².

Technical Effect of the Invention

1. Bottom emission device comprising an organic semiconductive layer comprising compound of formula (1) which is free of dopant In Table 3, the performance is shown of bottom emission devices with an organic semiconductive layer which is free of dopant. The organic semiconductive layer has the function of an electron transport layer (ETL) and compound of formula (I) is an ETL matrix compound. The thickness of the ETL is 36 nm.

To improve electron injection, an electron injection layer is deposited on top of the electron transport layer. In comparative example 1 and examples 1 to 3, LiQ is deposited to a thickness of 1.5 nm, see Table 3.

In comparative example 1, ETL matrix compound MX 12 is used. In matrix compound MX 12 three aryl substituents are bonded to the phosphorus atom. The operating voltage is 5.25 V and the external quantum efficiency EQE is 2.5%, see Table 3. As the efficiency is so low, the lifetime has not been measured.

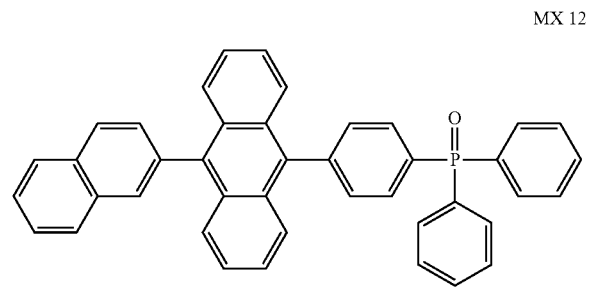 [SMILES: O=P(c1ccccc1)(c1ccccc1)c1ccc(-c2c3ccccc3c(-c3ccc4ccccc4c3)c3ccccc23)cc1]

MX 12

In Example 1 and 2, compounds of formula (1) have been tested as electron transport layer. In example 1, compound (f) is used as ETL matrix compound. The operating voltage is reduced to 4.5 V compared to comparative example 1. Additionally, the efficiency EQE is improved from 2.5 to 5.1%. A reduction in operating voltage has the benefit that the energy required to operate the OLED can be reduced. Additionally, an increase in efficiency EQE is beneficial for power consumption. The OLEDs of the present invention show a significant reduction in operating voltage and/or a significant increase in efficiency EQE which is an improvement in saving electrical energy compared to the prior art. The lifetime is 17 hours. An increase in lifetime means that the device has improved stability over time.

In example 2, compound (d) is used as ETL matrix compound. The operating voltage is reduced further to 4 V and the efficiency EQE is increased further to 5.7 V. The lifetime is also much improved, see Table 3.

In example 3, compound (c) is used as ETL matrix compound. the operating voltage is reduced further to 3.8 V and the efficiency is improved to 6.4% EQE. The lifetime is also much improved to 84 hours.

The main difference between compounds (c), (d) and (f) and MX 12 is the substitution pattern on the phosphorus atom. In MX 12, three aryl groups are bonded to the phosphorus atom, while in compound (c), (f) and compound (d), two alkyl and one aryl group are bonded to the phosphorus atom.

TABLE 3

Bottom emission device comprising an organic semiconductive layer comprising compound of formula (1) which is free of dopant

| | ETL matrix compound | ETL thickness (mn) | EIL | EIL thickness (nm) | Voltage at 10 mA/cm² (V) | Efficiency EQE (%) | Lifetime (hours) |
|---|---|---|---|---|---|---|---|
| Comparative example 1 | MX 12 | 36 | LiQ | 1.5 | 5.25 | 2.5 | — |
| Example 1 | Compound (f) | 36 | LiQ | 1.5 | 4.5 | 5.1 | 17 |
| Example 2 | Compound (d) | 36 | LiQ | 1.5 | 4.0 | 5.7 | 46 |
| Example 3 | Compound (c) | 36 | LiQ | 1.5 | 3.8 | 6.4 | 84 |

2. Bottom emission devices comprising an organic semiconductive layer comprising compound of formula (1) and a alkali organic complex or alkali halide In Table 4, the performance is shown of bottom emission devices with an organic semiconductive layer comprising a compound of formula (1) and a lithium organic complex. The organic semiconductive layer has the function of an electron injection layer (EIL) and compound of formula (I) is an EIL matrix compound. The thickness of the EL is 36 nm.

In comparative example 2, EL matrix compound MX 12 is used. In matrix compound MX 12 three aryl substituents are bonded to the phosphorus atom. The EL matrix compound is doped with 50 wt.-% LiQ which is a lithium organic complex. The operating voltage is 4.9 V and the external quantum efficiency EQE is 5.4%, see Table 4. As the operating voltage is so high, the lifetime has not been measured.

In example 4, compound (b) is used as EIL matrix compound. The matrix compound is doped with the same lithium organic complex at the same concentration as in comparative example 2. The operating voltage is reduced from 4.9 to 4.6 V without detrimental impact on efficiency. The lifetime has not been measured.

In example 5, the same matrix compound is used as in example 4. However, a different lithium organic complex is used. Li-1 is a lithium borate complex. The concentration of the lithium borate complex is 25 wt.-%. The operating voltage is further decreased to 3.6 V without detrimental impact on efficiency. The lifetime is 10 hours.

In example 6, compound (c) is used. The same lithium organic complex is used as in example 5. The operating voltage is reduced further to 3.4 V without detrimental impact on efficiency or lifetime. Doping with lithium borate has a particularly beneficial effect on the operating voltage.

In example 7, compound (f) is used. The same lithium organic complex is used as in comparative example 2 and example 4. The operating voltage is reduced compared to comparative example 2 and example 4. Additionally, the efficiency is increased to 6.7% and the lifetime is exceptionally high at 130 hours (Table 4).

In summary, a substantial improvement in the performance of OLEDs is achieved through compounds of formula (1) doped with lithium organic complexes.

In example 10, compound (c) is used as EIL matrix compound. The matrix compound is doped with Yb at the same concentration as in comparative example 3. The oper-

TABLE 4

Bottom emission devices comprising an organic semiconductive layer comprising compound of formula (1) and a lithium organic complex

|  | EIL matrix compound | Lithium organic complex | wt.-% Lithium organic complex *[1] | EIL thickness (nm) | Voltage at 10 mA/cm² (V) | Efficiency EQE (%) | Lifetime (hours) |
|---|---|---|---|---|---|---|---|
| Comparative Example 2 | MX 12 | LiQ | 50 | 36 | 4.9 | 5.4 | — |
| Example 4 | Compound (b) | LIQ | 50 | 36 | 4.6 | 5.3 | — |
| Example 5 | Compound (b) | Li-1 | 25 | 36 | 3.6 | 5.5 | 10 |
| Example 6 | Compound (c) | Li-1 | 25 | 36 | 3.4 | 5.3 | 9 |
| Example 7 | Compound (f) | LiQ | 50 | 36 | 4.3 | 6.7 | 130 |

*[1] = the wt.-% of the matrix compound and the wt.-% of the lithium organic complex are in total 100 wt.-% based on weight of the EIL 3. Bottom emission devices comprising an organic semiconductive layer comprising compound of formula (1) and a zero-valent metal dopant In Table 5, the performance is shown of bottom emission devices with an organic semiconductive layer comprising a compound of formula (1) and a zero-valent metal dopant. The organic semiconductive layer has the function of an electron injection layer (EIL) and compound of formula (I) is an EIL matrix compound. The thickness of the EIL is 36 nm.

In comparative example 3, EIL matrix compound MX 12 is used. In matrix compound MX 12 three aryl substituents are bonded to the phosphorus atom. The EIL matrix compound is doped with 5 wt.-% Mg. The operating voltage is 3.8 V and the external quantum efficiency EQE is 4.8%, see Table 5. The lifetime is 3 hours.

In example 8, compound (d) is used as EIL matrix compound. The matrix compound is doped with Mg at the same concentration as in comparative example 3. The operating voltage is reduced from 3.8 to 3.55 V, the efficiency is improved from 4.8 to 5.5% and the lifetime is improved significantly from 3 to 56 hours.

In example 9, compound (c) is used as EIL matrix compound. The matrix compound is doped with Mg at the same concentration as in comparative example 3. The operating voltage is reduced from 3.8 to 3.5 V, the efficiency is improved from 4.8 to 6.1% and the lifetime is improved significantly from 3 to 33 hours.

ating voltage is reduced from 3.8 to 3.7 V, the efficiency is improved from 4.8 to 6.7% and the lifetime is improved significantly from 3 to 53 hours.

In example 11, compound (d) is used as EL matrix compound. The operating voltage is 3.7 V. The efficiency is increased further to 6.9% EQE and the lifetime is very high at 52 hours.

In summary, a beneficial effect is obtained when using compounds of formula (1) doped with zero-valent metal as electron injection layer.

TABLE 5

Bottom emission devices comprising an organic semiconductive layer comprising compound of formula (1) and a zero-valent metal dopant

|  | EIL matrix compound | Metal dopant | wt.-% Metal dopant *[1] | EIL thickness (nm) | Voltage at 10 mA/cm² (V) | Efficiency EQE (%) | Lifetime (hours) |
|---|---|---|---|---|---|---|---|
| Comparative example 3 | MX 12 | Mg | 5 | 36 | 3.8 | 4.8 | 3 |
| Example 8 | Compound (d) | Mg | 5 | 36 | 3.55 | 5.5 | 56 |
| Example 9 | Compound (c) | Mg | 5 | 36 | 3.5 | 6.1 | 33 |
| Example 10 | Compound (c) | Yb | 5 | 36 | 3.7 | 6.7 | 53 |
| Example 11 | Compound (d) | Yb | 5 | 36 | 3.7 | 6.9 | 52 |

*[1] = the wt.-% of the matrix compound and the wt.-% of the Metal dopant are in total 100 wt.-% based on weight of the EIL 4. n-Type Charge Generation Layer in Electron-Only Device Electron-only devices were fabricated comprising an organic semiconductive layer comprising a compound of formula (1) and a metal dopant as n-type charge generation layer (n-CGL), see example 12 to 17 in Table 6.

A glass substrate was cut to a size of 50 mm×50 mm×0.7 mm, ultrasonically cleaned with isopropyl alcohol for 5 minutes and then with pure water for 5 minutes, and cleaned again with UV ozone for 30 minutes. Then the anode electrode was formed from 100 nm aluminium on the glass substrate.

Then, 90 wt.-% of Biphenyl-4-yl(9,9-diphenyl-9H-fluoren-2-yl)-[4-(9-phenyl-9H-carbazol-3-yl)phenyl]-amine and 10 wt.-% of 2,2',2''-(cyclopropane-1,2,3-triylidene)tris(2-(p-cyanotetrafluorophenyl)acetonitrile) was vacuum deposited on the electrode, to form a HIL having a thickness of 10 nm.

Then, an electron transport layer was formed from 2,4-diphenyl-6-(3'-(triphenylen-2-yl)-[1,1'-biphenyl]-3-yl)-1,3,5-triazine (CAS 1638271-85-8) on the HIL having a thickness of 30 nm.

Then, the organic semiconductive layer comprising 95 wt.-% compound of formula (1) and 5 wt.-% Yb is deposited on the electron transport layer to form an n-type charge generation layer (n-CGL) having a thickness of 50 nm, see Table 6.

Then, a p-type charge generation layer (p-CGL) consisting of 90 wt.-% of Biphenyl-4-yl(9,9-diphenyl-9H-fluoren-2-yl)-[4-(9-phenyl-9H-carbazol-3-yl)phenyl]-amine and 10 wt.-% of 2,2',2''-(cyclopropane-1,2,3-triylidene)tris(2-(p-cyanotetrafluorophenyl)acetonitrile) was vacuum deposited on the n-type charge generation layer, to form a p-type charge generation layer having a thickness of 10 nm.

Then, Biphenyl-4-yl(9,9-diphenyl-9H-fluoren-2-yl)-[4-(9-phenyl-9H-carbazol-3-yl)phenyl]-amine was deposited on the p-CGL to form a hole transport layer (HTL) having a thickness of 30 nm.

Ag is vacuum deposited on the HTL to form a cathode having a thickness of 100 nm.

Low operating voltage is obtained in electron-only devices, see Table 6.

Then, the organic semiconductive layer comprising compound of formula (1) is deposited on the emission layer or hole blocking layer, if present. If the organic semiconductive layer is the n-type charge generation layer, a p-type charge generation layer consisting of 92 wt.-% of Biphenyl-4-yl(9,9-diphenyl-9H-fluoren-2-yl)-[4-(9-phenyl-9H-carbazol-3-yl)phenyl]-amine and 8 wt.-% of 2,2',2''-(cyclopropane-1,2,3-triylidene)tris(2-(p-cyanotetrafluorophenyl)acetonitrile) was vacuum deposited on the n-type charge generation layer, to form a p-type charge generation layer having a thickness of 10 nm.

If the organic semiconductive layer is the electron transport layer, a n-type charge generation layer of compound of formula (X) is deposited on the electron transport layer, followed by the p-type charge generation layer comprising compound of formula (Y).

Then Biphenyl-4-yl(9,9-diphenyl-9H-fluoren-2-yl)-[4-(9-phenyl-9H-carbazol-3-yl)phenyl]-amine was vacuum deposited on the p-type charge generation layer, to form a HTL having a thickness of 30 nm.

Then N3,N3'-di([1,1'-biphenyl]-4-yl)-N3,N3'-dimesityl-[1,1'-biphenyl]-3,3'-diamine (CAS 1639784-29-4) was vacuum deposited on the HTL to form a triplet control layer having a thickness of 15 nm. 90 wt.-% EL-GHB914S

TABLE 6

Electron-only devices with n-type charge generation layer comprising an organic semiconductive layer comprising compound of formula (1) and a zero-valent metal dopant

| | n-CGL matrix compound | Metal dopant | wt.-% Metal dopant*[1] | n-CGL thickness (nm) | Voltage at 10 mA/cm² (V) |
|---|---|---|---|---|---|
| Example 12 | Compound (c) | Yb | 5 | 50 | 4.5 |
| Example 13 | Compound (i) | Yb | 5 | 50 | 4.5 |
| Example 14 | Compound (k) | Yb | 5 | 50 | 4.5 |
| Example 15 | Compound (o) | Yb | 5 | 50 | 4.45 |
| Example 16 | Compound (p) | Yb | 5 | 50 | 4.45 |

*[1]= the wt.-% of the matrix compound and the wt.-% of the Metal dopant are in total 100 wt.-% based on weight of the n-CGL 5. Tandem OLED Device General procedure for OLEDs with two emission layers (tandem OLED)

For bottom emission devices, a 15 Ω/cm² glass substrate (available from Coring Co.) with 100 nm ITO was cut to a size of 50 mm×50 mm×0.7 mm, ultrasonically cleaned with iso-propyl alcohol for 5 minutes and then with pure water for 5 minutes, and cleaned again with UV ozone for 30 minutes, to prepare a first electrode.

For top emission devices, the anode electrode was formed from 100 am silver on glass which was prepared by the same methods as described above.

Then, 92 wt.-% of Biphenyl-4-yl(9,9-diphenyl-9H-fluoren-2-yl)-[4-(9-phenyl-9H-carbazol-3-yl)phenyl]-amine (CAS 1242056-42-3) and 8 wt.-% of 2,2',2''-(cyclopropane-1,2,3-triylidene)tris(2-(p-cyanotetrafluorophenyl)acetonitrile) was vacuum deposited on the ITO electrode, to form a HIL having a thickness of 10 nm. Then Biphenyl-4-yl(9,9-diphenyl-9H-fluoren-2-yl)-[4-(9-phenyl-9H-carbazol-3-yl)phenyl]-amine was vacuum deposited on the HIL, to form a HTL having a thickness of 135 nm. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 25 nm.

Then, an optional hole blocking layer is deposited directly on the emission layer.

(Samsung SDI) as a host and 10 wt.-% EL-GD0108S (Samsung SDI) as phosphorescent green emitter are vacuum deposited on the triplet control layer, to form a green emitting EML having a thickness of 30 nm. MX 11 or compound of formula (1) is vacuum deposited on the green emitting EML, to form an electron transport layer (ETL) having a thickness of 35 nm. LiQ is vacuum deposited on the ETL to form an electron injection layer (EIL) having a thickness of 2 nm. Aluminium is vacuum deposited on the EIL to form a cathode having a thickness of 100 nm.

Top-emitting tandem OLED devices were fabricated comprising an organic semiconductive layer comprising a compound of formula (1) and a metal dopant as n-type charge generation layer (n-CGL), see comparative example 4 and example 17 in Table 7.

A glass substrate was cut to a size of 50 mm×50 mm×0.7 mm, ultrasonically cleaned with isopropyl alcohol for 5 minutes and then with pure water for 5 minutes, and cleaned again with UV ozone for 30 minutes. The anode electrode was formed from 100 nm silver on the glass substrate.

Then, 92 wt.-% of Biphenyl-4-yl(9,9-diphenyl-9H-fluoren-2-yl)-[4-(9-phenyl-9H-carbazol-3-yl)phenyl]-amine (CAS 1242056-42-3) and 8 wt.-% of 2,2',2''-(cyclopropane-1,2,3-triylidene)tris(2-(p-cyanotetrafluorophenyl)acetonitrile) was vacuum deposited on the ITO electrode, to form a HIL having a thickness of 10 nm. Then Biphenyl-4-yl(9,9-diphenyl-9H-fluoren-2-yl)-[4-(9-phenyl-9H-carbazol-3-yl)

phenyl]-amine was vacuum deposited on the HIL, to form a HTL having a thickness of 115 nm.

Then, N,N-bis(4-(dibenzo[b,d]furan-4-yl)phenyl)-[1,1':4',1"-terphenyl]-4-amine (CAS 1198399-61-9) was vacuum deposited on the HTL to form a first electron blocking layer (EBL) with a thickness of 10 nm.

97 wt.-% of ABH113 (Sun Fine Chemicals) as a host and 3 wt.-% of BD200 (Sun Fine Chemicals) as a dopant was vacuum deposited on the EBL, to form a first blue-emitting EML with a thickness of 20 nm.

Then, 2,4-diphenyl-6-(3'-(triphenylen-2-yl)-[1,1'-biphenyl]-3-yl)-1,3,5-triazine (CAS 1638271-85-8) was vacuum deposited on the first blue-emitting EML to form a first electron transporting layer (ETL) having a thickness of 25 nm.

Then, the organic semiconductive layer comprising 99 vol.-% compound of formula (1) and 1 vol.-% Yb was vacuum deposited on the first electron transporting layer to form a n-CGL having a thickness of 10 nm, see example 17 in Table 7. In comparative example 4, 99 vol.-% 1,3-bis(9-phenyl-1,10-phenanthrolin-2-yl)benzene MX 13 (CAS 721969-94-4) and 1 vol.-% Yb was vacuum deposited on the first electron transporting layer to form a n-CGL having a thickness of 10 nm, see Table 7.

Then, a p-type charge generation layer consisting of 90 wt.-% of Biphenyl-4-yl(9,9-diphenyl-9H-fluoren-2-yl)-[4-(9-phenyl-9H-carbazol-3-yl)phenyl]-amine and 10 wt.-% of 2,2',2"-(cyclopropane-1,2,3-triylidene)tris(2-(p-cyanotetrafluorophenyl)acetonitrile) was vacuum deposited on the n-type charge generation layer, to form a p-type charge generation layer having a thickness of 10 nm.

Then, Biphenyl-4-yl(9,9-diphenyl-9H-fluoren-2-yl)-[4-(9-phenyl-9H-carbazol-3-yl)phenyl]-amine was vacuum deposited on the p-type charge generation layer, to form a HTL having a thickness of 50 nm.

Then, N,N-bis(4-(dibenzo[b,d]furan-4-yl)phenyl)-[1,1':4',1"-terphenyl]-4-amine (CAS 1198399-61-9) was vacuum deposited on the HTL to form a second electron blocking layer (EBL) with a thickness of 10 nm.

97 wt.-% of ABH113 (Sun Fine Chemicals) as a host and 3 wt.-% of BD200 (Sun Fine Chemicals) as a dopant were deposited on the HTL, to form a second blue-emitting EML with a thickness of 20 nm.

Then, 2,4-diphenyl-6-(3'-(triphenylen-2-yl)-[1,1'-biphenyl]-3-yl)-1,3,5-triazine (CAS 1638271-85-8) was vacuum deposited on the second blue-emitting EML to form a second electron transporting layer (ETL) having a thickness of 25 nm.

Then, 95 wt.-% 3-Phenyl-3H-benzo[b]dinaphtho[2,1-d:1',2'-f]phosphepine-3-oxide (CAS 597578-38-6) was vacuum deposited on the second electron transporting layer to form an electron injection layer (EIL) having a thickness of 10 nm.

Ag was vacuum deposited on the EIL to form a cathode having a thickness of 11 nm.

Then, Biphenyl-4-yl(9,9-diphenyl-9H-fluoren-2-yl)-[4-(9-phenyl-9H-carbazol-3-yl)phenyl]-amine was vacuum deposited on the cathode to form a capping layer having a thickness of 60 nm.

The OLED stack is protected from ambient conditions by encapsulation of the device with a glass slide. Thereby, a cavity is formed, which includes a getter material for further protection.

The performance is assessed as described in the general procedure for single OLEDs. Operating voltage, external quantum efficiency and/or lifetime are improved compared to tandem OLEDs without an organic semiconductive layer comprising compound of formula (1).

In Table 7, results are shown for top-emitting tandem OLED devices comprising an n-type charge generation layer comprising a matrix compound and Yb dopant.

In comparative example 4, the n-CGL comprises MX 13 and Yb dopant. MX 13 comprises two phenanthroline groups. The operating voltage is 8.3 V and the external quantum efficiency is 21.6%.

In example 17, the n-CGL comprises compound (c) and Yb dopant. The operating voltage is reduced to 8 V and the external quantum efficiency is increased substantially to 25%.

In summary, a substantial improvement in performance may be obtained when the n-type charge generation layer comprises a compound of formula (1).

TABLE 7

Top emission tandem OLED comprising an n-type charge generation layer organic semiconductive layer comprising compound of formula (1) and a zero-valent metal dopant

| | n-CGL matrix compound | Metal dopant | vol.-% Metal dopant *[1] | n-CGL thickness (nm) | Voltage at 10 mA/cm$^2$ (V) | Efficiency EQE at 10 mA/cm$^2$ (%) |
|---|---|---|---|---|---|---|
| Comparative example 4 | MX 13 | Yb | 1 | 10 | 8.3 | 21.6 |
| Example 17 | Compound (c) | Yb | 1 | 10 | 8 | 25 |

*[1] = the vol.-% of the matrix compound and the wt.-% of the Metal dopant are in total 100 wt.-% based on weight of the n-CGL From the foregoing detailed description and examples, it will be evident that modifications and variations can be made to the compositions and methods of the invention without departing from the spirit and scope of the invention. Therefore, it is intended that all modifications made to the invention without departing from the spirit and scope of the invention come within the scope of the appended claims.

The invention claimed is:

1. Organic semiconductive layer which is an electron transport layer and/or an electron injection layer and/or an n-type charge generation layer, the organic semiconductive layer comprising (i) at least one compound of formula (1), and (ii) an alkali organic complex and/or an alkali halide:

(1)

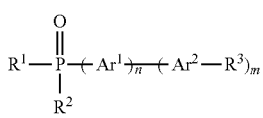

wherein R¹ and R² are each independently selected from $C_1$ to $C_4$ alkyl;

Ar¹ is selected from $C_6$ to $C_{14}$ arylene or $C_3$ to $C_{12}$ heteroarylene;

Ar² is independently selected from $C_{14}$ to $C_{40}$ arylene comprising a conjugated system of at least 14 delocalized electrons or $C_8$ to $C_{40}$ heteroarylene;

R³ is independently selected from H, $C_1$ to $C_{12}$ alkyl, or $C_{10}$ to $C_{20}$ aryl or heteroaryl;

wherein each of Ar¹, Ar² and R³ may each independently be unsubstituted or substituted with at least one $C_1$ to $C_{12}$ alkyl group;

n is 1; and m is 1 or 2.

2. Organic semiconductive layer according to claim 1, wherein Ar¹ is selected from a group consisting of phenylene, biphenylene, naphthylene, fluorenylene, pyridylene, quinolinylene and pyrimidinylene.

3. Organic semiconductive layer according to claim 1, wherein Ar² is selected from a group consisting of anthracenylene, pyrenylene, phenanthrylene, carbazoylene, benzo[c]acridinylene, dibenzo[c,h]acridinylene, dibenzo[a,j]acridinylene or from a group of the following formulas (IVa) to (IVm)

(IVa)

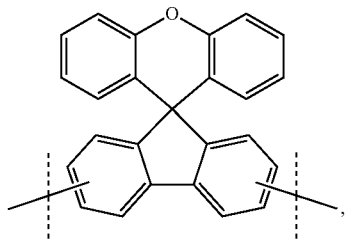

(IVb)

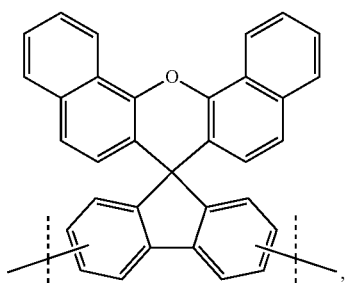

(IVc)

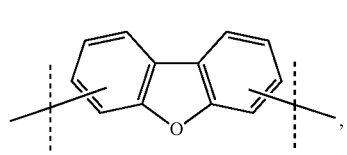

(IVd)

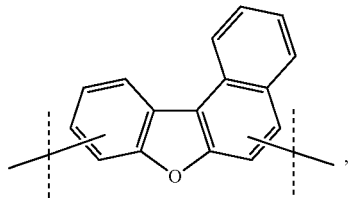

(IVe)

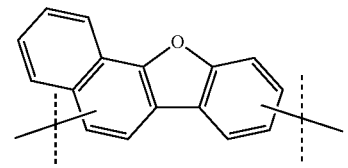

(IVf)

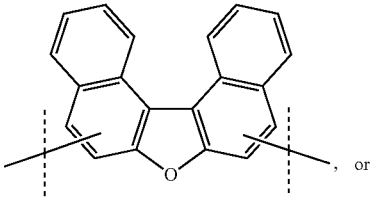
, or (IVg)

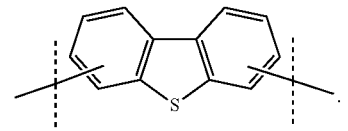
.

4. Organic semiconductive layer according to claim 1, wherein Ar² is selected from a group consisting of anthracenylene, pyrenylene, phenanthrylene, benzo[c]acridinylene, dibenzo[c,h]acridinylene and dibenzo[a,j]acridinylene.

5. Organic semiconductive layer according to claim 1, wherein R³ is selected from H, biphenyl, terphenyl, fluorenyl, naphthyl, phenanthryl, pyrenyl, carbazoyl, dibenzofuranyl or dinapthofuranyl.

6. Organic semiconductive layer according to claim 1, selected from one of the following compounds a to g.

(a)

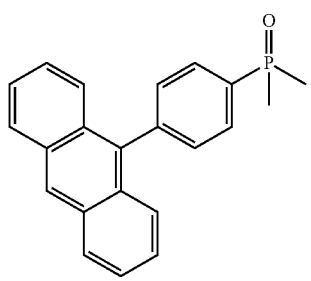

(b)

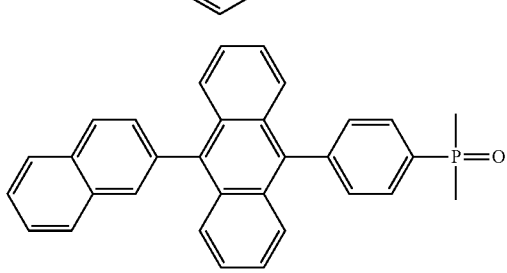

(c)

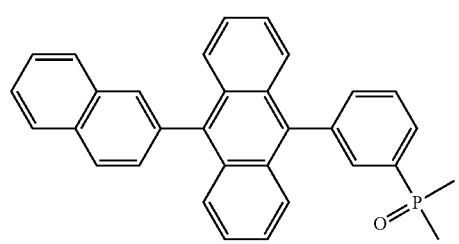

(d)

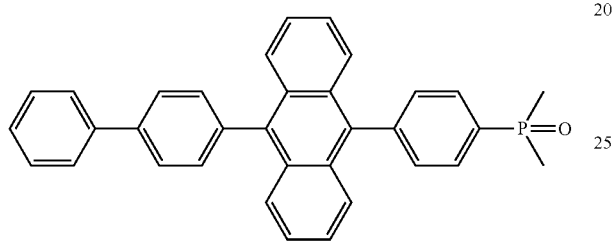

(e)

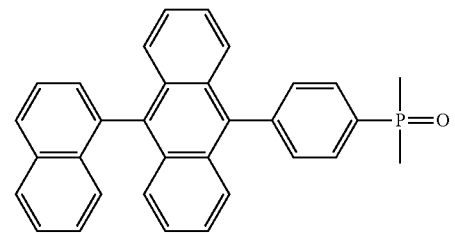

(f)

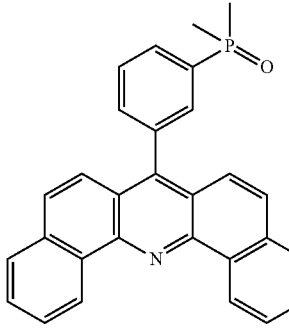

(g)

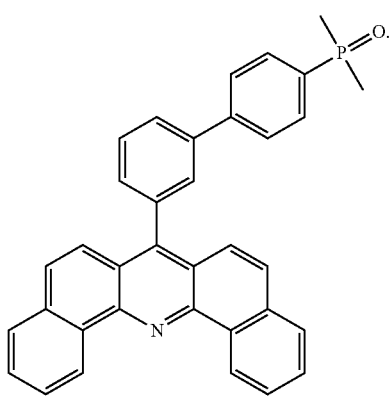

7. Organic semiconductive layer according to claim 1 further comprising a zero-valent metal dopant.

8. Organic electroluminescent device comprising the organic semiconductive layer according to claim 1.

9. Organic semiconductive layer according to claim 1, wherein Ar¹ is phenylene or biphenylene.

10. Organic semiconductive layer according to claim 1, wherein
    $Ar^1$ is phenylene or biphenylene;
    $Ar_2$ is anthracenylene; and
    $R^3$ is biphenyl or naphthyl.

11. Organic semiconductive layer according to claim 1, wherein
    $Ar^1$ is phenylene or biphenylene; and
    $Ar^2$ is anthracenylene or naphthylene.

* * * * *